US 9,653,487 B2

(12) United States Patent
Yamazaki et al.

(10) Patent No.: US 9,653,487 B2
(45) Date of Patent: May 16, 2017

(54) SEMICONDUCTOR DEVICE, MANUFACTURING METHOD THEREOF, MODULE, AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Kenichi Okazaki, Tochigi (JP); Masataka Nakada, Tochigi (JP); Masahiro Katayama, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/612,817

(22) Filed: Feb. 3, 2015

(65) Prior Publication Data

US 2015/0221679 A1  Aug. 6, 2015

(30) Foreign Application Priority Data

Feb. 5, 2014 (JP) ................................. 2014-020620
Mar. 6, 2014 (JP) ................................. 2014-043637

(51) Int. Cl.
*H01L 27/12* (2006.01)

(52) U.S. Cl.
CPC ...... *H01L 27/1225* (2013.01); *H01L 27/1255* (2013.01)

(58) Field of Classification Search
CPC ........................ H01L 27/1225; H01L 27/1255
See application file for complete search history.

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

EP   1737044 A   12/2006
EP   2226847 A    9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Joshua King
(74) *Attorney, Agent, or Firm* — Husch Blackwell LLP

(57) ABSTRACT

A semiconductor device includes a transistor and a capacitor. The transistor includes a first conductive film; a first insulating film including a film containing hydrogen; a second insulating film including an oxide insulating film; an oxide semiconductor film including a first region and a pair of second regions; a pair of electrodes; a gate insulating film; and a second conductive film. The capacitor includes a lower electrode, an inter-electrode insulating film, and an upper electrode. The lower electrode contains the same material as the first conductive film. The inter-electrode insulating film includes a third insulating film containing the same material as the first insulating film and a fourth insulating film containing the same material as the gate insulating film. The upper electrode contains the same material as the second conductive film. A fifth insulating film containing hydrogen is provided over the transistor.

11 Claims, 55 Drawing Sheets

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,384,076 B2 | 2/2013 | Park et al. |
| 8,796,681 B2 | 8/2014 | Yamade et al. |
| 8,835,918 B2 | 9/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0149057 A1* | 10/2002 | Kawasaki | G02F 1/133345 257/350 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0075094 A1* | 4/2004 | Yamazaki | H01L 27/1244 257/72 |
| 2004/0127038 A1 | 7/2004 | Carcia et al. |
| 2005/0017302 A1 | 1/2005 | Hoffman |
| 2005/0035390 A1* | 2/2005 | Beroz | H01G 9/032 257/306 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118874 A1* | 6/2006 | Suzawa | G02F 1/13454 257/350 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1* | 7/2007 | Lai | H01L 27/1225 257/59 |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0025675 A1* | 2/2010 | Yamazaki | H01L 27/3241 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101942 A1* | 5/2011 | Yamazaki | H01L 27/1225 323/282 |
| 2011/0240991 A1 | 10/2011 | Yamazaki |
| 2012/0007084 A1* | 1/2012 | Park | H01L 27/1225 257/59 |
| 2012/0138922 A1* | 6/2012 | Yamazaki | H01L 29/7869 257/43 |
| 2013/0082253 A1* | 4/2013 | Yamazaki | H01L 29/41733 257/43 |
| 2013/0193433 A1 | 8/2013 | Yamazaki |
| 2014/0042437 A1 | 2/2014 | Yamazaki |
| 2014/0183530 A1 | 7/2014 | Yamazaki et al. |
| 2014/0339544 A1 | 11/2014 | Hanaoka et al. |
| 2015/0221678 A1 | 8/2015 | Yamazaki et al. |
| 2015/0221775 A1 | 8/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 | 6/2006 |
| JP | 2009-278115 | 11/2009 |

(56) References Cited

FOREIGN PATENT DOCUMENTS

| WO | WO-2004/114391 | 12/2004 | | |
|----|----|----|----|----|
| WO | WO 2011148537 A1 | * | 12/2011 | ....... G02F 1/136213 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phy. Rev. A (Physical Review. A), May 1, 1984, vol. 29, No. 5, pp. 2957-2959.
Kimizuka.N. et al., "Spinel,YBFe2O4, and YB2Fe3O7 Types of Structures for Compounds in the In2O3 and Sc2O3—A2O3—BO Systems [a; Fe. Ga, or Al; B: Mg, Mn, Fe, Ni, Cu,Or Zn]at Temperatures Over 1000° C.", Journal of Solid State Chemistry, 1985, vol. 60, pp. 382-384.
Nakamura.M at al., "The phase relations in the In2O3—Ga2ZnO4—ZnO system at 1350° C.", Journal of Solid State Chemisty, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State CHemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m= Integer) Described by Four-Dimentional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th Inernational Display Workshops, Dec. 4, 2002, pp. 295-298.
Nomura.K at al., "Thin-Film Transistor Fabricated in Single-Crystalline Transparent Oxide Semiconductor", Science, May 23, 2003, vol. 300, No. 5623, pp. 1269-1272.
Ikeda.T at al., "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T at al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Sumposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J at al., "Amorphous Indium-Gallium-Zinc Oxide TFTS and Their Application for Large Size AMOLED", Am-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-in. AMOLED Display With Driver Circuit Using Amorphous In—Ga—Zn-Oxide TFTS", IDW '09 : Proceedings of the 16th International Display Workshops, 2009, pp. 689-692.
Asaoka.Y at al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Diget '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, MAy 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Aymposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphouse In—Ga—Zn—Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita,M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B. (Physical Review. B), 208, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Z—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee at al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of SOL-GEL-Derived Zinc Oxide Films by Irradiation with Ultraviolet Lamp", Journal of SOL-GEL Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K at al., "Carrier transport in transparent oxide semiconductor with intrinsic structural randomness probed using single-crystalline InGaO3(ZnO)5 films", Appl. Phys. Lett. (Applied Physics Letters), Sept. 13, 2004, vol. 85, No. 11, pp. 1993-1995.

\* cited by examiner

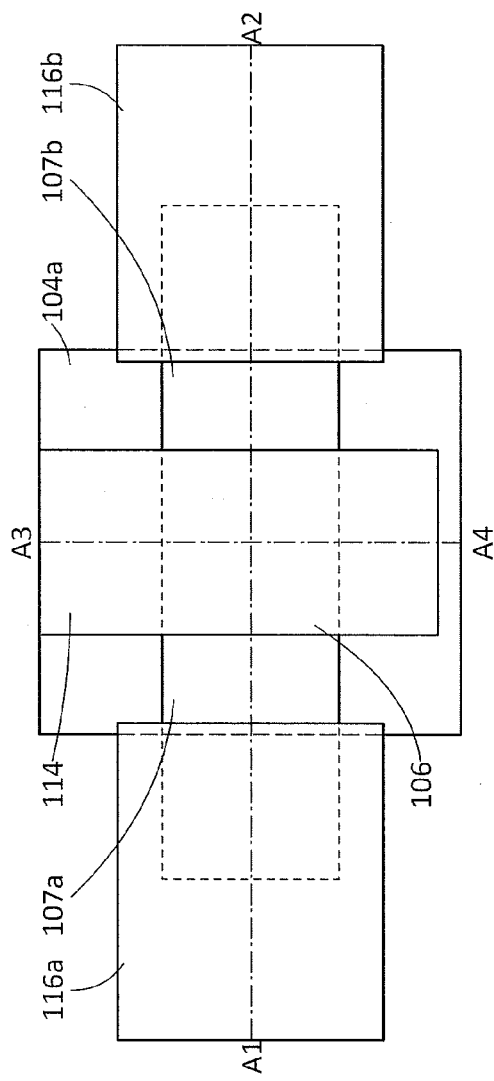
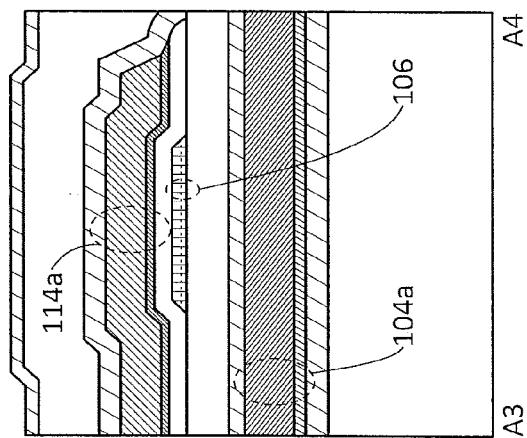
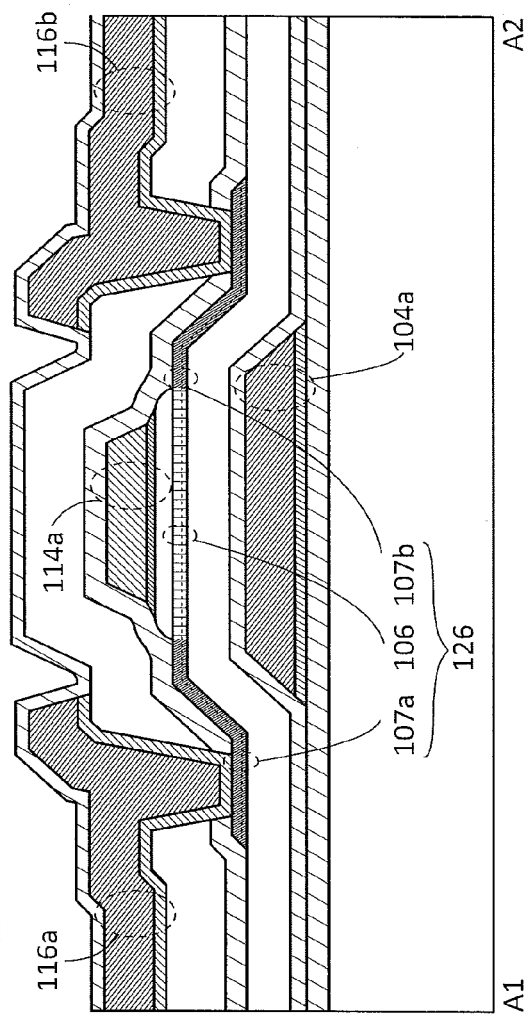
FIG. 2A
FIG. 2B
FIG. 2C

FIG. 21A
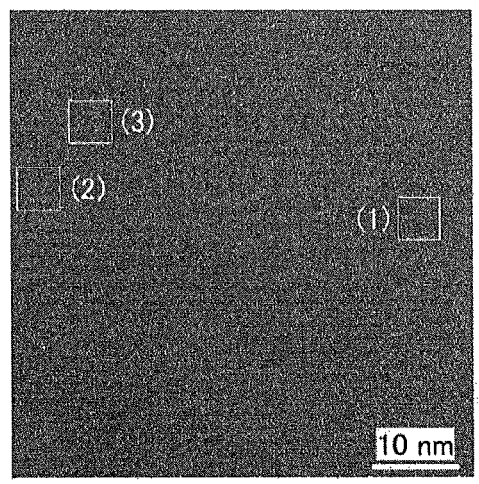
FIG. 21B    FIG. 21C    FIG. 21D
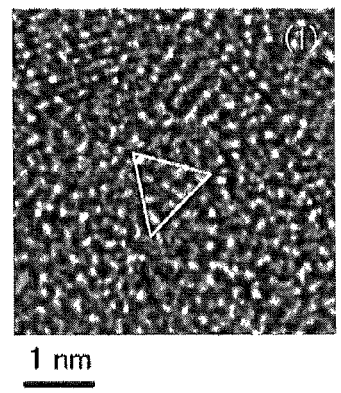 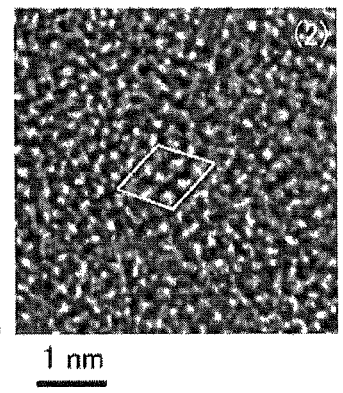 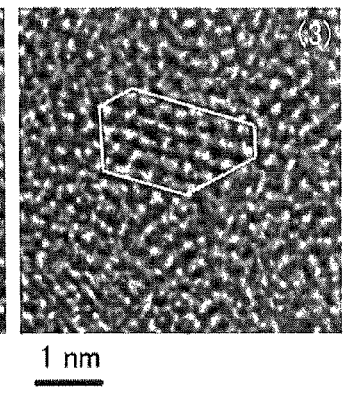

FIG. 23A
FIG. 23B
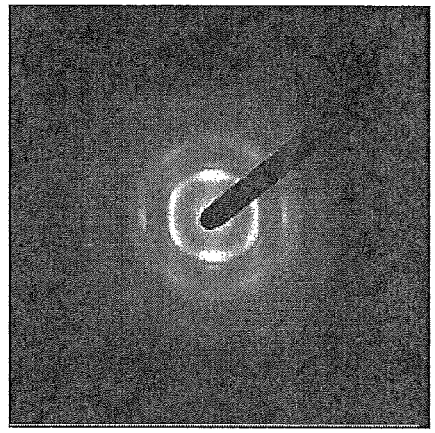 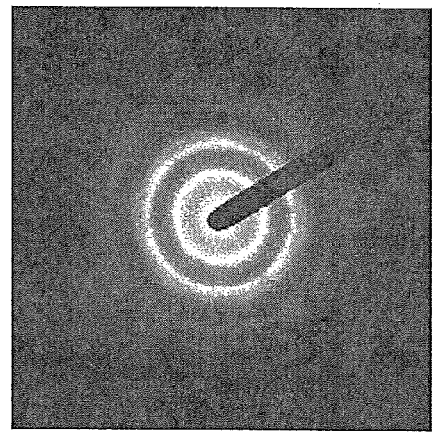

Initial state (Ho)

Ho

Final state (Vo, H-O)

Vo bonded to O

Initial state ($V_oH$)

Final state($V_o$ 、H–O)

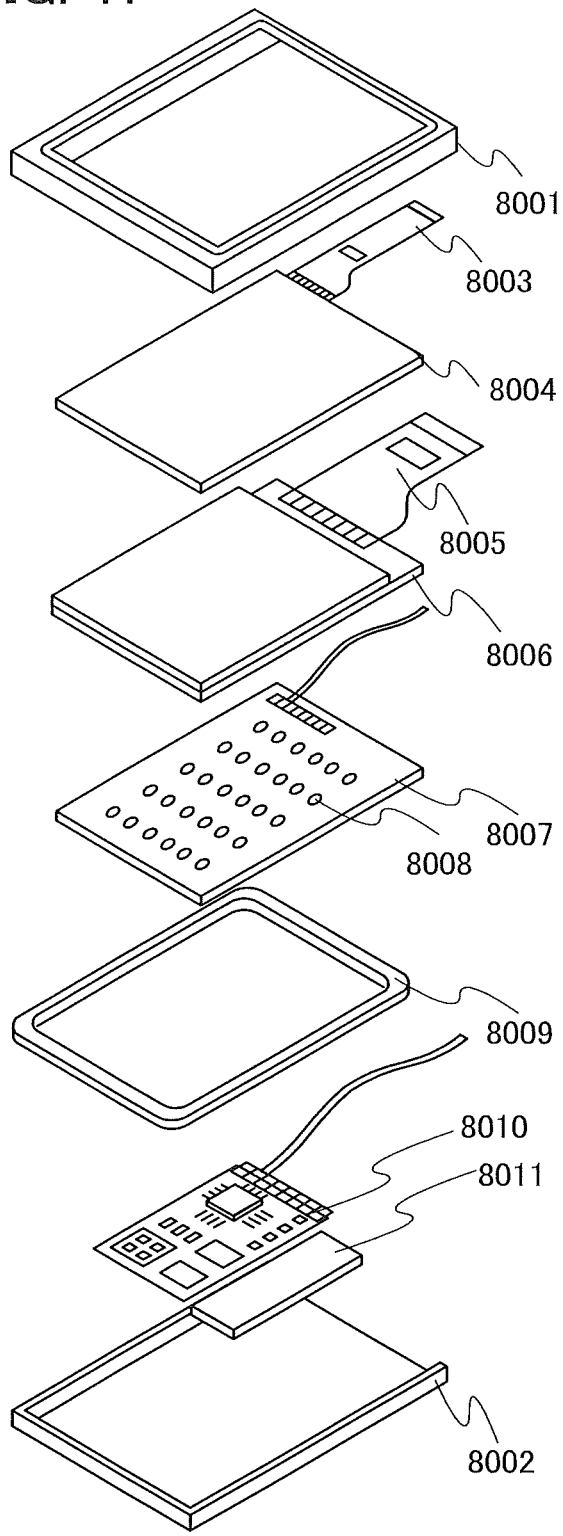

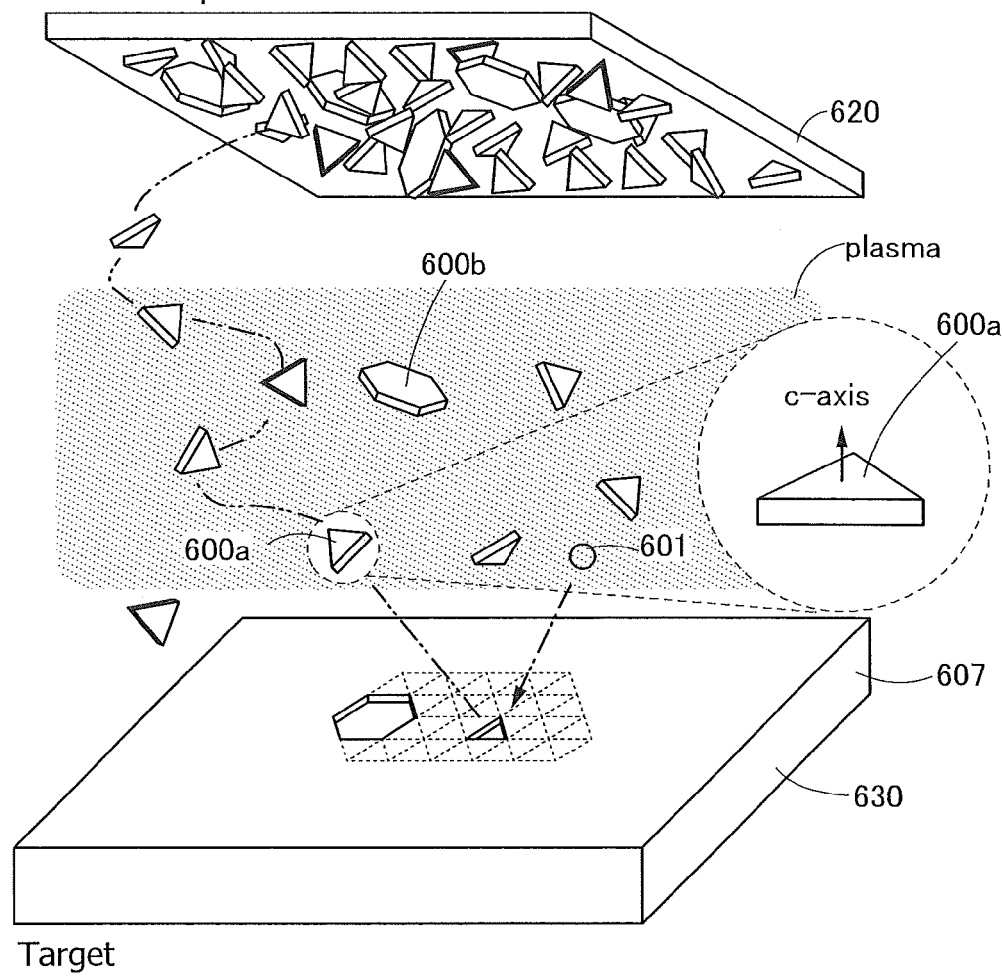

Fleming's left hand rule

Heated Substrate

Heated Substrate

Heated Substrate

InGaZnO$_4$

FIG. 53A
FIG. 53B
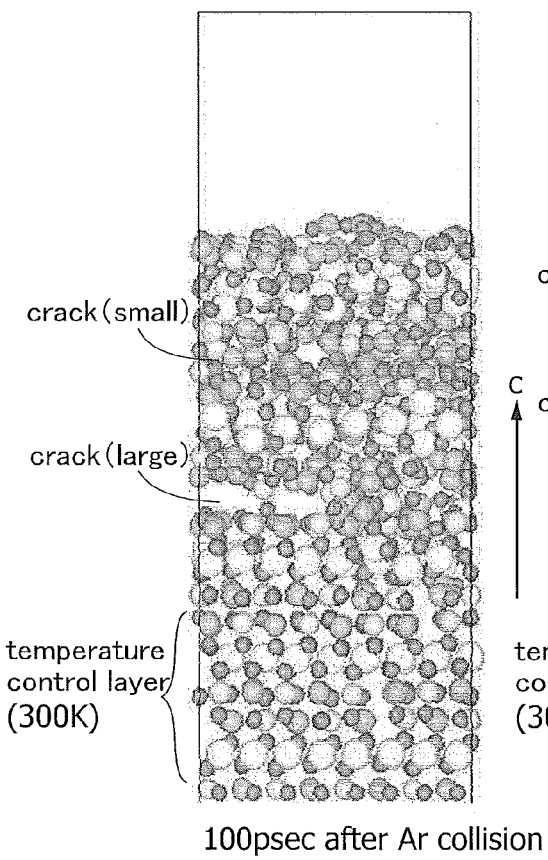
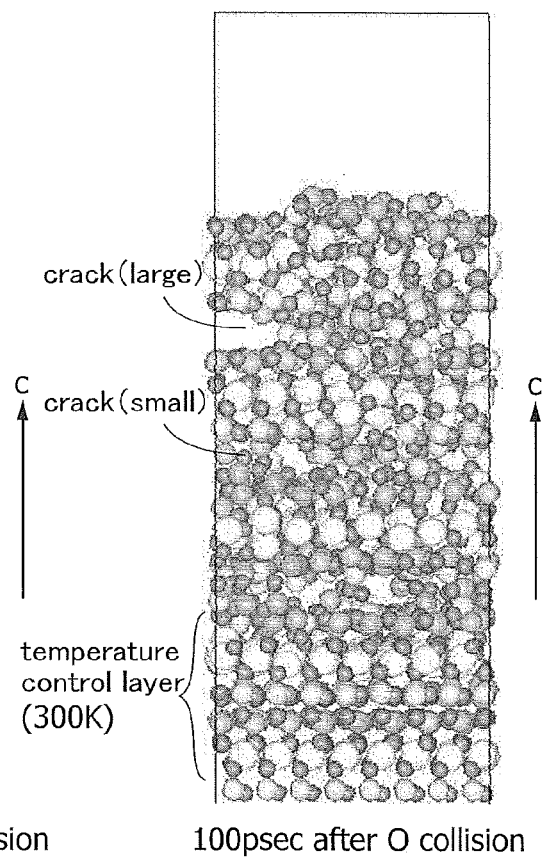
100psec after Ar collision
100psec after O collision
In : ○  Ga : ○  Zn : ●  O : ●

Zn in third layer (Zn-O layer)
reaches vincinity of sixth layer(Zn-O layer)

0~0.3psec after Ar entrance

Zn in third layer (Zn-O layer)
does not reach
the fifth layer (In-O layer)

0~0.3psec after O entrance

CAAC-OS film target

SEMICONDUCTOR DEVICE, MANUFACTURING METHOD THEREOF, MODULE, AND ELECTRONIC DEVICE

BACKGROUND OF THE INVENTION

1. Field of the Invention

One embodiment of the present invention relates to a semiconductor device including an oxide semiconductor film, a method for manufacturing the semiconductor device, a module, and an electronic device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

For example, Patent Document 1 discloses a technique in which a transistor is manufactured using an amorphous oxide containing In, Zn, Ga, Sn, and the like as an oxide semiconductor. Patent Document 2 discloses a technique for manufacturing a self-aligned transistor.

REFERENCE

Patent Document

[Patent Document 1] Japanese Published Patent Application No. 2006-165529
[Patent Document 2] Japanese Published Patent Application No. 2009-278115

SUMMARY OF THE INVENTION

As a transistor including an oxide semiconductor film, an inverted staggered transistor (also referred to as a transistor having a bottom-gate structure), a planar transistor (also referred to as a transistor having a top-gate structure), and the like are given. In the case where a transistor including an oxide semiconductor film is used for a display device, an inverted staggered transistor is used more often than a planar transistor because a manufacturing process of the inverted staggered transistor is relatively simple and manufacturing cost of the inverted staggered transistor can be kept low. However, signal delay or the like is increased by parasitic capacitance that exists between a gate electrode and source and drain electrodes of an inverted staggered transistor and accordingly image quality of a display device degrades, which has posed a problem, as an increase in screen size of a display device proceeds, or a display device is provided with a higher resolution image (for example, a high-resolution display device typified by 4 k×2 k pixels (3840 pixels in the horizontal direction and 2048 pixels in the perpendicular direction) or 8 k×4 k pixels (7680 pixels in the horizontal direction and 4320 pixels in the perpendicular direction)). Furthermore, as another problem, the occupation area of an inverted staggered transistor is larger than that of a planar transistor. Thus, with regard to a planar transistor including an oxide semiconductor film, development of a transistor which has a structure with stable semiconductor characteristics and high reliability and which is formed by a simple manufacturing process is desired.

With the increase in the screen size and the resolution of the display device, the structures of a transistor formed in a pixel of the display device and a capacitor connected to the transistor become important. The capacitor functions as a storage capacitor for storing data written to the pixel. Depending on the structure of the capacitor, there has been a problem in that data written to the pixel cannot be stored and the image quality of the display device is degraded.

In view of the foregoing problems, an object of one embodiment of the present invention is to provide a novel semiconductor device including an oxide semiconductor, particularly to provide a planar type semiconductor device including an oxide semiconductor. Another object is to provide a semiconductor device including an oxide semiconductor and having large on-state current, to provide a semiconductor device including an oxide semiconductor and having small off-state current, to provide a semiconductor device including an oxide semiconductor and occupying a small area, to provide a semiconductor device including an oxide semiconductor and having a stable electrical characteristic, to provide a semiconductor device including an oxide semiconductor and having high reliability, or to provide a novel semiconductor device.

Note that the descriptions of the above objects do not disturb the existence of other objects. In one embodiment of the present invention, there is no need to achieve all the objects. Objects other than the above objects will be apparent from and can be derived from the description of the specification and the like.

One embodiment of the present invention is a semiconductor device including a transistor and a capacitor. The transistor includes a first conductive film; a first insulating film over the first conductive film; a second insulating film over the first insulating film; an oxide semiconductor film over the second insulating film; a pair of electrodes in contact with the oxide semiconductor film; a gate insulating film over the oxide semiconductor film; and a second conductive film overlapping with the oxide semiconductor film with the gate insulating film therebetween. The first insulating film includes a film containing hydrogen. The second insulating film includes an oxide insulating film. The oxide semiconductor film includes a first region overlapping with the first conductive film and a pair of second regions between which the first region is interposed. A concentration of an impurity element in the first region is different from concentrations of the impurity element in the second regions. The capacitor includes a lower electrode, an inter-electrode insulating film over the lower electrode, and an upper electrode over the inter-electrode insulating film. The lower electrode contains the same material as the first conductive film. The inter-electrode insulating film includes a third insulating film containing the same material as the first insulating film, and a fourth insulating film containing the same material as the gate insulating film. The upper electrode contains the same material as the second conductive film. A fifth insulating film is provided over the transistor. The fifth insulating film includes a film containing hydrogen.

In the above structure, the film containing hydrogen preferably includes a silicon nitride film.

In either of the above structures, the oxide insulating film preferably includes a region which contains oxygen in excess of the stoichiometric composition.

In any of the above structures, each of the concentrations of the impurity element in the second regions is preferably higher than the concentration of the impurity element in the first region.

In addition, in any of the above structures, the impurity element preferably includes any one of hydrogen, boron, carbon, nitrogen, fluorine, aluminum, silicon, phosphorus, and chlorine.

In any of the above structures, the first region may include a region thicker than the second regions.

Another embodiment of the present invention is a method for manufacturing a semiconductor device, including the steps of: forming a first gate electrode and a lower electrode using one conductive film; forming a first insulating film over the first gate electrode and the lower electrode; forming a second insulating film over the first insulating film; forming a release prevention film over the second insulating film; adding oxygen to the second insulating film through the release prevention film; removing the release prevention film; processing a region of the second insulating film overlapping with the lower electrode to expose the first insulating film; forming an oxide semiconductor film over the second insulating film; forming a third insulating film over the oxide semiconductor film, the first insulating film, and the second insulating film; forming a first conductive film over the third insulating film; processing the first conductive film to form a second gate electrode and an upper electrode; processing the third insulating an to form a gate insulating film and a fourth insulating film; adding an impurity to the oxide semiconductor film with the use of the second gate electrode as a mask to form a first region overlapping with the second gate electrode and a pair of second regions between which the first region is interposed; forming a fifth insulating film over the second insulating film, the oxide semiconductor film, the second gate electrode, and the upper electrode; processing regions of the fifth insulating film overlapping with the pair of second regions to expose the pair of second regions; forming a source electrode over the fifth insulating film and one of the pair of second regions; and forming a drain electrode over the fifth insulating film and the other of the pair of second regions. The fifth insulating film includes a film containing hydrogen. The first insulating film and the fourth insulating film function as inter-electrode insulating films.

Another embodiment of the present invention is a module including any of the above semiconductor devices and a printed board.

Another embodiment of the present invention is an electronic device including any of the above semiconductor devices or the above module; and a speaker, an operation key, or a battery.

One embodiment of the present invention can provide a novel semiconductor device including an oxide semiconductor. In particular, a planar type semiconductor device including an oxide semiconductor can be provided. A semiconductor device including an oxide semiconductor and having large on-state current can be provided. A semiconductor device including an oxide semiconductor and having small off-state current can be provided. A semiconductor device including an oxide semiconductor and occupying a small area can be provided. A semiconductor device including an oxide semiconductor and having a stable electrical characteristic can be provided. A semiconductor device including an oxide semiconductor and having high reliability can be provided. A novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 2A to 2C are a top view and cross-sectional views illustrating one embodiment of a semiconductor device;

FIGS. 21A to 21D are Cs-corrected high-resolution TEM images of a plane of a CAAC-OS;

FIGS. 23A and 23B show electron diffraction patterns of a CAAC-OS;

FIG. 41 illustrates a display module;

FIG. 47 schematically illustrates a deposition model of an nc-OS and a pellet;

FIGS. 52A and 52B show a structure of $InGaZnO_4$ before collision of an atom, and the like;

FIGS. 53A and 53B show a structure of $InGaZnO_4$ after collision of an atom, and the like;

DETAILED DESCRIPTION OF THE INVENTION

Figure 1:
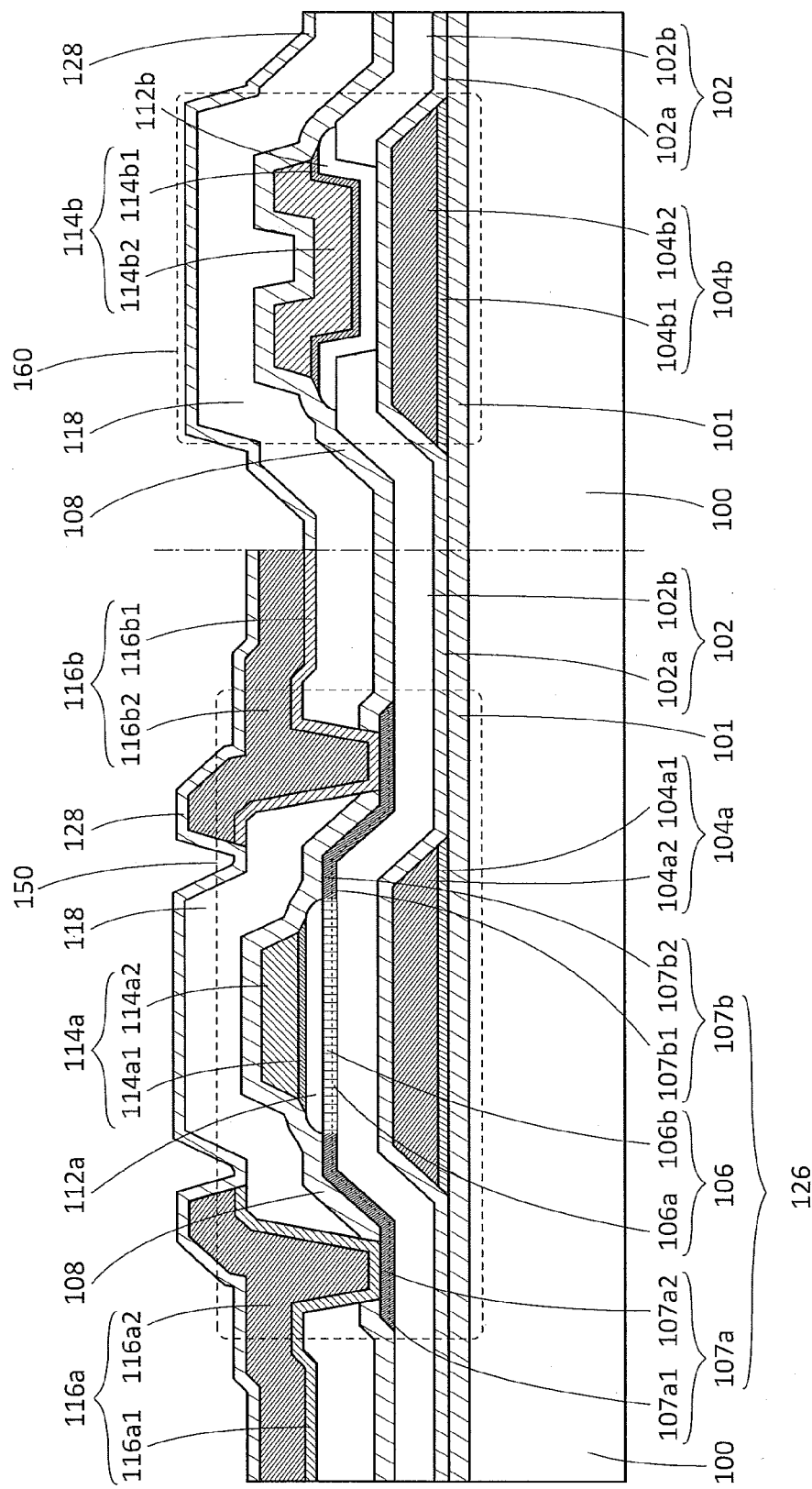
FIG. 1 is a cross-sectional view illustrating one embodiment of a semiconductor device.

Hereinafter, embodiments will be described with reference to the accompanying drawings. Note that the embodiments can be implemented with various modes. It will be readily appreciated by those skilled in the art that modes and details can be changed in various ways without departing from the spirit and scope of the present invention. Therefore, the present invention should not be construed as being limited to the following description of the embodiments.

In the drawings, the size, the layer thickness, or the region is exaggerated for clarity in some cases. Therefore, the scale of each component is not necessarily limited to that in the drawing. Note that the drawings are schematic views showing ideal examples, and embodiments of the present invention are not limited to the shapes or the values in the drawings.

In this specification, ordinal numbers such as "first", "second", and "third" are used in order to avoid confusion among components, and thus do not limit the number of the components.

In this specification, the terms for describing arrangement, such as "over", "above", "under", and "below", are used for convenience in describing a positional relation between components with reference to drawings. The positional relation between components is changed as appropriate in accordance with a direction in which each component is described. Thus, the positional relation is not limited to that described with a term used in this specification and can be explained with another term as appropriate depending on the situation.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

In this specification, the terms "film" and "layer" can be interchanged with each other. Also, the term "insulator" can be changed into the term "insulating film (or insulating layer)" and vice versa. The term "conductor" can be changed into the term "conductive film (or conductive layer)" and vice versa. In addition, the term "semiconductor" can be changed into the twin "semiconductor film (or semiconductor layer)" and vice versa.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

In this specification, the channel width refers to, for example, the width of a source or a drain in a region where a semiconductor (or a portion where a current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Embodiment 1

In this embodiment, one embodiment of a semiconductor device and one embodiment of a method for manufacturing the semiconductor device will be described with reference to drawings.

<Structure of Semiconductor Device>

FIG. 1 illustrates a transistor having a top-gate structure as an example of a transistor included in a semiconductor device and a capacitor that can be formed in the same process as the transistor.

FIG. 1 is a cross-sectional view of a transistor 150 and a capacitor 160 included in a semiconductor device. FIGS. 2A to 2C are a top view and cross-sectional views of the transistor 150. FIG. 2A is a top view of the transistor 150, FIG. 2B is a cross-sectional view taken along the dashed-dotted line A1-A2 in FIG. 2A, and FIG. 2C is a cross-sectional view taken along the dashed-dotted line A3-A4 in FIG. 2A. Note that in FIG. 2A, a substrate 100, an insulating film 101, an insulating film 102, a gate insulating film 112a, an insulating film 108, an insulating film 118, an insulating film 128, and the like are omitted for simplicity. In other top views in the following description, some components might be omitted as in the case of the transistor 150. The direction of the dashed-dotted line A1-A2 may be called a channel length direction, and the direction of the dashed-dotted line A3-A4 may be called a channel width direction.

The transistor 150 includes a gate electrode 104a over the insulating film 101 formed over the substrate 100, the insulating film 102 over the gate electrode 104a, an oxide semiconductor film 126 having, over the insulating film 102, a first region 106 and a pair of second regions 107a and 107b between which the first region 106 is interposed, the gate insulating film 112a in contact with the oxide semiconductor film 126, a gate electrode 114a over the gate insulating film 112a, the insulating film 108 and the insulating film 118 covering the oxide semiconductor film 126 and the gate electrode 114a, and a source electrode 116a and a drain electrode 116b in contact with the second region 107a and the second region 107b, respectively, in openings provided in the insulating film 108 and the insulating film 118.

The capacitor 160 includes a lower electrode 104b over the insulating film 101 formed over the substrate 100, an insulating film 102a and an insulating film 112b each functioning as an inter-electrode insulating film over the lower electrode 104b, and an upper electrode 114b over the insulating film 112b.

In the oxide semiconductor film 126, the pair of second regions 107a and 107b which does not overlap with the gate electrode 114a contains an element forming an oxygen vacancy. The element forming an oxygen vacancy will be described below as an impurity element. Typical examples of an impurity element are hydrogen, boron, carbon, nitrogen, fluorine, aluminum, silicon, phosphorus, chlorine, and rare gas elements. Typical examples of rare gas elements are helium, neon, argon, krypton, and xenon.

When an impurity element is added to the oxide semiconductor film, a bond between a metal element and oxygen in the oxide semiconductor film is cut, whereby an oxygen vacancy is formed. Alternatively, when an impurity element is added to the oxide semiconductor film, oxygen bonded to a metal element in the oxide semiconductor film is bonded to the impurity element, and the oxygen is released from the metal element, whereby an oxygen vacancy is formed. As a result, carrier density is increased in the oxide semiconductor film, and the oxide semiconductor film has higher conductivity.

When hydrogen is added to an oxide semiconductor in which an oxygen vacancy is formed by addition of an impurity element, hydrogen enters an oxygen vacant site and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

Here, the temperature dependence of resistivity of a film formed with an oxide conductor (hereinafter referred to as an oxide conductor film) is described with reference to a drawing.

In this embodiment, samples each including an oxide conductor film were manufactured. As the oxide conductor film, an oxide conductor film (OC_SiN$_x$) formed by making the oxide semiconductor film in contact with a silicon nitride film, an oxide conductor film (OC_Ar dope+SiN$_x$) formed by making the oxide semiconductor film in contact with a silicon nitride film after addition of argon to the oxide semiconductor film in a doping apparatus, and an oxide conductor film (OC_Ar plasma+SiN$_x$) formed by making the oxide semiconductor film in contact with a silicon nitride film after exposure of the oxide semiconductor film to argon plasma was formed. Note that the silicon nitride film contains hydrogen.

A method for forming a sample including the oxide conductor film (OC_SiN$_x$) is as follows. A 400-nm-thick silicon oxynitride film was formed over a glass substrate by a plasma CVD method and then exposed to oxygen plasma, and an oxygen ion was added to the silicon oxynitride film; accordingly, a silicon oxynitride film that releases oxygen by heating was formed. Next, a 100-nm-thick In—Ga—Zn oxide film was formed over the silicon oxynitride film that releases oxygen by heating by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. After that, a 100-nm-thick silicon nitride film was formed by a plasma CVD method. Subsequently, heat treatment was performed at 350° C. in a mixed gas atmosphere of nitrogen and oxygen.

A method for forming a sample including the oxide conductor film (OC_Ar dope+SiN$_x$) is as follows. A 400-nm-thick silicon oxynitride film was formed over a glass substrate by a plasma CVD method and then exposed to oxygen plasma, and an oxygen ion was added to the silicon oxynitride film; accordingly, a silicon oxynitride film that releases oxygen by heating was formed. Next, a 100-nm-thick In—Ga—Zn oxide film was formed over the silicon oxynitride film that releases oxygen by heating by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Then, with a doping apparatus, argon having a dose of $5\times10^{14}/cm^2$ was added to the In—Ga—Zn oxide film at an acceleration voltage of 10 kV, and oxygen vacancies were formed in the In—Ga—Zn oxide film. After that, a 100-nm-thick silicon nitride film was formed by a plasma CVD method. Subsequently, heat treatment was performed at 350° C. in a mixed gas atmosphere of nitrogen and oxygen.

A method for forming a sample including the oxide conductor film (OC_Ar plasma+SiN$_x$) is as follows. A 400-nm-thick silicon oxynitride film was formed over a glass substrate by a plasma CVD method and then exposed to oxygen plasma; accordingly, a silicon oxynitride film that releases oxygen by heating was formed. Next, a 100-nm-thick In—Ga—Zn oxide film was formed over the silicon oxynitride film that releases oxygen by heating by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Then, in a plasma processing apparatus, argon plasma was generated, accelerated argon ions were made to collide with the In—Ga—Zn oxide film, and oxygen vacancies were formed in the In—Ga—Zn oxide film. After that, a 100-nm-thick silicon nitride film was formed by a plasma CVD method. Subsequently, heat treatment was performed at 350° C. in a mixed gas atmosphere of nitrogen and oxygen.

Figure 45:
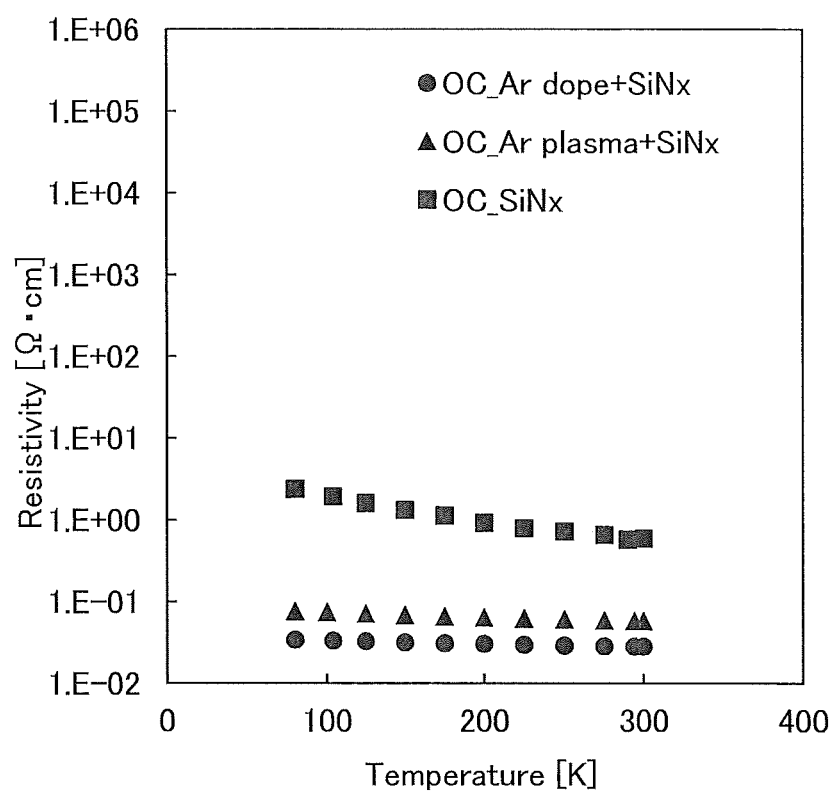
FIG. 45 is a graph showing temperature dependence of resistivity.

Next, FIG. 45 shows the measured resistivity of the samples. Here, the resistivity was measured by the Van der Pauw method using four terminals. In FIG. 45, the horizontal axis represents measurement temperature, and the vertical axis represents resistivity. Measurement results of the oxide conductor film (OC_SiN$_x$) are plotted as squares, measurement results of the oxide conductor film (OC_Ar dope+SiN$_x$) are plotted as circles, and measurement results of the oxide conductor film (OC_Ar plasma+SiN$_x$) are plotted as triangles.

Note that although not shown, the oxide semiconductor film which is not in contact with the silicon nitride film had high resistivity, which was difficult to measure. Therefore, it is found that the oxide conductor film has lower resistivity than the oxide semiconductor film.

According to FIG. 45, in the case where the oxide conductor film (OC_Ar dope+SiN$_x$) and the oxide conductor film (OC_Ar plasma+SiN$_x$) contain an oxygen vacancy and hydrogen, variation in resistivity is small. Typically, the variation in resistivity at temperatures from 80 K to 290 K is lower than ±20%. Alternatively, the variation in resistivity at temperatures from 150 K to 250 K is lower than ±10%. In other words, the oxide conductor is a degenerate semiconductor and it is suggested that the conduction band edge agrees with or substantially agrees with the Fermi level. Thus, when the oxide conductor film is used as a source region and a drain region of a transistor, an ohmic contact occurs at a portion where the oxide conductor film is in contact with a conductive film functioning as a source electrode and a drain electrode, and the contact resistance of the oxide conductor film and the conductive films functioning as a source electrode and a drain electrode can be reduced. Furthermore, since the temperature dependence of resistivity of an oxide conductor is low, the amount of change in the contact resistance of the oxide conductor film and the conductive films functioning as a source electrode and a drain electrode is small; thus, a highly reliable transistor can be obtained.

The pair of second regions 107a and 107b functions as a source region and a drain region. In the case where the source electrode 116a and the drain electrode 116b are formed using a conductive material which is easily bonded to oxygen, such as tungsten, titanium, aluminum, copper, molybdenum, chromium, tantalum, an alloy of any of these, or the like, oxygen contained in the oxide semiconductor film is bonded to the conductive material contained in the source electrode 116a and the drain electrode 116b, and an oxygen vacancy is formed in the oxide semiconductor film. Furthermore, in some cases, part of constituent elements of the conductive material that forms the source electrode 116a and the drain electrode 116b is mixed into the oxide semiconductor film. As a result, the pair of second regions 107a and 107b in contact with the source electrode 116a and the drain electrode 116b has higher conductivity and accordingly functions as a source region and a drain region.

In the case where a rare gas element is used as the impurity element and the oxide semiconductor film 126 is formed by a sputtering method, the pair of second regions 107a and 107b contain the rare gas element, and the concentrations of the rare gas elements in the pair of second regions 107a and 107b are higher than that in the first region 106. This is due to the fact that in the case where the oxide semiconductor film 126 is formed by a sputtering method, the rare gas element is contained in the oxide semiconductor film 126 because the rare gas element is used as a sputtering gas and the rare gas element is intentionally added to the oxide semiconductor film 126 in order to form oxygen vacancies in the pair of second regions 107a and 107b. Note that a rare gas element different from that in the first region 106 may be added to the pair of second regions 107a and 107b.

In the case where the impurity element is boron, carbon, nitrogen, fluorine, aluminum, silicon, phosphorus, or chlorine, only the pair of second regions 107a and 107b contain the impurity element. Therefore, the concentrations of the impurity element in the pair of second regions 107a and 107b are higher than that in the first region 106. Note that the concentrations of the impurity element in the pair of second regions 107a and 107b which are measured by secondary ion mass spectrometry (SIMS) can be greater than or equal to $5\times10^{18}$ atoms/cm$^3$ and less than or equal to $1\times10^{22}$ atoms/cm$^3$, greater than or equal to $1\times10^{19}$ atoms/cm$^3$ and less than or equal to $1\times10^{21}$ atoms/cm$^3$, or greater than or equal to $5\times10^{19}$ atoms/cm$^3$ and less than or equal to $5\times10^{20}$ atoms/cm$^3$.

The concentrations of the impurity element in the pair of second regions 107a and 107b are higher than that in the first region 106 in the case where the impurity elements are hydrogen. Note that the concentrations of hydrogen in the pair of second regions 107a and 107b which are measured by SIMS can be greater than or equal to $8\times10^{19}$ atoms/cm$^3$, greater than or equal to $1\times10^{20}$ atoms/cm$^3$, or greater than or equal to $5\times10^{20}$ atoms/cm$^3$.

Since the pair of second regions 107a and 107b contains impurity elements, oxygen vacancies and carrier densities of the pair of second regions 107a and 107b are increased. As a result, the pair of second regions 107a and 107b has higher conductivity and functions as low-resistance regions.

Note that impurity element may be a combination of one or more of hydrogen, boron, carbon, nitrogen, fluorine, aluminum, silicon, phosphorus, and chlorine and one or more of the rare gas elements. In that case, due to interaction between oxygen vacancies formed by the rare gas elements in the pair of second regions 107a and 107b and one or more of hydrogen, boron, carbon, nitrogen, fluorine, aluminum, silicon, phosphorus, and chlorine added to the above regions, the conductivity of the pair of second regions 107a and 107b might be further increased.

Figure 3:
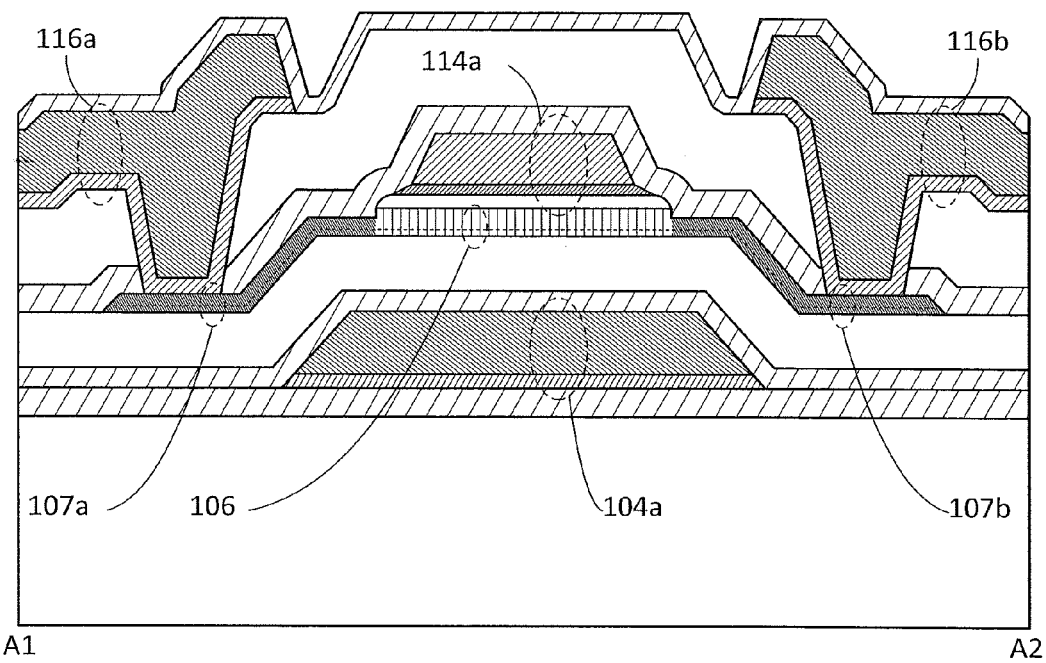
FIG. 3 is a cross-sectional view illustrating one embodiment of a semiconductor device.

The first region 106 functions as a channel. Here, FIG. 3 is an enlarged view of the vicinity of the oxide semiconductor film 126. In the oxide semiconductor film 126, regions to be the pair of second regions 107a and 107b are etched when the gate electrode 114a is formed; therefore, as illustrated in FIG. 3, the thickness of the first region 106 becomes larger than that of the pair of second regions 107a and 107b. Typically, the first region 106 includes a region whose thickness is larger than that of the pair of second regions 107a and 107b by 0.1 nm or more and 5 nm or less.

The transistor 150 described in this embodiment includes the first region 106 functioning as a channel formation region and the pair of second regions 107a and 107b functioning as a source region and a drain region. Since the pair of second regions 107a and 107b have high conductivity, the contact resistance between the pair of second regions 107a and 107b and the source electrode 116a and the drain electrode 116b can be reduced, and thus, the on-state current of the transistor can be increased.

In addition, in the transistor 150, an impurity element is added to the oxide semiconductor film 126 using the gate electrode 114a as a mask. That is, the impurity regions (the source region and the drain region) can be formed in a self-aligned manner.

The capacitor 160 can be formed in the same manufacturing process as the transistor 150. The gate electrode 104a of the transistor 150 and the lower electrode 104b of the capacitor 160 are formed at a time. The gate insulating film 112a of the transistor 150 and the insulating film 112b of the capacitor 160 can be formed at a time. The gate electrode 114a of the transistor 150 and the upper electrode 114b of the capacitor 160 are formed at a time.

The structure illustrated in FIG. 1 is described below in detail.

The type of the substrate 100 is not limited to a certain type, and any of a variety of substrates can be used as the substrate 100. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. Examples of a flexible substrate, an attachment film, and a base material film are as follows: plastic typified by polyethylene terephthalate (PET), polyethylene naphthalate (PEN), and polyether sulfone (PES); a synthetic resin such as acrylic; polypropylene, polyester, polyvinyl fluoride, and polyvinyl chloride; polyamide; polyimide; aramid; epoxy; an inorganic vapor deposition film; and paper. Specifically, when the transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Still alternatively, a flexible substrate may be used as the substrate 100, and the transistor may be directly provided on the flexible substrate. Alternatively, a separation layer may be provided between the substrate 100 and the transistor. The separation layer can be used when part or the whole of a semiconductor device formed over the separation layer is completed and separated from the substrate 100 and transferred to another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent characteristics or a transistor with low power consumption can be formed, a device with high durability, high heat resistance can be provided, or reduction in weight or thickness can be achieved.

The insulating film 101 functions as a base insulating film. The insulating film 101 has a function of preventing diffusion of impurities from the substrate 100. For example, the insulating film 101 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. Alternatively, a stack of the above materials may be used.

The gate electrode 104a is a stack of a conductive film 104a1 and a conductive film 104a2. The lower electrode 104b is a stack of a conductive film 104b1 and a conductive film 104b2. The conductive films 104a1, 104a2, 104b1, and 104b2 can be formed using a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. The gate electrode 104a and the lower electrode 104b each may have a single-layer structure or a stacked-layer structure of three or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; and a three-layer structure in which a copper film containing manganese, a copper film, and a copper film containing manganese are stacked in this order. Alternatively, an alloy film or a nitride film which contains aluminum and one or more elements selected from titanium, tantalum, tungsten, molybdenum, chromium, neodymium, and scandium may be used.

The gate electrode 104a and the lower electrode 104b each can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. Alternatively, a stacked-layer structure of the above light-transmitting conductive material and the above metal element may be employed.

In this embodiment, titanium films are used as the conductive films 104a1 and 104b1 and copper films are used as the conductive films 104a2 and 104b2. It is preferable to use a low-resistance conductive material such as copper or aluminum for the conductive films 104a2 and 104b2. By using such a low-resistance conductive material, signal delay can be reduced.

The insulating film 102 is a stack of the insulating film 102a and an insulating film 102b.

The insulating film 102a is preferably a film containing hydrogen and having a blocking effect against oxygen, hydrogen, water, an alkali metal, an alkaline earth metal, and the like and can be formed using silicon nitride oxide, aluminum nitride, aluminum nitride oxide, or the like. The insulating film 102b is preferably formed using an oxide insulating film in order to improve characteristics of the interface with the oxide semiconductor film 126. It is particularly preferable to contain an oxide material from which part of oxygen is released by heating, and it is further preferable to use an oxide containing oxygen whose amount is larger than that of oxygen in the stoichiometric composition. When the insulating film 102b is formed using an oxide insulating film from which oxygen is released by heating as described above, oxygen contained in the insulating film 102b can be moved to the oxide semiconductor film 126 by heat treatment.

The thickness of the insulating film 102b can be greater than or equal to 50 nm, greater than or equal to 100 nm and less than or equal to 3000 nm, or greater than or equal to 200 nm and less than or equal to 1000 nm. With the use of the thick insulating film 102b, the amount of oxygen released from the insulating film 102b can be increased, and the interface states between the insulating film 102b and the oxide semiconductor film 126 and oxygen vacancies included in the first region 106 of the oxide semiconductor film 126 can be reduced.

The insulating film 102b can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

The oxide semiconductor film 126 is typically formed using a metal oxide such as an In—Ga oxide, an In—Zn oxide, or an In-M-Zn oxide (M is Mg, Al, Ti, Ga, Y, Zr, La, Ce, Nd, or Hf). Note that the oxide semiconductor film 126 has light-transmitting properties.

Note that in the case of using an In-M-Zn oxide as the oxide semiconductor film 126, when the total atomic percentage of In and M is assumed to be 100 atomic %, the proportions of In and M are preferably set to be greater than or equal to 25 atomic % and less than 75 atomic %, respectively, or greater than or equal to 34 atomic % and less than 66 atomic %, respectively.

The energy gap of the oxide semiconductor film 126 is 2 eV or more, 2.5 eV or more, or 3 eV or more.

The thickness of the oxide semiconductor film 126 is greater than or equal to 3 nm and less than or equal to 200 nm, greater than or equal to 3 nm and less than or equal to 100 nm, or greater than or equal to 3 nm and less than or equal to 50 nm.

In the case where the oxide semiconductor film 126 is an In-M-Zn oxide, it is preferable that the atomic ratio of metal elements of a sputtering target used for forming a film of the In-M-Zn oxide satisfy In≥M and Zn≥M. As the atomic ratio of metal elements of the sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the atomic ratios of metal elements in the faulted oxide semiconductor film 126 vary from the above atomic ratio of metal elements of the sputtering target within a range of ±40% as an error.

When silicon or carbon that is one of elements belonging to Group 14 is contained in the oxide semiconductor film 126, oxygen vacancies are increased, and the oxide semiconductor film 126 become an n-type film. Thus, the concentration of silicon or carbon (the concentrations are measured by secondary ion mass spectrometry (SIMS)) of the oxide semiconductor film 126, in particular, the first region 106 can be less than or equal to $2\times10^{18}$ atoms/cm$^3$ or less than or equal to $2\times10^{17}$ atoms/cm$^3$. As a result, the transistor has positive threshold voltage (normally-off characteristics).

In addition, the concentration of alkali metals or alkaline earth metals measured by secondary ion mass spectrometry (SIMS) of the oxide semiconductor film 126, in particular, the first region 106 can be less than or equal to $1\times10^{18}$ atoms/cm$^3$ or less than or equal to $2\times10^{16}$ atoms/cm$^3$. An alkali metal and an alkaline earth metal might generate carriers when bonded to an oxide semiconductor, in which case the off-state current of the transistor might be increased. Therefore, it is preferable to reduce the concentration of an alkali metal or an alkaline earth metal in the first region 106. As a result, the transistor has normally-off characteristics.

Furthermore, when containing nitrogen, the oxide semiconductor film 126, in particular, the first region 106 might become an n-type film by generation of electrons serving as carriers and an increase of carrier density. Thus, the transistor 150 including an oxide semiconductor film which contains nitrogen is likely to have normally-on characteristics. For this reason, nitrogen in the oxide semiconductor film, in particular, the first region 106 is preferably reduced as much as possible. The concentration of nitrogen measured by secondary ion mass spectrometry (SIMS) can be set to be, for example, less than or equal to $5\times10^{18}$ atoms/cm$^3$.

When the impurity element in the oxide semiconductor film 126, in particular, the first region 106 is reduced, the carrier density of the oxide semiconductor film can be lowered. Therefore, the oxide semiconductor film 126, in particular, the first region 106 has a carrier density less than or equal to $1\times10^{17}$/cm$^3$, less than or equal to $1\times10^{15}$/cm$^3$, less than or equal to $1\times10^{13}$/cm$^3$, or less than or equal to $1\times10^{11}$/cm$^3$.

An oxide semiconductor film with a low impurity concentration and a low density of defect states can be used as the oxide semiconductor film 126, in which case the transistor can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have normally-off characteristics. A highly purified intrinsic or substantially highly purified intrinsic oxide semiconductor film has a low density of defect states and accordingly has low density of trap states in some cases. Furthermore, a highly purified intrinsic or substantially highly purified intrinsic oxide semiconductor film has an extremely small off-state current; the off-state current can be smaller than or equal to the measurement limit of a semiconductor parameter analyzer, i.e., smaller than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

In addition, the oxide semiconductor film 126 may have a non-single-crystal structure, for example. The non-single crystal structure includes a c-axis aligned crystalline oxide semiconductor (CAAC-OS), a polycrystalline structure, a microcrystalline structure, or an amorphous structure, for example. Among the non-single crystal structure, the amorphous structure has the highest density of defect states, whereas CAAC-OS has the lowest density of defect states.

Note that the oxide semiconductor film 126 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure including, for example, two or more of a region having an amorphous structure, a region having a microcrystalline structure, a region having a polycrystalline structure, a CAAC-OS region, and a region having a single-crystal structure in some cases.

Note that in some cases, the pair of second regions 107a and 107b and the first region 106 are different in crystallinity in the oxide semiconductor film 126. This is because when an impurity element is added to the pair of second regions 107a and 107b, the pair of second regions 107a and 107b is damaged and thus has lower crystallinity.

In this embodiment, the oxide semiconductor film 126 has a multilayer structure (here, a two-layer structure) of oxide semiconductor films; a lower layer includes a channel formation region 106a and low-resistance regions 107a1 and 107b1 and an upper layer includes a channel formation region 106b and low-resistance regions 107a2 and 107b2.

The channel region is formed in the lower layer of the oxide semiconductor film having a two-layer structure. The upper layer of the oxide semiconductor film having the two-layer structure is typically an In—Ga oxide, an In—Zn oxide, an In—Mg oxide, a Zn—Mg oxide, or an In-M-Zn oxide (M is Mg, Al, Ti, Ga, Y, Zr, La, Ce, Nd, or Hf) and has the energy at the conduction band minimum closer to a vacuum level than that of the lower layer. Typically, a difference between the energy at the conduction band minimum of the oxide semiconductor film (upper layer) and the energy at the conduction band minimum of the oxide semiconductor film (lower layer) is 0.05 eV or more, 0.07 eV or more, 0.1 eV or more, or 0.2 eV or more and 2 eV or less, 1 eV or less, 0.5 eV or less, or 0.4 eV or less. Note that the difference between the vacuum level and the energy at the conduction band minimum is referred to as electron affinity.

In the case where the oxide semiconductor film (upper layer) is an In-M-Zn oxide (M is Mg, Al, Ti, Ga, Y, Zr, La, Ce, Nd, or Hf) and a target having the atomic ratio of metal elements of In:M:Zn=$x_1$:$y_1$:$z_1$ is used for depositing the oxide semiconductor film (upper layer), $x_1/y_1$ is preferably greater than or equal to ⅓ and less than or equal to 6, or further preferably greater than or equal to 1 and less than or equal to 6, and $z_1/y_1$ is preferably greater than or equal to ⅓ and less than or equal to 6, or further preferably greater than or equal to 1 and less than or equal to 6. Note that when $z_1/y_1$ is greater than or equal to 1 and less than or equal to 6, a CAAC-OS film as the oxide semiconductor film (upper layer) is easily formed. As typical examples of the atomic ratio of metal elements of the target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and the like can be given.

Note that a proportion of each atom in the atomic ratio of the oxide semiconductor film (upper layer) and the oxide semiconductor film (lower layer) varies within a range of ±40% as an error.

The atomic ratio is not limited to the above, and the atomic ratio may be appropriately set in accordance with needed semiconductor characteristics.

The gate insulating film 112a and the insulating film 112b can be formed with a single layer or a stack using an oxide insulating film or a nitride insulating film. Note that an oxide insulating film is preferably used for at least a region in contact with the oxide semiconductor film 126, in order to improve characteristics of the interface with the oxide semiconductor film 126. The gate insulating film 112a and the insulating film 112b can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

Furthermore, it is possible to prevent outward diffusion of oxygen from the oxide semiconductor film 126 and entry of hydrogen, water, or the like into the oxide semiconductor film 126 from the outside by providing an insulating film having a blocking effect against oxygen, hydrogen, water, and the like as the gate insulating film 112a and the insulating film 112b. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The gate insulating film 112a and the insulating film 112b may be formed using a high-k material such as hafnium silicate (HfSi$_x$O$_y$), hafnium silicate (HfSi$_x$O$_y$) to which nitrogen is added, hafnium aluminate (HfAl$_x$O$_y$) to which nitrogen is added, hafnium oxide, or yttrium oxide, so that gate leakage current of the transistor can be reduced.

It is preferable that the gate insulating film 112a and the insulating film 112b each contain an oxide material from which part of oxygen is released by heating, and it is further preferable to use an oxide containing oxygen whose amount is larger than that of oxygen in the stoichiometric composition. When the gate insulating film 112a and the insulating film 112b are each formed using an oxide insulating film from which oxygen is released by heating as described above, oxygen contained in the gate insulating film 112a can be moved to the oxide semiconductor film 126 by heat treatment.

In addition, a silicon oxynitride film with few defects can be used as the gate insulating film 112a and the insulating film 112b. In an ESR spectrum at 100 K or lower of the silicon oxynitride film with few defects, after heat treatment, spin densities of a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is less than $1 \times 10^{18}$ spins/cm$^3$, typically greater than or equal to $1 \times 10^{17}$ spins/cm$^3$ and less than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, or greater than or equal to 1 and smaller than or equal to 2). Accordingly, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide contained in the silicon oxynitride film is.

The concentration of nitrogen in the silicon oxynitride film with few defects which is measured by secondary ion mass spectrometry is less than or equal to $6 \times 10^{20}$ atoms/cm$^3$. With the use of the silicon oxynitride film with few defects as the gate insulating film 112a and the insulating film 112b, a nitrogen oxide is unlikely to be generated, so that the carrier trap at the interface between the oxide semiconductor film 126 and the insulating film can be inhibited. Furthermore, a shift in the threshold voltage of the transistor included in the semiconductor device can be reduced, which leads to a smaller change in the electrical characteristics of the transistor.

The gate electrode 114a is a stack of a conductive film 114a1 and a conductive film 114a2. The upper electrode 114b is a stack of a conductive film 114b1 and a conductive film 114b2. For materials and the like of the conductive films 114a1, 114a2, 114b1, and 114b2, the materials and the like that can be used for the conductive films 104a1, 104a2, 104b1, and 104b2 can be referred to.

In this embodiment, tantalum nitride films are used as the conductive films 114a1 and 114b1 and tungsten films are used as the conductive films 114a2 and 114b2.

As illustrated in the cross-sectional view in the channel length direction in FIG. 1, the end portion of the conductive film 114a1 may be positioned on the outer side than the end portion of the conductive film 114a2, and the conductive film 114a1 may have a tapered shape. That is, the angle formed between a surface where the gate insulating film 112a and the conductive film 114a1 are in contact with each other and a side surface of the conductive film 114a1 may be less than 90°, greater than or equal to 5° and less than or equal to 45°, or greater than or equal to 5° and less than or equal to 30°. The end portion of the conductive film 114b1 may be positioned on the outer side than the end portion of the conductive film 114b2, and the conductive film 114b1 may have a tapered shape. That is, the angle formed between a surface where the insulating film 112b and the conductive film 114b1 are in contact with each other and a side surface of the conductive film 114b1 may be less than 90°, greater than or equal to 5° and less than or equal to 45°, or greater than or equal to 5° and less than or equal to 30°.

Furthermore, the end portion of the gate insulating film 112a may be positioned on the outer side than the end portion of the conductive film 114a1. The end portion of the insulating film 112b may be positioned on the outer side than the end portion of the conductive film 114b1.

Still furthermore, the side surfaces of the gate insulating film 112a and the insulating film 112b may be curved.

The gate insulating film 112a may have a tapered shape. That is, the angle formed between a surface where the oxide semiconductor film 126 and the gate insulating film 112a are in contact with each other and a side surface of the gate insulating film 112a may be less than 90°, or preferably greater than or equal to 30° and less than 90°.

For a material and the like of the insulating film 108, the material and the like that can be used for the insulating film 102a can be referred to.

For a material and the like of the insulating film 118, the material and the like that can be used for the insulating film 102b can be referred to.

The source electrode 116a is a stack of a conductive film 116a1 and a conductive film 116a2. The drain electrode 116b is a stack of a conductive film 116b1 and a conductive film 116b2. For materials and the like of the conductive films 116a1, 116a2, 116b1, and 116b2, the materials and the like that can be used for the conductive films 104a1, 104a2, 104b1, and 104b2 can be referred to.

In this embodiment, tungsten films are used as the conductive films 116a1 and 116b1 and copper films are used as the conductive films 116a2 and 116b2. It is preferable to use a low-resistance conductive material such as copper or aluminum for the conductive films 116a2 and 116b2. By using such a low-resistance conductive material, signal delay can be reduced.

It is preferable that the insulating film 128 be a film functioning as a barrier film against hydrogen, water, and the like from the outside. The insulating film 128 can be formed with a single layer or a stack using, for example, one or more of silicon nitride, silicon nitride oxide, and aluminum oxide.

In this embodiment, modified examples of the transistor will be described with reference to FIGS. 4A to 4F, FIGS. 5A to 5F, FIGS. 6A to 6E, FIGS. 7A and 7B, and FIGS. 29A to 29D. Transistors illustrated in FIGS. 4A to 4F each include an oxide semiconductor film 455 formed over an insulating film 453 over a substrate 400, an insulating film 457 in contact with the oxide semiconductor film 455, and a conductive film 459 which is in contact with the insulating film 457 and overlaps with the oxide semiconductor film 455. Note that the insulating film 457 functions as a gate insulating film. The conductive film 459 functions as a gate electrode. For the substrate 400, the substrate 100 can be referred to. For the insulating film 453, the insulating film 101 can be referred to. For the oxide semiconductor film 455, the oxide semiconductor film 126 can be referred to. For the insulating film 457, the gate insulating film 112a can be referred to. For the conductive film 459, the gate electrode 114a can be referred to.

In addition, each transistor is provided with a nitride insulating film 465 in contact with the oxide semiconductor film 455 and an insulating film 467 in contact with the nitride insulating film 465. A conductive film 468 and a conductive film 469 that are in contact with the oxide semiconductor film 455 in openings in the nitride insulating film 465 and the insulating film 467 are provided. Note that the conductive film 468 and the conductive film 469 function as a source electrode and a drain electrode. Note that for the nitride insulating film 465, the insulating film 108 can be referred to. For the insulating film 467, the insulating film 118 can be referred to. For the conductive film 468 and the conductive film 469, the source electrode 116a and the drain electrode 116b can be referred to.

Figure 4A:
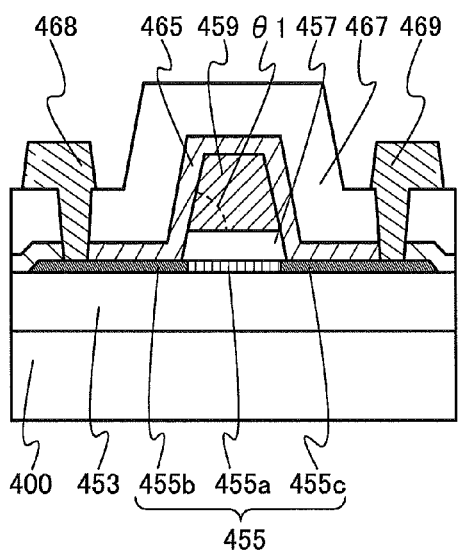
FIGS. 4A to 4F each illustrate a structure of a transistor.

In the transistor illustrated in FIG. 4A, the oxide semiconductor film 455 includes a channel region 455a formed in a region overlapping with the conductive film 459 and regions containing an impurity element, between which the channel region 455a is interposed, i.e. a low-resistance region 455b and a low-resistance region 455c. The conductive film 468 and the conductive film 469 are in contact with the low-resistance region 455b and the low-resistance region 455c, respectively. The conductive films 468 and 469 each function as a wiring.

Figure 4B:
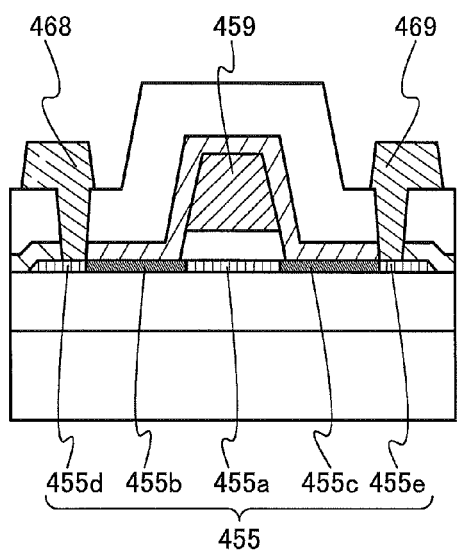

Alternatively, as in the transistor illustrated in FIG. 4B, an impurity element is not necessarily added to a region 455d and a region 455e of the oxide semiconductor film 455 which are in contact with the conductive film 468 and the conductive film 469, respectively. In this case, the regions containing an impurity element, i.e. the low-resistance regions 455b and 455c are provided between the channel region 455a and each of the regions 455d and 455e in contact with the conductive film 468 and the conductive film 469. The regions 455d and 455e have conductivity when the voltage is applied to the conductive films 468 and 469; thus, the regions 455d and 455e function as a source region and a drain region.

Note that the transistor illustrated in FIG. 4B can be formed in such a manner that after the conductive films 468 and 469 are formed, the impurity element is added to the oxide semiconductor film using the conductive film 459 and the conductive films 468 and 469 as masks.

The end portion of the conductive film 459 may have a tapered shape. That is, the angle θ1 formed between a surface where the insulating film 457 and the conductive film 459 are in contact with each other and a side surface of the conductive film 459 may be less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°. When the angle θ1 is less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°, the coverage of the side surfaces of the insulating film 457 and the conductive film 459 with the nitride insulating film 465 can be improved.

Next, modification examples of the low-resistance regions 455b and 455c are described. FIGS. 4C to 4F are each an enlarged view of the vicinity of the oxide semiconductor film 455 illustrated in FIG. 4A. The channel length L indicates a distance between a pair of low-resistance regions.

Figure 4C:
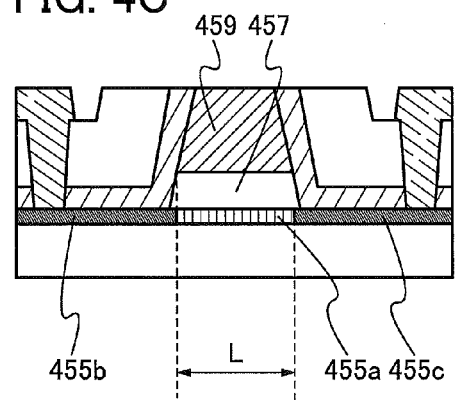

As illustrated in FIG. 4C in a cross-sectional view in the channel length direction, the boundaries between the channel region 455a and the low-resistance regions 455b and 455c are aligned or substantially aligned with the end portions of the conductive film 459 with the insulating film 457 provided therebetween. That is, the boundaries between the channel region 455a and the low-resistance regions 455b and 455c are aligned or substantially aligned with the end portions of the conductive film 459, when seen from the above.

Figure 4D:
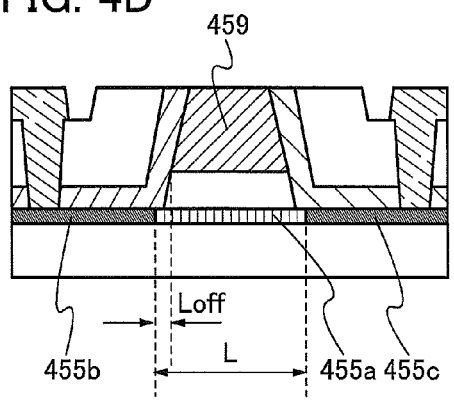

Alternatively, as illustrated in FIG. 4D in a cross-sectional view in the channel length direction, the channel region 455a has a region not overlapping with the conductive film 459. The region functions as an offset region. The length of the offset region in the channel length direction is referred to as $L_{off}$. When a plurality of offset regions is provided, $L_{off}$ indicates the length of one offset region. Note that $L_{off}$ is included in the channel length L. Note that $L_{off}$ is smaller than 20%, smaller than 10%, smaller than 5%, or smaller than 2% of the channel length L.

Figure 4E:
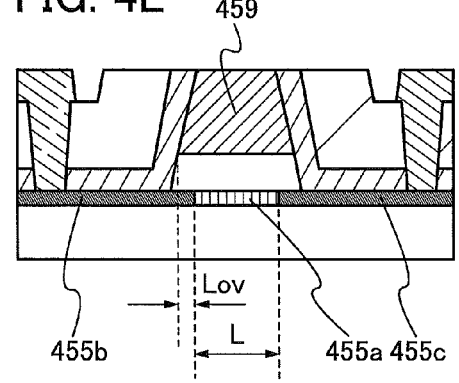

Alternatively, as illustrated in FIG. 4E in a cross-sectional view in the channel length direction, the low-resistance regions 455b and 455c each have a region overlapping with the conductive film 459 with the insulating film 457 provided therebetween. The regions function as an overlap region. The overlap region in the channel length direction is referred to as $L_{ov}$. Note that $L_{ov}$ is smaller than 20%, smaller than 10%, smaller than 5%, or smaller than 2% of the channel length L.

Figure 4F:
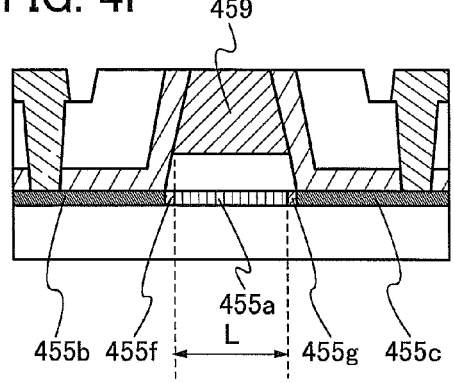

Alternatively, as illustrated in FIG. 4F in a cross-sectional view in the channel length direction, a low-resistance region 455f is provided between the channel region 455a and the low-resistance region 455b, and a low-resistance region 455g is provided between the channel region 455a and the low-resistance region 455c. The low-resistance regions 455f and 455g have lower concentrations of the impurity element and higher resistivity than the low-resistance regions 455b and 455c. Although the low-resistance regions 455f and 455g overlap with the insulating film 457 in this case, they may overlap with the insulating film 457 and the conductive film 459.

Note that in FIGS. 4C to 4F, the transistor illustrated in FIG. 4A is described; however, the transistor illustrated in FIG. 4B can employ any of the structures in FIGS. 4C to 4F as appropriate.

Figure 5A:
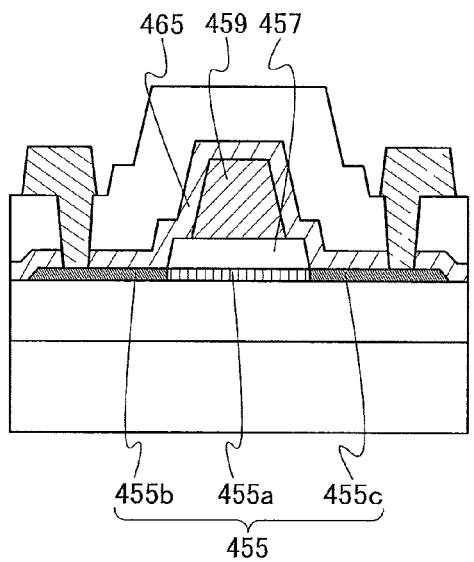
FIGS. 5A to 5F each illustrate a structure of a transistor.

In the transistor illustrated in FIG. 5A, the end portion of the insulating film 457 is positioned on the outer side than the end portion of the conductive film 459. That is, the insulating film 457 has a shape such that the end portion extends beyond the end portion of the conductive film 459. The nitride insulating film 465 can be kept away from the channel region 455a; thus, entry of nitrogen, hydrogen, and the like contained in the nitride insulating film 465 into the channel region 455a can be suppressed.

Figure 5B:
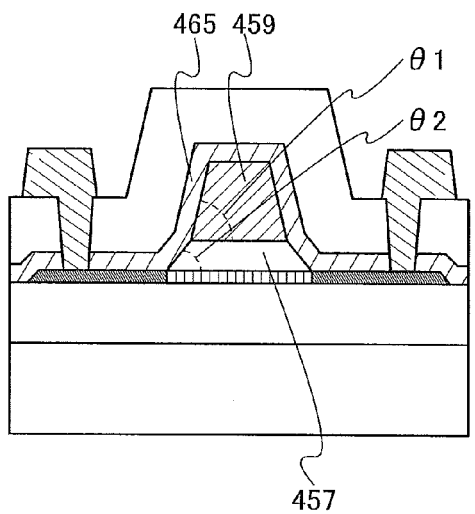

In the transistor illustrated in FIG. 5B, the insulating film 457 and the conductive film 459 each have a tapered shape, and the angles of the tapered shapes are different from each other. In other words, the angle θ1 formed between a surface where the insulating film 457 and the conductive film 459 are in contact with each other and a side surface of the conductive film 459 is different from the angle θ2 formed between a surface where the oxide semiconductor film 455 and the insulating film 457 are in contact with each other and a side surface of the insulating film 457. The angle θ2 may be less than 90°, greater than or equal to 30° and less than or equal to 85°, or greater than or equal to 45° and less than or equal to 70°. For example, when the angle θ2 is larger than angle θ1, the transistor can be miniaturized.

Next, modification examples of the low-resistance regions 455b and 455c are described with reference to FIGS. 5C to 5F. FIGS. 5C to 5F are each an enlarged view of the vicinity of the oxide semiconductor film 455 illustrated in FIG. 5A.

Figure 5C:
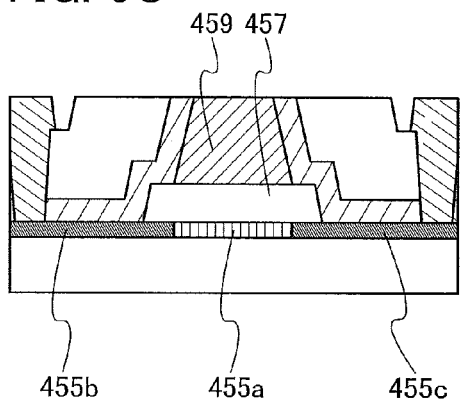

As illustrated in FIG. 5C in a cross-sectional view in the channel length direction, the boundaries between the channel region 455a and the low-resistance regions 455b and 455c are aligned or substantially aligned with the end portions of the conductive film 459 with the insulating film 457 provided therebetween. That is, when seen from the above, the boundaries between the channel region 455a and the low-resistance regions 455b and 455c are aligned or substantially aligned with the end portions of the conductive film 459.

Figure 5D:
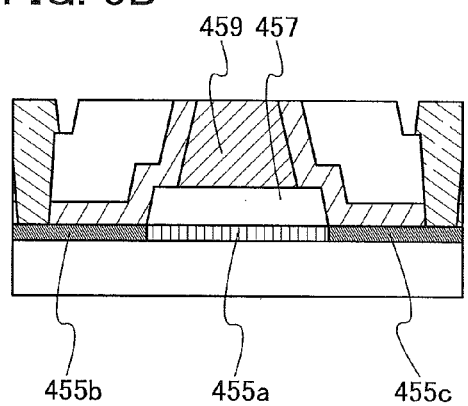

Alternatively, as illustrated in FIG. 5D in a cross-sectional view in the channel length direction, the channel region 455a has a region not overlapping with the conductive film 459. The region functions as an offset region. That is, when seen from the above, the end portions of the low-resistance regions 455b and 455c are aligned or substantially aligned with the end portions of the insulating film 457 and do not overlap with the end portions of the conductive film 459.

Figure 5E:
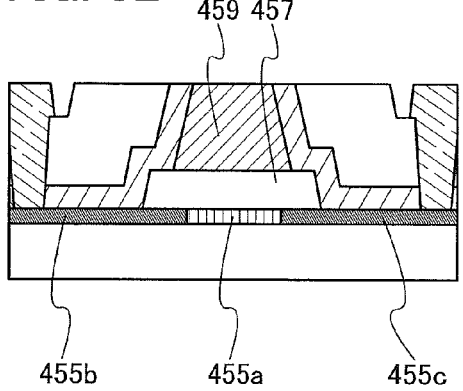

Alternatively, as illustrated in FIG. 5E in a cross-sectional view in the channel length direction, the low-resistance regions 455b and 455c each have a region overlapping with the conductive film 459 with the insulating film 457 provided therebetween. Such a region is referred to as an overlap region. That is, when seen from the above, the end portions of the low-resistance regions 455b and 455c overlap with the conductive film 459.

Figure 5F:
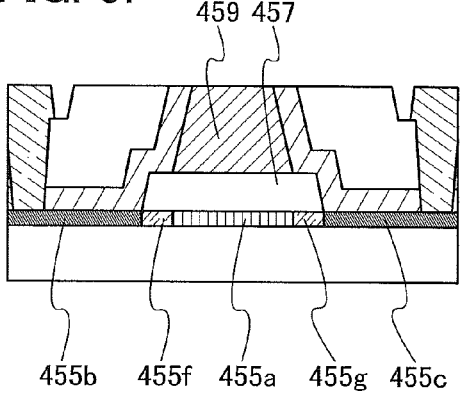

As illustrated in FIG. 5F in a cross-sectional view in the channel length direction, the low-resistance region 455f is provided between the channel region 455a and the low-resistance region 455b, and the low-resistance region 455g is provided between the channel region 455a and the low-resistance region 455c. The low-resistance regions 455f and 455g have lower concentrations of the impurity element and higher resistivity than the low-resistance regions 455b and 455c. Although the low-resistance regions 455f and 455g overlap with the insulating film 457 in this case, they may overlap with the insulating film 457 and the conductive film 459.

Note that in FIGS. 5C to 5F, the transistor illustrated in FIG. 5A is described; however, the transistor illustrated in FIG. 5B can employ any of the structures in FIGS. 5C to 5F as appropriate.

Figure 6A:
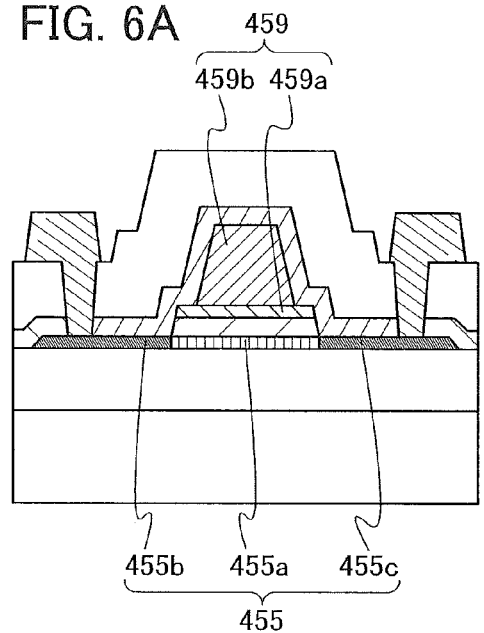
FIGS. 6A to 6E each illustrate a structure of a transistor.

In the transistor illustrated in FIG. 6A, the conductive film 459 has a stacked-layer structure including a conductive film 459a in contact with the insulating film 457 and a conductive film 459b in contact with the conductive film 459a. The end portion of the conductive film 459a is positioned on the outer side than the end portion of the conductive film 459b. That is, the conductive film 459a has a shape such that the end portion extends beyond the end portion of the conductive film 459b.

Next, modification examples of the low-resistance regions 455b and 455c are described. FIGS. 6B to 6E and FIGS. 7A and 7B are each an enlarged view of the vicinity of the oxide semiconductor film 455 illustrated in FIG. 6A.

Figure 6B:
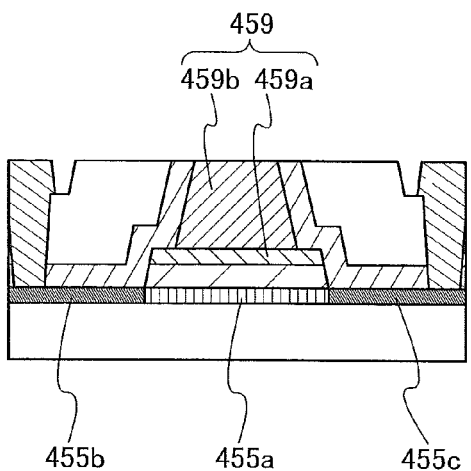

As illustrated in FIG. 6B in a cross-sectional view in the channel length direction, the boundaries between the channel region 455a and the low-resistance regions 455b and 455c are aligned or substantially aligned with the end portions of the conductive film 459a of the conductive film 459 with the insulating film 457 provided therebetween. That is, when seen from the above, the boundaries between the channel region 455a and the low-resistance regions 455b and 455c are aligned or substantially aligned with the end portions of the conductive film 459.

Figure 6C:
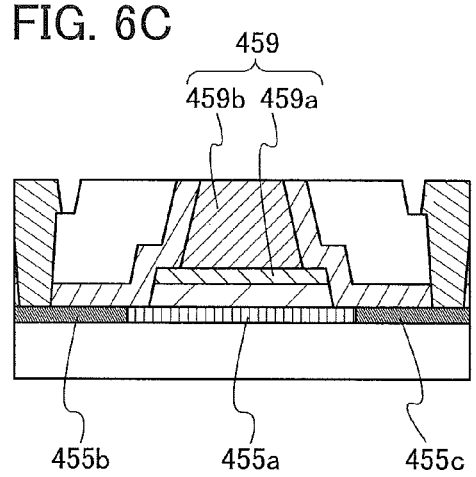

Alternatively, as illustrated in FIG. 6C in a cross-sectional view in the channel length direction, the channel region 455a has a region not overlapping with the conductive film 459. The region functions as an offset region. That is, when seen from the above, the end portions of the low-resistance regions 455b and 455c do not overlap with the end portions of the conductive film 459.

Figure 6D:
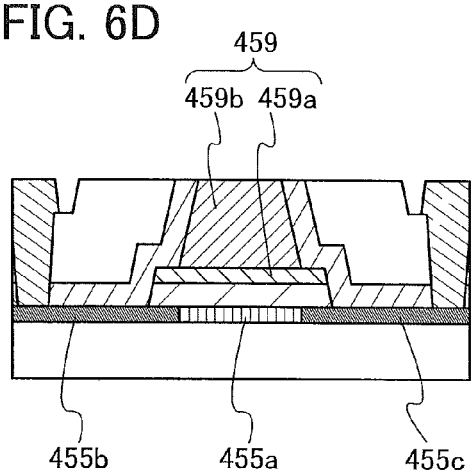

As illustrated in FIG. 6D in a cross-sectional view in the channel length direction, the low-resistance regions 455b and 455c each have a region overlapping with the conductive film 459, specifically the conductive film 459a. Such a region is referred to as an overlap region. That is, when seen from the above, the end portions of the low-resistance regions 455b and 455c overlap with the conductive film 459a.

Figure 6E:
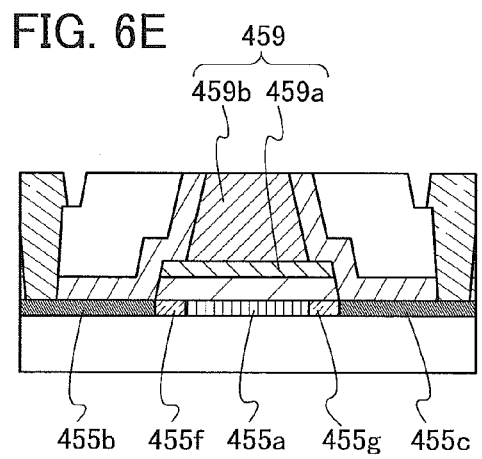

As illustrated in FIG. 6E in a cross-sectional view in the channel length direction, the low-resistance region 455f is provided between the channel region 455a and the low-resistance region 455b, and the low-resistance region 455g is provided between the channel region 455a and the low-resistance region 455c. The impurity element is added to the low-resistance regions 455f and 455g through the conductive film 459a; thus, the low-resistance regions 455f and 455g have lower concentrations of the impurity element and higher resistivity than the low-resistance regions 455b and 455c. Although the low-resistance regions 455f and 455g overlap with the conductive film 459a in this case, they may overlap with the conductive film 459a and the conductive film 459b.

Figure 7A:
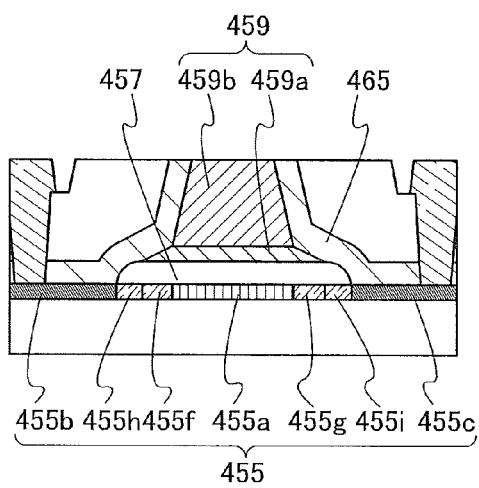
FIGS. 7A and 7B each illustrate a structure of a transistor.

As illustrated in the cross-sectional view in the channel length direction in FIG. 7A, the end portion of the conductive film 459a may be positioned on the outer side than the end portion of the conductive film 459b and the conductive film 459a may have a tapered shape. That is, the angle formed between a surface where the insulating film 457 and the conductive film 459a are in contact with each other and a side surface of the conductive film 459a may be less than 90°, greater than or equal to 5° and less than or equal to 45°, or greater than or equal to 5° and less than or equal to 30°.

Furthermore, the end portion of the insulating film 457 may be positioned on the outer side than the end portion of the conductive film 459a.

Still furthermore, the side surface of the insulating film 457 may be curved.

The insulating film 457 may have a tapered shape. That is, the angle formed between a surface where the oxide semiconductor film 455 and the insulating film 457 are in contact with each other and a side surface of the insulating film 457 may be less than 90°, or preferably greater than or equal to 30° and less than 90°.

The oxide semiconductor film 455 illustrated in FIG. 7A includes the channel region 455a, the low-resistance regions 455f and 455g between which the channel region 455a is interposed, low-resistance regions 455h and 455i between which the channel region 455a and the low-resistance regions 455f and 455g are interposed, and the low-resistance regions 455b and 455c between which the channel region 455a, the low-resistance regions 455f and 455g, and the low-resistance regions 455h and 455i are interposed. The impurity element is added to the low-resistance regions 455f and 455g and the low-resistance regions 455h and 455i through the insulating film 457 and the conductive film 459a; thus, the low-resistance regions 455f and 455g and the low-resistance regions 455h and 455i have lower concentrations of the impurity element and higher resistivity than the low-resistance regions 455b and 455c.

Figure 7B:
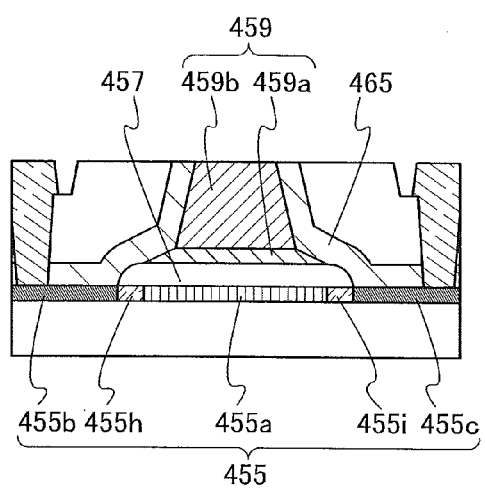

The oxide semiconductor film 455 illustrated in FIG. 7B includes the channel region 455a, the low-resistance regions 455h and 455i between which the channel region 455a is interposed, and the low-resistance regions 455b and 455c between which the channel region 455a, and the low-resistance regions 455h and 455i are interposed. The impurity element is added to the low-resistance regions 455h and 455i through the insulating film 457; thus, the low-resistance regions 455h and 455i have lower concentrations of the impurity element and higher resistivity than the low-resistance regions 455b and 455c.

Note that in the channel length direction of FIG. 7A, the channel region 455a overlaps with the conductive film 459b, the low-resistance regions 455f and 455g overlap with portions of the conductive film 459a extending outside the conductive film 459b, the low-resistance regions 455h and 455i overlap with portions of the insulating film 457 extending outside the conductive film 459a, and the low-resistance regions 455b and 455c are located outside the insulating film 457.

As illustrated in FIG. 7A, the oxide semiconductor film 455 includes the low-resistance regions 455f and 455g and the low-resistance regions 455h and 455i having lower concentrations of impurity elements and higher resistivity than the low-resistance regions 455b and 455c, whereby the electric field of the drain region can be relaxed. Thus, a deterioration of the transistor due to the electric field of the drain region, such as a shift of the threshold voltage of the transistor, can be inhibited.

Figure 29A:
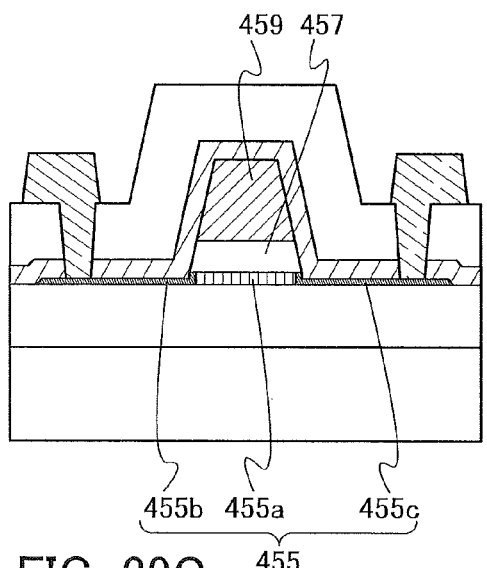
FIGS. 29A to 29D each illustrate a structure of a transistor.

The transistor illustrated in FIG. 29A includes the oxide semiconductor film 455 including the channel region 455a and the low-resistance regions 455b and 455c, and the low-resistance regions 455b and 455c each include a region having a smaller thickness than the channel region 455a. Typically, the low-resistance regions 455b and 455c each include a region having a smaller thickness than the channel region 455a by 0.1 nm or more and 5 nm or less.

Figure 29B:
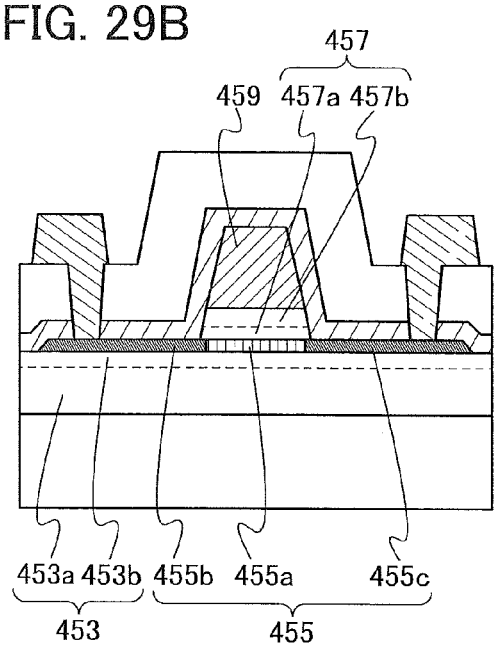

In the transistor illustrated in FIG. 29B, at least one of the insulating film 453 and the insulating film 457 which are in contact with the oxide semiconductor film 455 has a multilayer structure. For example, the insulating film 453 includes an insulating film 453a and an insulating film 453b in contact with the insulating film 453a and the oxide semiconductor film 455. The insulating film 457 includes an insulating film 457a in contact with the oxide semiconductor film 455 and an insulating film 457b in contact with the insulating film 457a.

Note that the insulating film 453b and the insulating film 457a can be formed using an oxide insulating film having a low density of states due to nitrogen oxide between the energy at the valence band maximum ($E_{v\_os}$) and the energy at the conduction band minimum ($E_{c\_os}$) of the oxide semiconductor film. A silicon oxynitride film that releases less nitrogen oxide, an aluminum oxynitride film that releases less nitrogen oxide, or the like can be used as the oxide insulating film in which the density of states due to nitrogen oxide is low between $E_{v\_os}$ and $E_{c\_os}$. Note that the average thickness of each of the insulating films 453b and 457a is greater than or equal to 0.1 nm and less than or equal to 50 nm, or greater than or equal to 0.5 nm and less than or equal to 10 nm.

Note that a silicon oxynitride film that releases less nitrogen oxide is a film whose amount of released ammonia is larger than the amount of released nitrogen oxide in thermal desorption spectroscopy (TDS) analysis; the amount of released ammonia is typically greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of the film becomes a temperature higher than or equal to 50° C. and lower than or equal to 650° C., or preferably higher than or equal to 50° C. and lower than or equal to 550° C.

The insulating film 453a and the insulating film 457b can be formed using an oxide insulating film from which oxygen is released by heating. Note that the average thickness of each of the insulating films 453a and 457b is greater than or equal to 5 nm and less than or equal to 1000 nm, or greater than or equal to 10 nm and less than or equal to 500 nm.

Typical examples of such an oxide insulating film from which oxygen is released by heating include a silicon oxynitride film and an aluminum oxynitride film.

Nitrogen oxide ($NO_x$; x is greater than or equal to 0 and less than or equal to 2, or preferably greater than or equal to 1 and less than or equal to 2), typically $NO_2$ or $NO$ forms levels in the insulating film 453, the insulating film 457, and the like. The level is positioned in the energy gap of the oxide semiconductor film 455. Therefore, when nitrogen oxide is diffused to the interface between the insulating film 453 and the oxide semiconductor film 455, the interface between the insulating film 457 and the oxide semiconductor film 455, and the interface between the insulating film 453 and the insulating film 457, an electron is trapped by the level on the insulating film 453 side and the insulating film 457 side. As a result, the trapped electron remains in the vicinity of the interface between the insulating film 453 and the oxide semiconductor film 455, the interface between the insulating film 457 and the oxide semiconductor film 455, and the interface between the insulating film 453 and the insulating film 457; thus, the threshold voltage of the transistor is shifted in the positive direction.

Nitrogen oxide reacts with ammonia and oxygen in heat treatment. Since nitrogen oxide contained in the insulating film 453a and the insulating film 457b reacts with ammonia contained in the insulating films 453b and 457a in heat treatment, nitrogen oxide contained in the insulating films 453a and 457b is reduced. Therefore, an electron is hardly trapped at the interface between the insulating film 453 and the oxide semiconductor film 455, the interface between the insulating film 457 and the oxide semiconductor film 455, and the interface between the insulating film 453 and the insulating film 457.

By using, for the insulating films 453b and 457a, the oxide insulating film having a low density of states due to nitrogen oxide between $E_{v\_os}$ and $E_{c\_os}$, the shift in the threshold voltage of the transistor can be reduced, which leads to a smaller change in the electrical characteristics of the transistor.

Note that in an ESR spectrum at 100 K or lower of the insulating films 453 and 457, by heat treatment of a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is less than $1\times10^{18}$ spins/cm$^3$, typically greater than or equal to $1\times10^{17}$ spins/cm$^3$ and less than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen dioxide. Accordingly, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen dioxide contained in the oxide insulating film is.

In the oxide insulating film that contains nitrogen and has a small number of defects in heat treatment, typically heat treatment at a temperature higher than or equal to 300° C. and lower than the substrate strain point in the manufacturing process of the transistor, the concentration of nitrogen which is measured by secondary ion mass spectrometry (SIMS) is preferably less than or equal to $6\times10^{20}$ atoms/cm$^3$.

By forming an oxide insulating film containing nitrogen and having a small number of defects by a plasma CVD method using silane and dinitrogen monoxide at a substrate temperature higher than or equal to 220° C., higher than or equal to 280° C., or higher than or equal to 350° C., a dense and hard film can be formed.

Figure 29C:
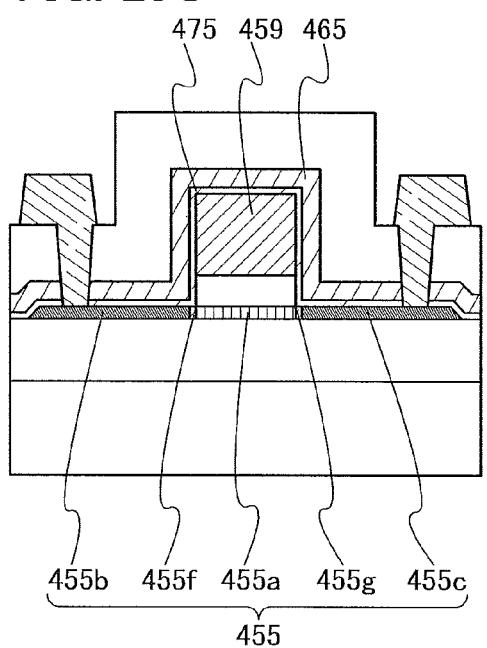

The transistor illustrated in FIG. 29C includes the oxide semiconductor film 455, the insulating film 457, and an insulating film 475 between the conductive film 459 and the nitride insulating film 465. The insulating film 475 can be formed using the oxide insulating film that contains nitrogen, has a small number of defects, and is shown as the insulating films 453b and 457a in FIG. 29B.

In a cross-sectional view in the channel length direction, the low-resistance region 455f is provided between the channel region 455a and the low-resistance region 455b, and the low-resistance region 455g is provided between the channel region 455a and the low-resistance region 455c. The low-resistance regions 455f and 455g have lower concentrations of the impurity element and higher resistivity than the low-resistance regions 455b and 455c. The low-resistance regions 455f and 455g overlap with the insulating film 475 in contact with the side surfaces of the insulating film 457 and the conductive film 459. Note that the low-resistance regions 455f and 455g may overlap with the insulating film 457 and the conductive film 459.

Figure 29D:
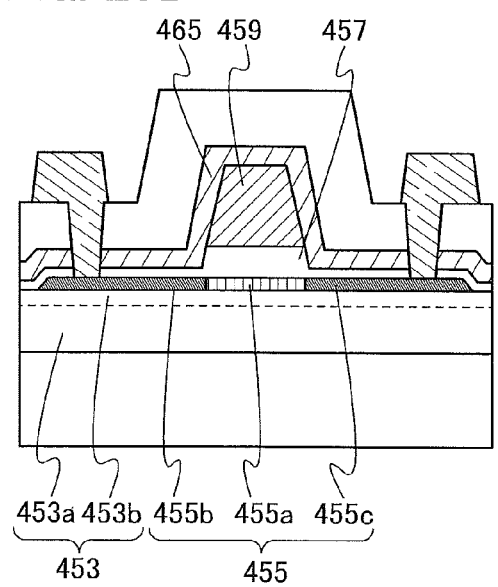

Note that in the transistor illustrated in FIG. 29D, the insulating film 457 is in contact with the channel region 455a of the oxide semiconductor film 455 and is in contact with the low-resistance regions 455b and 455c. Furthermore, in the insulating film 457, thicknesses of regions in contact with the low-resistance regions 455b and 455c are smaller than a thickness of a region in contact with the channel region 455a; the average thickness of the insulating film 457 is typically greater than or equal to 0.1 nm and less than or equal to 50 nm, or greater than or equal to 0.5 nm and less than or equal to 10 nm. As a result, the impurity element can be added to the oxide semiconductor film 455 through the insulating film 457, and in addition, hydrogen contained in the nitride insulating film 465 can be moved to the oxide semiconductor film 455 through the insulating film 457. Thus, the low-resistance regions 455b and 455c can be formed.

Furthermore, the insulating film 453 has a multilayer structure of the insulating films 453a and 453b; for example, the insulating film 453a is formed using an oxide insulating film from which oxygen is released by heating and the insulating film 453b is formed using an oxide insulating film containing nitrogen and having a small number of defects. Furthermore, the insulating film 457 is formed using an oxide insulating film containing nitrogen and having a small number of defects. That is, the oxide semiconductor film 455 can be covered with the oxide insulating film containing nitrogen and having a small number of defects. As a result, the carrier trap at the interfaces between the oxide semiconductor film 455 and the insulating films 453b and 457a can be reduced while oxygen contained in the insulating film 453a is moved to the oxide semiconductor film 455 by heat treatment to reduce oxygen vacancies contained in the channel region 455a of the oxide semiconductor film 455. Thus, a shift in the threshold voltage of the transistor can be reduced, which leads to a smaller change in the electrical characteristics of the transistor.

<(1) Ease of Formation and Stability of $V_oH$>

In the case where an oxide semiconductor film (hereinafter referred to as IGZO) is a complete crystal, H preferentially diffuses along the a-b plane at a room temperature. In heat treatment at 450° C., H diffuses along the a-b plane and in the c-axis direction. Here, description is made on whether H easily enters an oxygen vacancy $V_o$ if the oxygen vacancy $V_o$ exists in IGZO. A state in which H is in an oxygen vacancy $V_o$ is referred to as $V_oH$.

Figure 30:
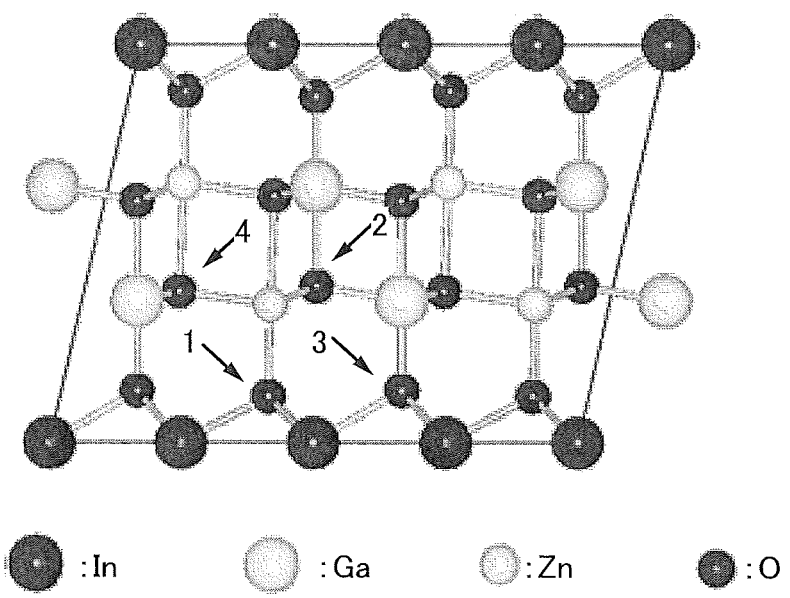
FIG. 30 shows a calculation model.

An $InGaZnO_4$ crystal model shown in FIG. 30 was used for calculation. The activation barrier ($E_a$) along the reaction path where H in $V_oH$ is released from $V_o$ and bonded to oxygen was calculated by a nudged elastic band (NEB) method. The calculation conditions are shown in Table 1.

TABLE 1

| Software | VASP |
|---|---|
| Calculation method | NEB method |
| Functional | GGA-PBE |
| Pseudopotential | PAW |
| Cut-off energy | 500 eV |
| K points | 2 × 2 × 3 |

In the $InGaZnO_4$ crystal model, there are oxygen sites 1 to 4 as shown in FIG. 30 which differ from each other in metal elements bonded to oxygen and the number of bonded metal elements. Here, calculation was made on the oxygen sites 1 and 2 in which an oxygen vacancy $V_o$ is easily formed.

First, calculation was made on the oxygen site in which an oxygen vacancy $V_o$ is easily formed: an oxygen site 1 that was bonded to three In atoms and one Zn atom.

Figure 31A:
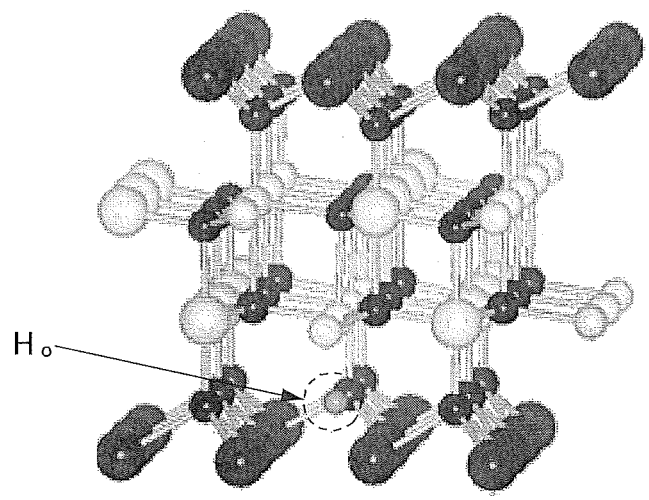
FIGS. 31A and 31B show an initial state and a final state, respectively.
Figure 31B:
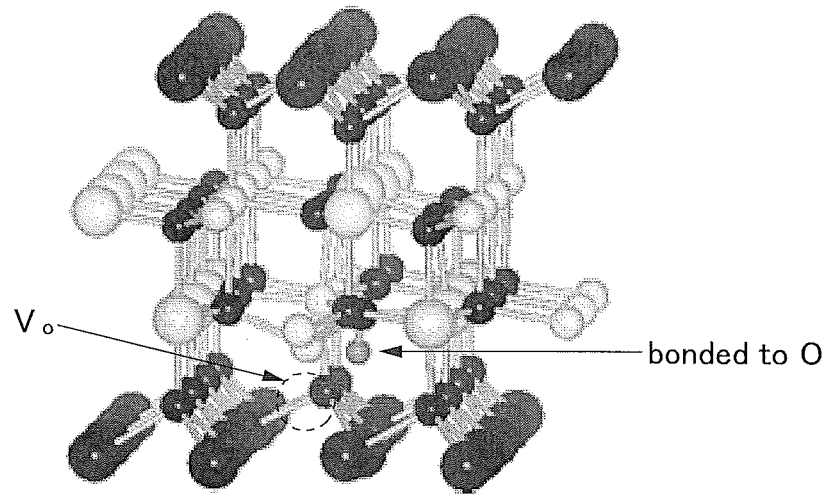
Figure 32:
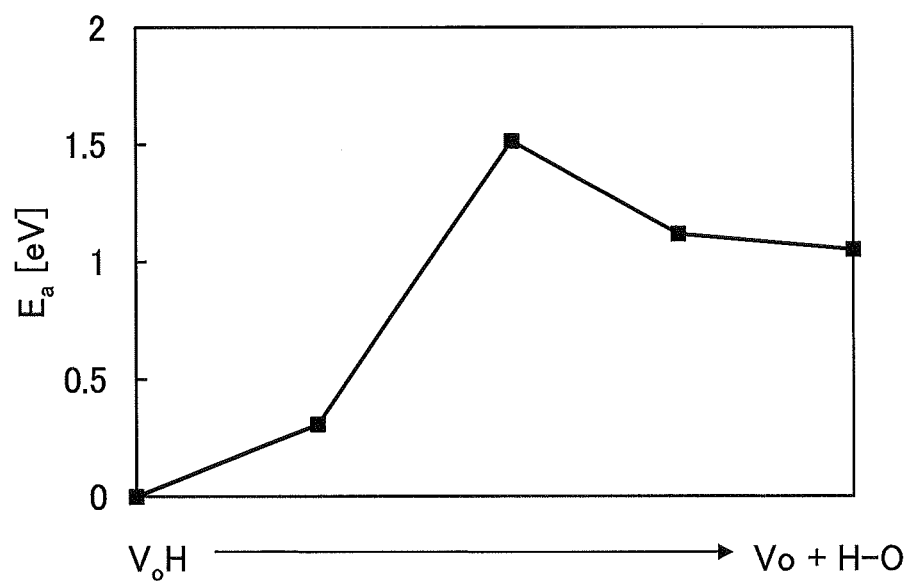
FIG. 32 shows an activation barrier.

FIG. 31A shows a model in the initial state and FIG. 31B shows a model in the final state. FIG. 32 shows the calculated activation barrier ($E_a$) in the initial state and the final state. Note that here, the initial state refers to a state in which H exists in an oxygen vacancy $V_o$ ($V_oH$), and the final state refers to a structure including an oxygen vacancy $V_o$ and a state in which H is bonded to oxygen bonded to one Ga atom and two Zn atoms (H—O).

From the calculation results, bonding of H in an oxygen vacancy $V_o$ to another oxygen atom needs an energy of approximately 1.52 eV, while entry of H bonded to O into an oxygen vacancy $V_o$ needs an energy of approximately 0.46 eV.

Reaction frequency (Γ) was calculated with use of the activation barriers ($E_a$) obtained by the calculation and Formula 1. In Formula 1, $k_B$ represents the Boltzmann constant and T represents the absolute temperature.

$$\Gamma = v\exp\left(-\frac{E_a}{k_BT}\right) \quad \text{[Formula 1]}$$

The reaction frequency at 350° C. was calculated on the assumption that the frequency factor $v=10^{13}$ [1/sec]. The frequency of H transfer from the model shown in FIG. 31A to the model shown in FIG. 31B was $5.52\times10^0$ [1/sec], whereas the frequency of H transfer from the model shown in FIG. 31B to the model shown in FIG. 31A was $1.82\times10^9$ [1/sec]. This suggests that H diffusing in IGZO is likely to form $V_oH$ if an oxygen vacancy $V_o$ exists in the neighborhood, and H is unlikely to be released from the oxygen vacancy $V_o$ once $V_oH$ is formed.

Next, calculation was made on the oxygen site in which an oxygen vacancy $V_o$ is easily formed: an oxygen site 2 that was bonded to one Ga atom and two Zn atoms.

Figure 33A:
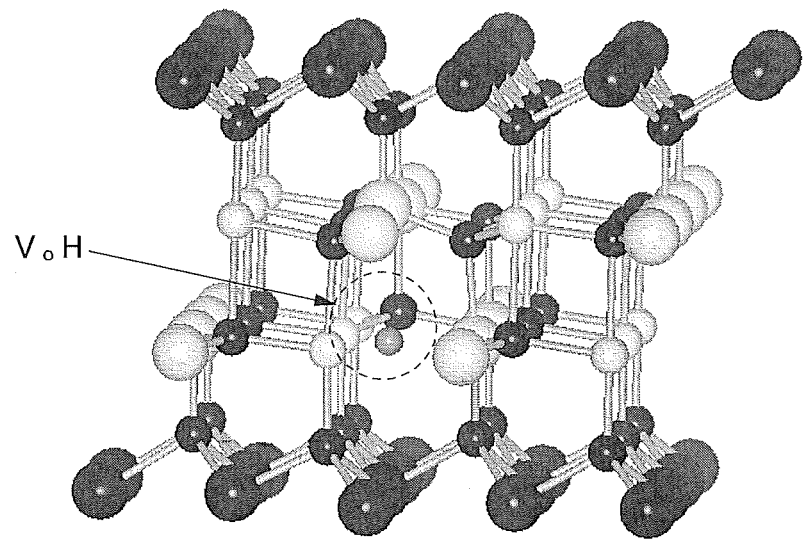
FIGS. 33A and 33B show an initial state and a final state, respectively.
Figure 33B:
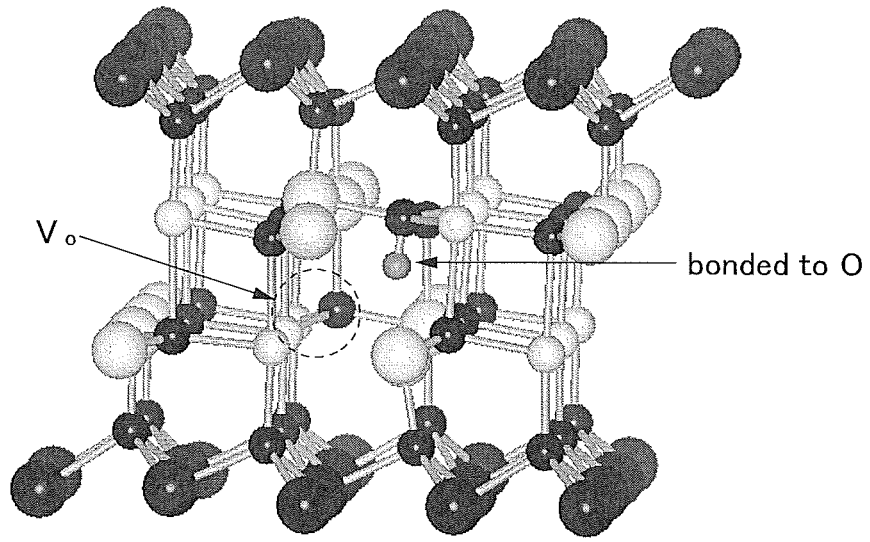
Figure 34:
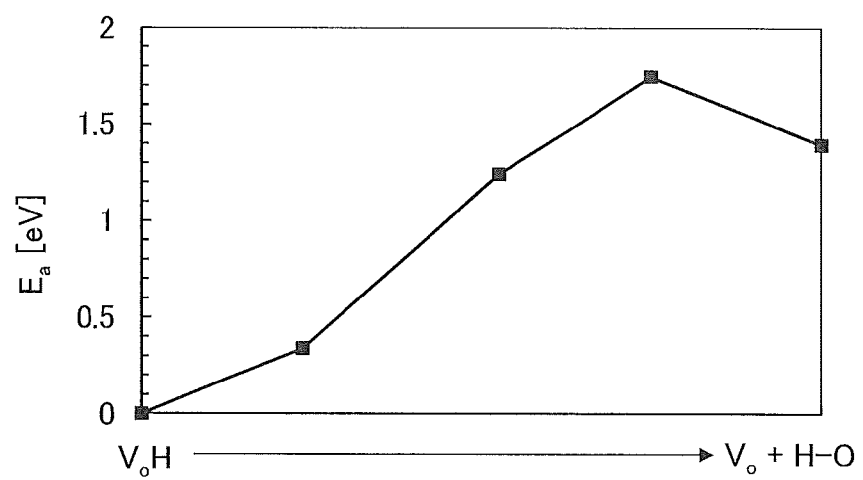
FIG. 34 shows an activation barrier.

FIG. 33A shows a model in the initial state and FIG. 33B shows a model in the final state. FIG. 34 shows the calculated activation barrier ($E_a$) in the initial state and the final state. Note that here, the initial state refers to a state in which H exists in an oxygen vacancy $V_o$ ($V_oH$), and the final state refers to a structure including an oxygen vacancy $V_o$ and a state in which H is bonded to oxygen bonded to one Ga atom and two Zn atoms (H—O).

From the calculation results, bonding of H in an oxygen vacancy $V_o$ to another oxygen atom needs an energy of approximately 1.75 eV, while entry of H bonded to O in an oxygen vacancy $V_o$ needs an energy of approximately 0.35 eV.

Reaction frequency (Γ) was calculated with use of the activation barriers ($E_a$) obtained by the calculation and Formula 1.

The reaction frequency at 350° C. was calculated on the assumption that the frequency factor $v=10^{13}$ [1/sec]. The frequency of H transfer from the model shown in FIG. 33A to the model shown in FIG. 33B was 7.53×10$^{-2}$ [1/sec], whereas the frequency of H transfer from the model shown in FIG. 33B to the model shown in FIG. 33A was 1.44×10$^{10}$ [1/sec]. This suggests that H is unlikely to be released from the oxygen vacancy $V_o$ once $V_oH$ is formed.

From the above results, it was found that H in IGZO easily diffused in annealing and if an oxygen vacancy $V_o$ existed, H was likely to enter the oxygen vacancy $V_o$ to be $V_oH$.

<(2) Transition Level of $V_oH$>

The calculation by the NEB method, which was described in <(1) Ease of formation and stability of $V_oH$>, indicates that in the case where an oxygen vacancy $V_o$ and H exist in IGZO, the oxygen vacancy $V_o$ and H easily form $V_oH$ and $V_oH$ is stable. To determine whether $V_oH$ is related to a carrier trap, the transition level of $V_oH$ was calculated.

The model used for calculation is an InGaZnO$_4$ crystal model (112 atoms). $V_oH$ models of the oxygen sites 1 and 2 shown in FIG. 30 were made to calculate the transition levels. The calculation conditions are shown in Table 2.

TABLE 2

| Software | VASP |
| --- | --- |
| Model | InGaZnO$_4$ crystal model (112 atoms) |
| Functional | HSE06 |
| Mixture ratio of exchange terms | 0.25 |
| Pseudopotential | GGA-PBE |
| Cut-off energy | 800 eV |
| K points | 1 × 1 × 1 |

The mixture ratio of exchange terms was adjusted to have a band gap close to the experimental value. As a result, the band gap of the InGaZnO$_4$ crystal model without defects was 3.08 eV that is close to the experimental value, 3.15 eV.

The transition level (∈(q/q')) of a model having defect D can be calculated by the following Formula 2. Note that ΔE(D$^q$) represents the formation energy of defect D at charge q, which is calculated by Formula 3.

$$\varepsilon(q/q') = \frac{\Delta E(D^q) - \Delta E(D^{q'})}{q' - q} \quad \text{[Formula 2]}$$

$$\Delta E(D^q) = E_{tot}(D^q) - E_{tot}(\text{bulk}) + \sum_i \Delta n_i \mu_i + q(\varepsilon_{VBM} + \Delta V_q + E_F) \quad \text{[Formula 3]}$$

In Formulae 2 and 3, $E_{tot}(D^q)$ represents the total energy of the model having defect D at the charge q, $E_{tot}$(bulk) represents the total energy in a model without defects (complete crystal), Δn$_i$ represents a change in the number of atoms i contributing to defects, μ$_i$ represents the chemical potential of atom i, $\varepsilon_{VBM}$ represents the energy of the valence band maximum in the model without defects, ΔV$_q$ represents the correction term relating to the electrostatic potential, and E$_F$ represents the Fermi energy.

Figure 35:
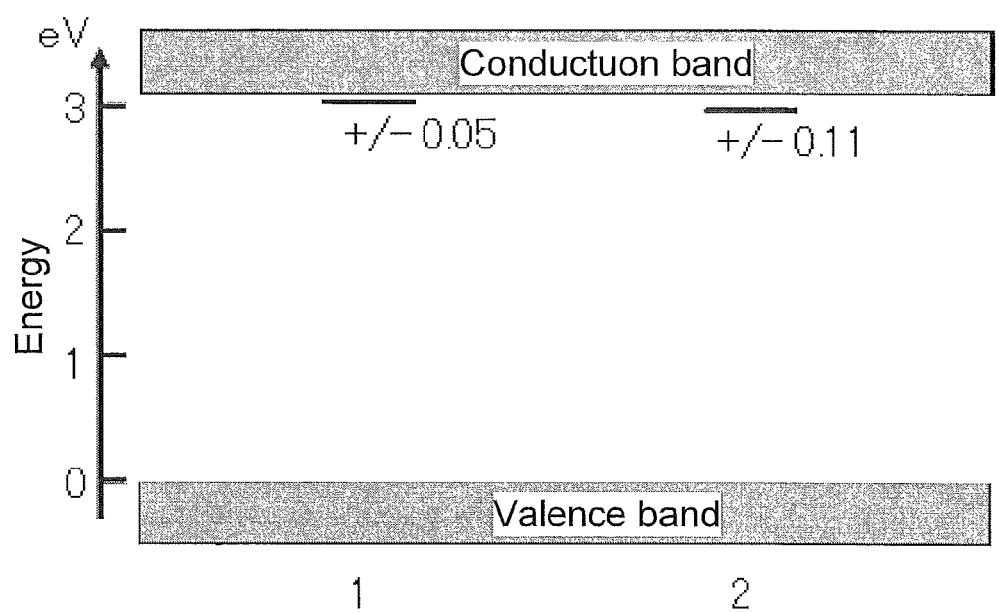
FIG. 35 shows the transition levels of $V_oH$.

FIG. 35 shows the transition levels of $V_oH$ obtained from the above formulae. The numbers in FIG. 35 represent the depth from the conduction band minimum. In FIG. 35, the transition level of $V_oH$ in the oxygen site 1 is at 0.05 eV from the conduction band minimum, and the transition level of $V_oH$ in the oxygen site 2 is at 0.11 eV from the conduction band minimum. Therefore, these $V_oH$ would be related to electron traps, that is, $V_oH$ was found to behave as a donor. It was also found that IGZO including $V_oH$ had conductivity.

<Band Structure>

A band structure of the above-described transistor in an arbitrary cross section will be described below.

Figure 18A:
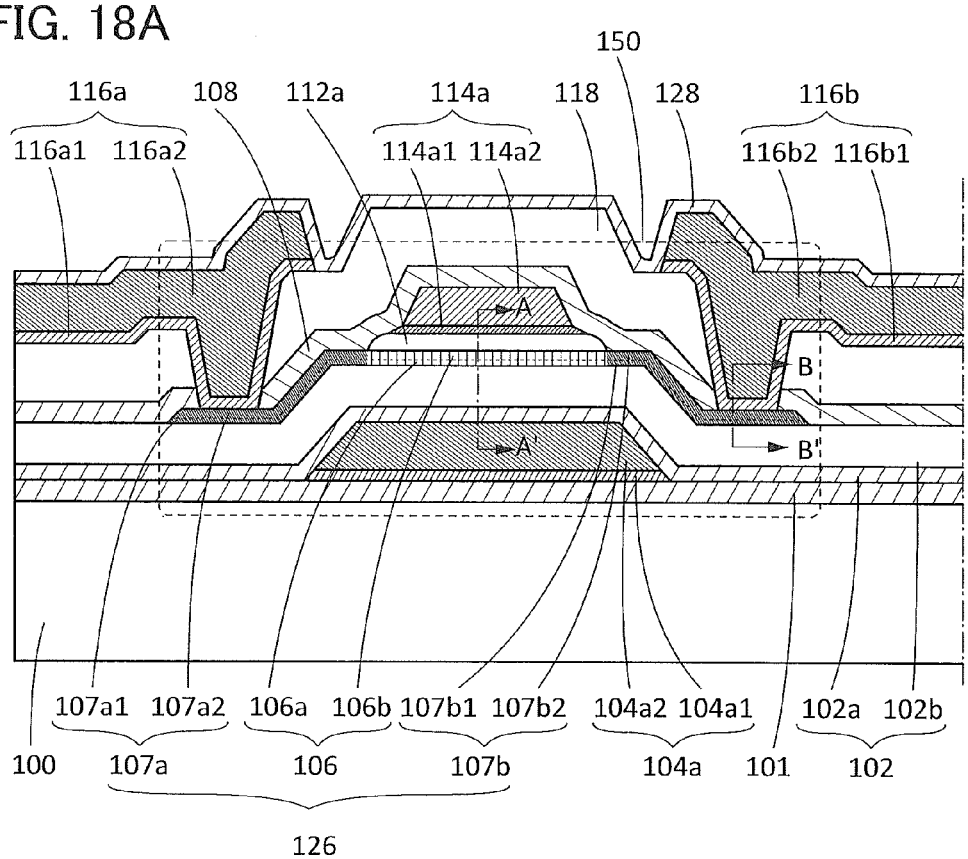
FIGS. 18A to 18C are a cross-sectional view and band structures of a transistor which is a semiconductor device of one embodiment of the present invention.

FIG. 18A is a cross-sectional view of a transistor which is a semiconductor device of one embodiment of the present invention.

The transistor illustrated in FIG. 18A has a structure similar to the structure of the transistor 150 in FIG. 1.

Figure 18B:
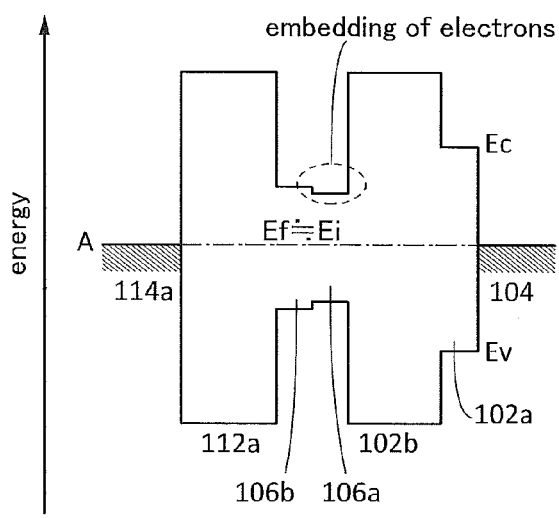

FIG. 18B shows the band structure of a cross section including a channel formation region of the transistor in FIG. 18A, which is taken along the line A-A'. Note that the energy gap of the oxide semiconductor including the channel formation region 106a is slightly larger than that of the oxide semiconductor including the channel formation region 106b. The energy gaps of the insulating film 102a, the insulating film 102b, and the gate insulating film 112a are set to be sufficiently larger than those of the oxide semiconductor including the channel formation region 106a and the oxide semiconductor including the channel formation region 106b. The Fermi levels (expressed as Ef) of the oxide semiconductor including the channel formation region 106a, the oxide semiconductor including the channel formation region 106b, the insulating film 102a, the insulating film 102b, and the gate insulating film 112a are each positioned at an intrinsic Fermi level (expressed as Ei). The work functions of the gate electrode 104a and the gate electrode 114a are positioned at the same levels as their respective Fermi levels.

When a gate voltage higher than or equal to the threshold voltage of the transistor is applied, electrons flow preferentially through the oxide semiconductor including the channel formation region 106a by an energy difference between the conduction band minimum of the oxide semiconductor including the channel formation region 106a and the conduction band minimum of the oxide semiconductor including the channel formation region 106b. That is, it is possible to predict that electrons are embedded in the oxide semiconductor including the channel formation region 106a. Note that the energy at the conduction band minimum is expressed as Ec, and the energy at the valence band maximum is expressed as Ev.

Accordingly, in the transistor which is a semiconductor device of one embodiment of the present invention, the embedment of an electron reduces the influence of interface scattering. Therefore, the channel resistance of the transistor which is a semiconductor device of one embodiment of the present invention is low.

Figure 18C:
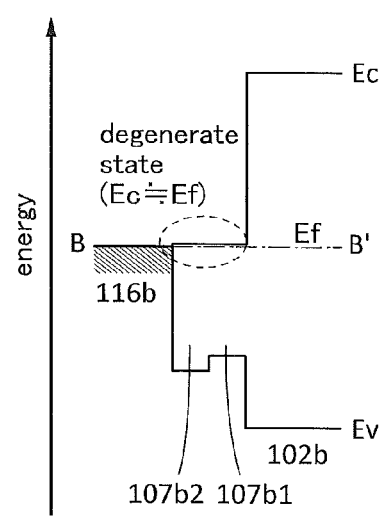

Next, FIG. 18C shows a band structure in the B-B' cross section including the source region or the drain region of the transistor. Note that the low-resistance regions 107a1, 107b1, 107a2, and 107b2 are assumed to be in a degenerate state. Furthermore, the Fermi level of the oxide semiconductor including the channel formation region 106a is assumed to be approximately the same as the energy of the conduction band minimum in the low-resistance region 107b1. Furthermore, the Fermi level of the oxide semiconductor including the channel formation region 106b is assumed to be approximately the same as the energy of the conduction band minimum in the low-resistance region 107b2. The same applies to the low-resistance region 107a1 and the low-resistance region 107a2.

At this time, an ohmic contact is made between the drain electrode 116b and the low-resistance region 107b2 because an energy barrier therebetween is sufficiently low. Furthermore, an ohmic contact is made between the low-resistance region 107b2 and the low-resistance region 107b1. Similarly, an ohmic contact is made between the source electrode 116a and the low-resistance region 107a2 because an energy barrier therebetween is sufficiently low. Moreover, an ohmic contact is made between the low-resistance region 107a2 and the low-resistance region 107a1. Therefore, electrons are transported smoothly between the source electrode 116a and the oxide semiconductor including the channel formation region 106a and the oxide semiconductor including the channel formation region 106b, and between the drain electrode 116b and the oxide semiconductor including the channel formation region 106a and the oxide semiconductor including the channel formation region 106b.

As described above, the transistor which is a semiconductor device of one embodiment of the present invention is a transistor in which the channel resistance is low and electron transfer between the channel formation region and the source and the drain electrodes is performed smoothly. That is, the transistor has excellent switching characteristics.

Figure 42A:
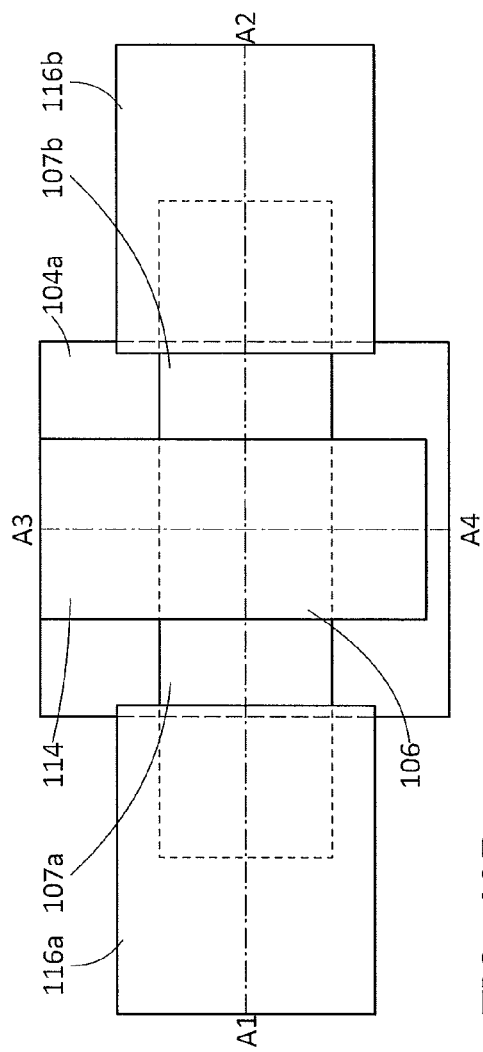
FIGS. 42A to 42C are a top view and cross-sectional views illustrating one embodiment of a semiconductor device.
Figure 42C:
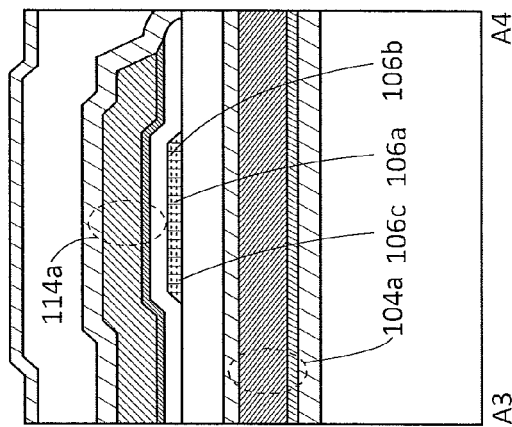
Figure 42B:
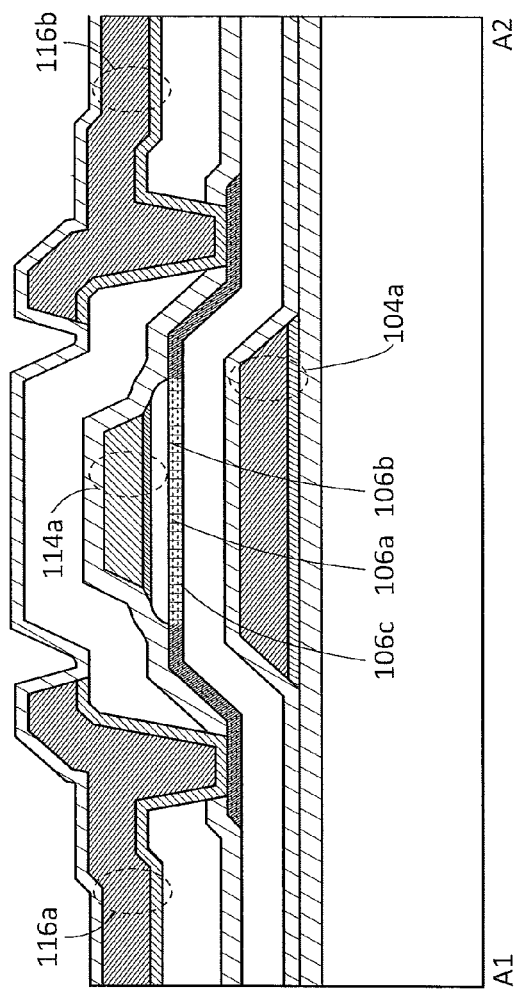
Figure 43A:
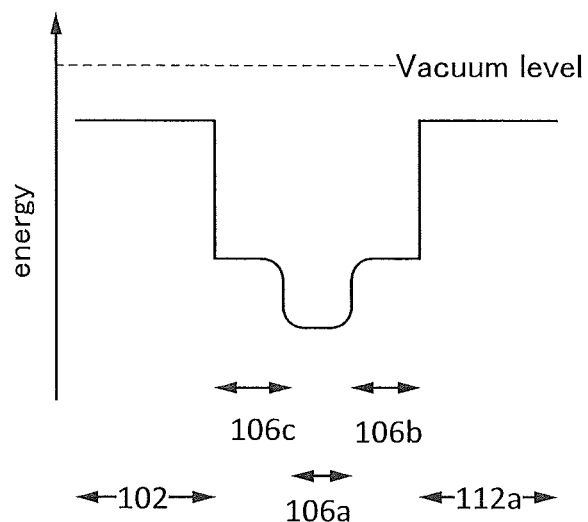
FIGS. 43A and 43B each show one embodiment of a band structure.

Furthermore, the band structure of a transistor including an oxide semiconductor film having a three-layer structure as in a transistor illustrated in FIGS. 42A to 42C and the band structure of a transistor including an oxide semiconductor film having a two-layer structure as in the transistor in FIG. 1 will be described. FIG. 43A shows the band structure of the transistor in FIGS. 42A to 42C and FIG. 43B shows the band structure of the transistor 150 in FIG. 1, and for easy understanding, the energies (Ec) at the conduction band minimums of the insulating film 102, the first region 106, and the gate insulating film 112a are shown.

As shown in FIG. 43A, the energies at the conduction band minimums of the channel formation region 106a, the channel formation region 106b, and the channel formation region 106c are changed continuously. This can be understood also from the fact that the constituent elements are common among the channel formation region 106a, the channel formation region 106b, and the channel formation region 106c and oxygen is easily diffused among the channel formation region 106a, the channel formation region 106b, and the channel formation region 106c. Thus, the channel formation region 106a, the channel formation region 106b, and the channel formation region 106c have a continuous physical property although they are a stack of films having different compositions.

The oxide semiconductor films that are stacked and contain the same main components have not only a simple stacked-layer structure of the layers but also a continuous energy band (here, in particular, a well structure having a U shape in which energies at the conduction band minimums are changed continuously between layers (U-shaped well)). That is, the stacked-layer structure is formed so that a defect state which serves as a trap center or a recombination center in an oxide semiconductor, or an impurity which inhibits the flow of carriers does not exist at interfaces between the layers. If impurities are mixed between the oxide semiconductor films stacked, the continuity of the energy band is lost and carriers disappear by a trap or recombination.

Note that FIG. 43A illustrates the case where the Ec of the channel formation region 106b and the Ec of the channel formation region 106c are equal to each other; however, they may be different from each other.

As illustrated in FIG. 43A, the channel formation region 106a serves as a well and a channel of the transistor is formed in the channel formation region 106a. Note that since the energies at the conduction band minimums are changed continuously in the channel formation region 106a, the channel formation region 106b, and the channel formation region 106c, a channel in the well structure having a U shape can also be referred to as a buried channel.

Figure 43B:
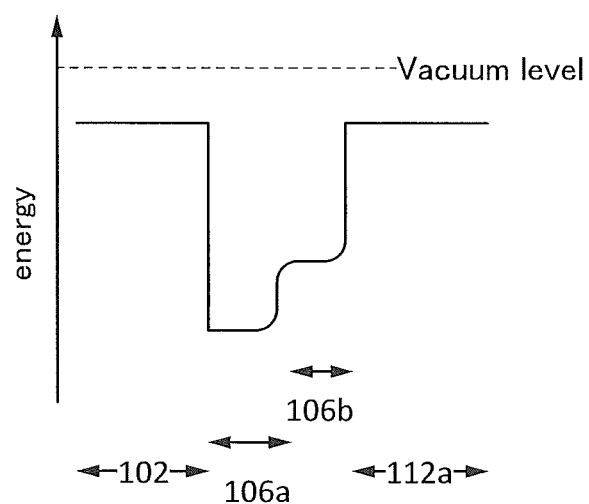

As shown in FIG. 43B, the energies at the conduction band minimums may be changed continuously in the channel formation region 106a and the channel formation region 106b.

As shown in FIG. 43B, the channel formation region 106a serves as a well and a channel of the transistor is formed in the channel formation region 106a.

The transistor in FIGS. 42A to 42C includes the channel formation region 106b and the channel formation region 106c containing one or more metal elements forming the channel formation region 106a; therefore, interface states are not easily formed at the interface between the channel formation region 106a and the channel formation region 106c and the interface between the channel formation region 106a and the channel formation region 106b. Thus, with the channel formation region 106b and the channel formation region 106c, variation or change in the electrical characteristics of the transistor, such as a threshold voltage, can be reduced.

The transistor in FIG. 1 includes the channel formation region 106b containing one or more metal elements forming the channel formation region 106a; therefore, an interface state is not easily formed at the interface between the channel formation region 106a and the channel formation region 106b. Thus, with the channel formation region 106b, variation or change in the electrical characteristics of the transistor, such as a threshold voltage, can be reduced.

<Method for Manufacturing Semiconductor Device>

Next, a method for manufacturing the transistor 150 and the capacitor 160 in FIG. 1 will be described with reference to FIG. 8, FIG. 9, FIG. 10, FIG. 11, FIG. 12, FIG. 13, FIG. 14, FIG. 15, FIG. 16, and FIG. 17.

The films included in the transistor 150 and the capacitor 160 (i.e., the insulating film, the oxide semiconductor film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, the ALD method makes it possible to accurately adjust a thickness and thus is suitable for manufacturing a minute transistor.

Figure 8:
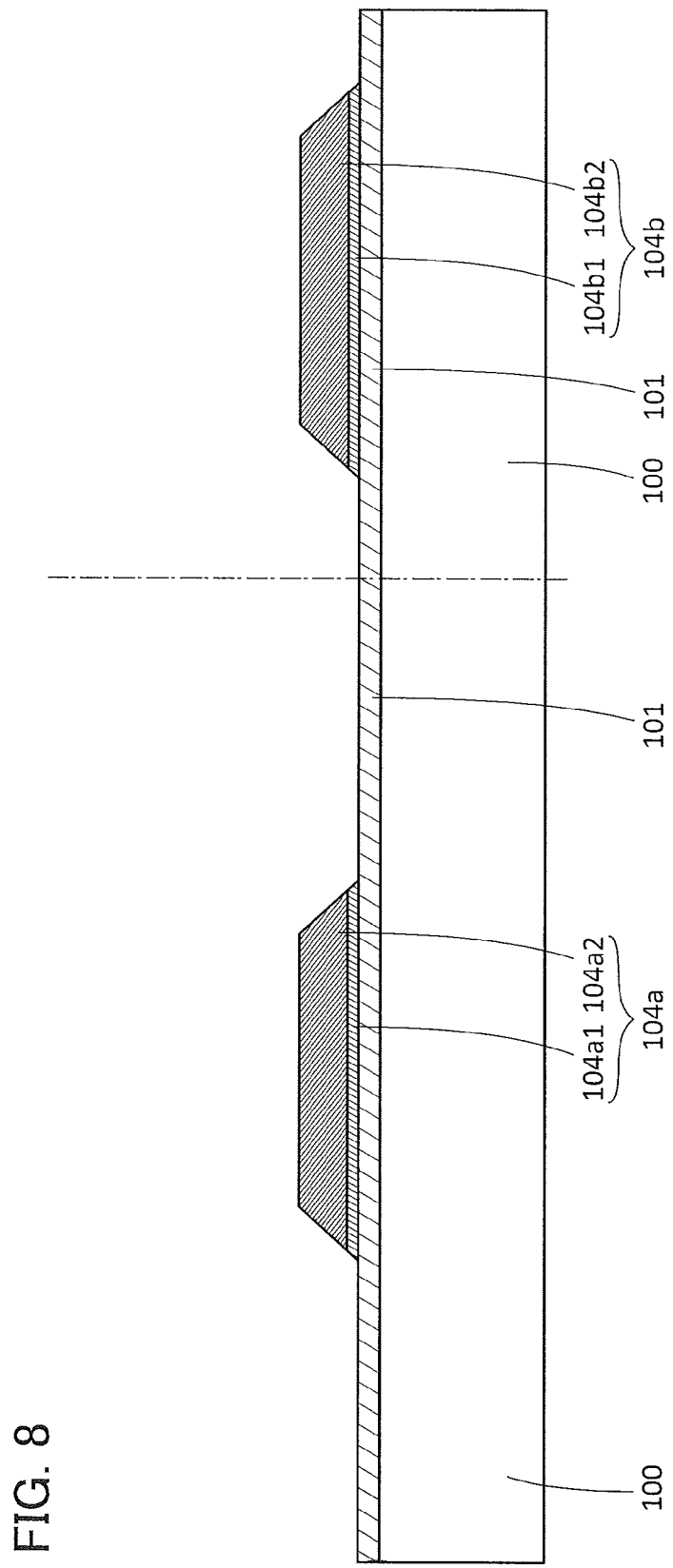
FIG. 8 is a cross-sectional view illustrating an example of a manufacturing process of a semiconductor device.

First, the insulating film 101 is formed over the substrate 100, and the gate electrode 104a and the lower electrode 104b are formed over the insulating film 101 (see FIG. 8).

The gate electrode 104a and the lower electrode 104b can be formed by a sputtering method, a vacuum evaporation method, a pulsed laser deposition (PLD) method, a thermal CVD method, or the like. Note that the gate electrode 104a and the lower electrode 104b may be formed by an electrolytic plating method, a printing method, an inkjet method, or the like instead of the above formation method.

Figure 9:
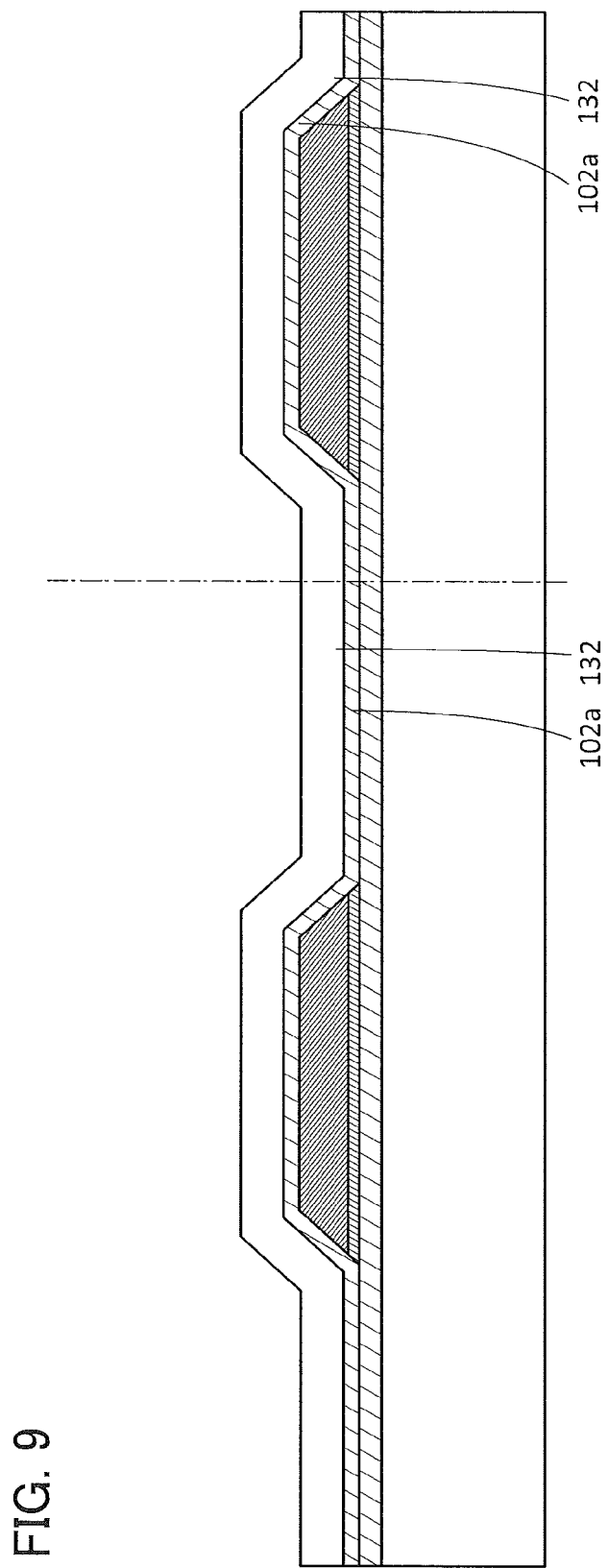
FIG. 9 is a cross-sectional view illustrating an example of a manufacturing process of a semiconductor device.
Figure 10:
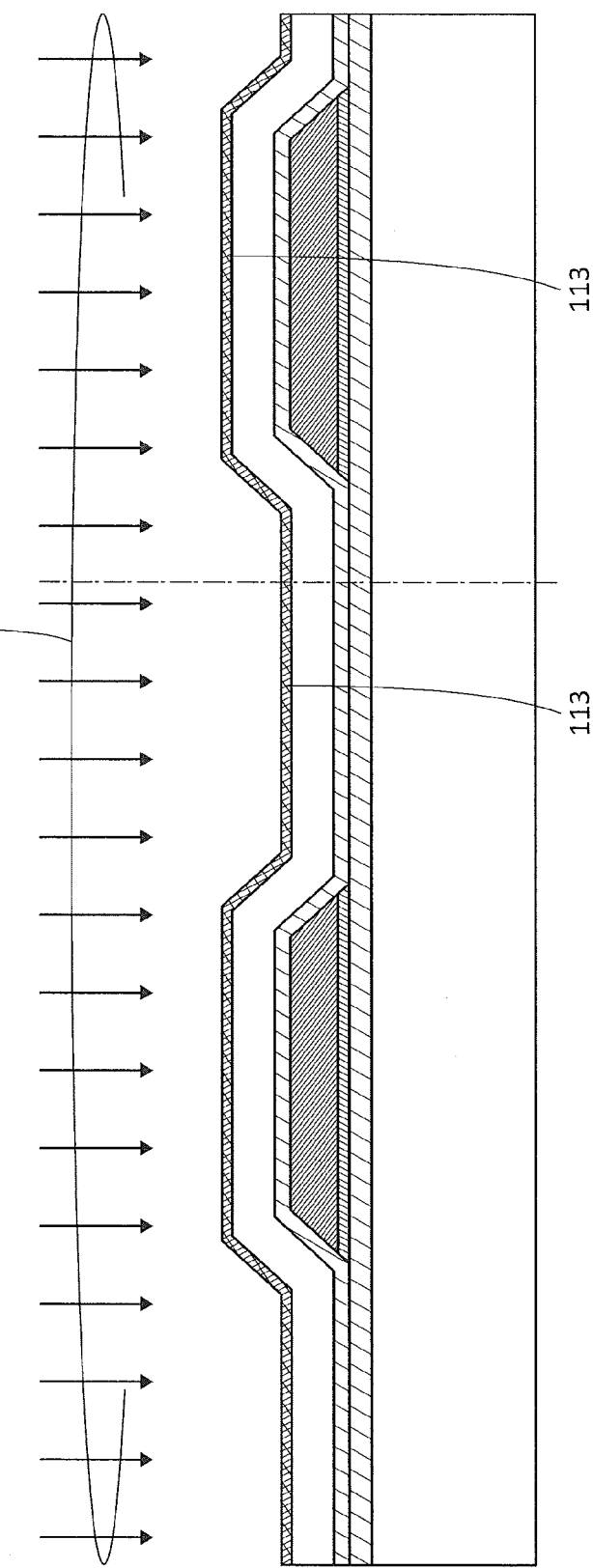
FIG. 10 is a cross-sectional view illustrating an example of a manufacturing process of a semiconductor device.

Next, a stack of the insulating film 102a and an insulating film 132 is formed over the insulating film 101, the gate electrode 104a, and the lower electrode 104b (see FIG. 9).

The insulating film 102a and the insulating film 132 can be formed by a sputtering method, a CVD method, an evaporation method, a pulsed laser deposition (PLD) method, a printing method, a coating method, or the like, as appropriate. For a material and the like of the insulating film 132, the material and the like that can be used for the insulating film 102b can be referred to.

Next, a film 113 which suppresses release of oxygen (hereinafter referred to as a release prevention film 113) is formed over the insulating film 132. Then, oxygen 140 is added to the insulating film 132 through the release prevention film 113 (see FIG. 10).

The release prevention film 113 is formed using any of the following conductive materials: a metal element selected from aluminum, chromium, tantalum, titanium, molybdenum, nickel, iron, cobalt, and tungsten; an alloy containing the above-described metal element as a component; an alloy containing any of the above-described metal elements in combination; a metal nitride containing the above-described metal element; a metal oxide containing the above-described metal element; a metal nitride oxide containing the above-described metal element; and the like.

The thickness of the release prevention film 113 can be set to be greater than or equal to 0.1 nm and less than or equal to 10 nm.

As a method for adding the oxygen 140 to the insulating film 132 through the release prevention film 113, an ion doping method, an ion implantation method, plasma treatment, and the like can be given. By adding oxygen to the insulating film 132 with the release prevention film 113 provided over the insulating film 132, the release prevention film 113 functions as a protective film which suppresses release of oxygen from the insulating film 132. Thus, a larger amount of oxygen can be added to the insulating film 132.

In the case where oxygen is added by plasma treatment, by making oxygen excited by a microwave to generate high density oxygen plasma, the amount of oxygen added to the insulating film 132 can be increased.

Figure 11:
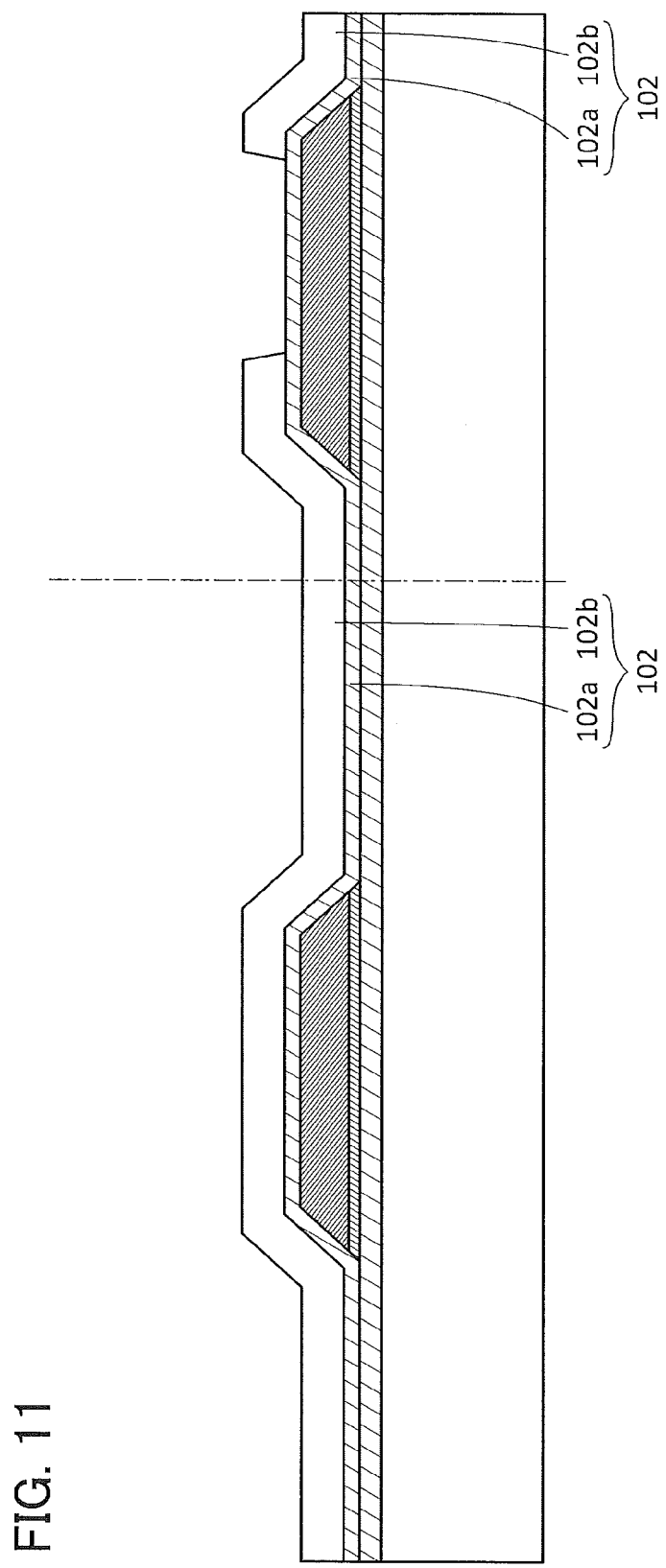
FIG. 11 is a cross-sectional view illustrating an example of a manufacturing process of a semiconductor device.

Next, the release prevention film 113 is removed; consequently, the insulating film 132 to which oxygen is added can be formed (see FIG. 11).

The insulating film 132 can be formed by a sputtering method, a CVD method, an evaporation method, a pulsed laser deposition (PLD) method, a printing method, a coating method, or the like, as appropriate. After the insulating film 132 is formed, oxygen may be added to the insulating film 132. Examples of the oxygen that is added to the insulating film include an oxygen radical, an oxygen atom, an oxygen atomic ion, an oxygen molecular ion, and the like. As a method for adding the oxygen, an ion doping method, an ion implantation method, plasma treatment, and the like can be given.

As the insulating film 132, a silicon oxide film or a silicon oxynitride film from which oxygen can be released by heat treatment can be formed under the following conditions: the substrate placed in a treatment chamber of the plasma CVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

Next, a mask is formed over the insulating film 132 by a photolithography process. After that, the insulating film 132 overlapping with the lower electrode 104b is partly etched using the mask, whereby the insulating film 102b is formed.

Figure 12:
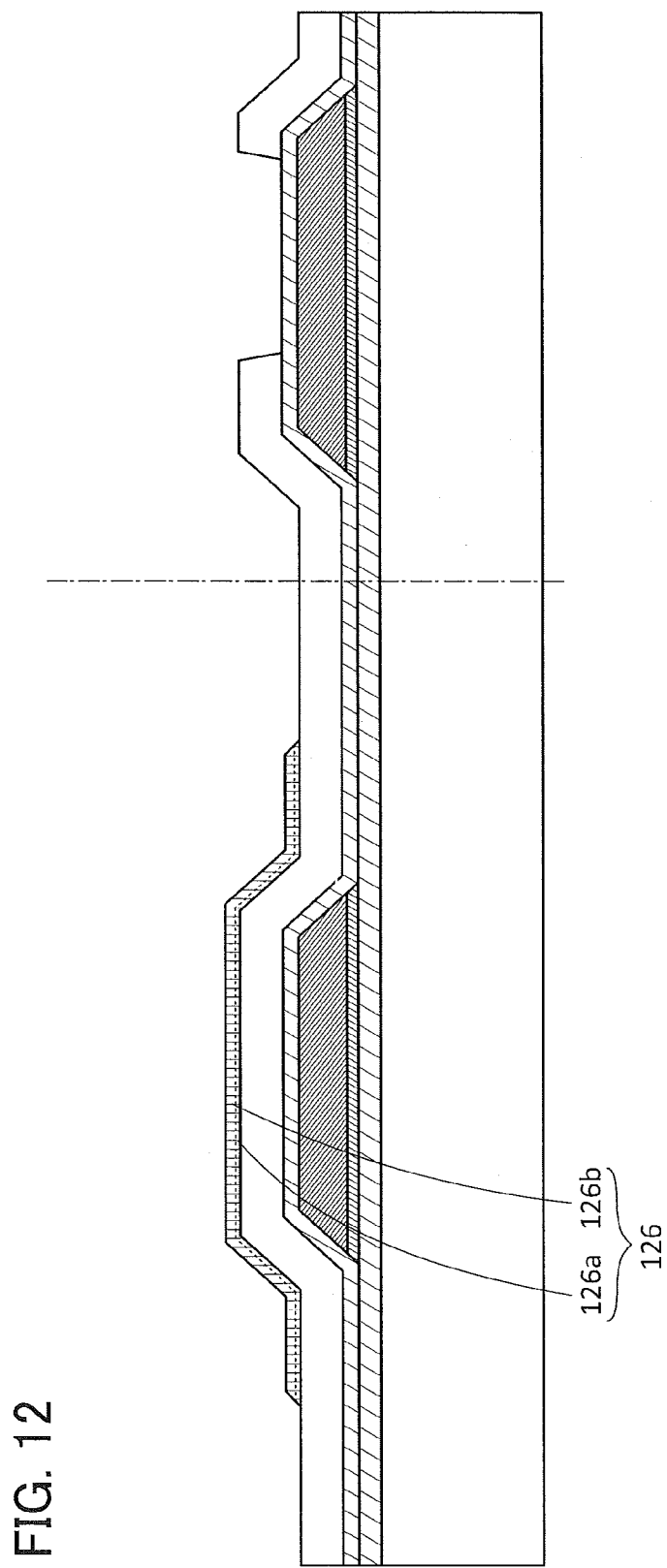
FIG. 12 is a cross-sectional view illustrating an example of a manufacturing process of a semiconductor device.

Next, the oxide semiconductor film 126 including the stack of the oxide semiconductor film 126a and the oxide semiconductor film 126b is formed over the insulating film 102b (see FIG. 12).

A method for forming the oxide semiconductor film 126 is described below. An oxide semiconductor film to be the oxide semiconductor film 126a and the oxide semiconductor film 126b is formed over the insulating film 102b by a sputtering method, a coating method, a pulsed laser deposition method, a laser ablation method, a thermal CVD method, or the like. Then, after a mask is formed over the oxide semiconductor film by a lithography process, the oxide semiconductor film is partly etched using the mask. Thus, the oxide semiconductor film 126 can be formed as illustrated in FIG. 12. After that, the mask is removed. Note that heat treatment may be performed after the oxide semiconductor film 126 is formed by partly etching the oxide semiconductor film.

Alternatively, by using a printing method for forming the oxide semiconductor film 126, the oxide semiconductor film 126 subjected to element isolation can be formed directly.

As a power supply device for generating plasma in the case of forming the oxide semiconductor film by a sputtering method, an RF power supply device, an AC power supply device, a DC power supply device, or the like can be used as appropriate. Note that a CAAC-OS film can be formed using an AC power supply device or a DC power supply device. In forming the oxide semiconductor film, a sputtering method using an AC power supply device or a DC power supply device is preferable to a sputtering method using an RF power supply device because the oxide semiconductor film can be uniform in film thickness, film composition, or crystallinity.

As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

Furthermore, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., higher than or equal to 150° C. and lower than or equal to 450° C., or higher than or equal to 200° C. and lower than or equal to 350° C., a CAAC-OS film can be formed. In the case where the substrate temperature is higher than or equal to 25° C. and lower than 150° C., a microcrystalline oxide semiconductor film can be formed.

For the deposition of the CAAC-OS film to be described later, the following conditions are preferably used.

By suppressing entry of impurities during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower or −100° C. or lower is used.

Furthermore, it is preferable that the proportion of oxygen in the deposition gas be increased and the power be optimized in order to reduce plasma damage at the deposition. The proportion of oxygen in the deposition gas is 30 vol. % or higher, or 100 vol. %.

Furthermore, after the oxide semiconductor film is formed, heat treatment may be performed so that the oxide semiconductor film is subjected to dehydrogenation or dehydration. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the above inert gas atmosphere and the above oxygen atmosphere do not contain hydrogen, water, and the like. The treatment time is from 3 minutes to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By forming the oxide semiconductor film while it is heated or performing heat treatment after the formation of the oxide semiconductor film, the concentration of hydrogen in the oxide semiconductor film which is measured by secondary ion mass spectrometry (SIMS) can be set to be less than or equal to $5\times10^{19}$ atoms/cm$^3$, less than or equal to $1\times10^{19}$ atoms/cm$^3$, less than or equal to $5\times10^{18}$ atoms/cm$^3$, less than or equal to $1\times10^{18}$ atoms/cm$^3$, less than or equal to $5\times10^{17}$ atoms/cm$^3$, or less than or equal to $1\times10^{16}$ atoms/cm$^3$.

For example, in the case where an oxide semiconductor film, for example, an InGaZnO$_x$ (X>0) film is formed using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaZnO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

Here, an oxide semiconductor film having a thickness of 35 nm is formed by a sputtering method, and then, heat treatment is performed so that oxygen contained in the insulating film 102b is moved to the oxide semiconductor film. Next, a mask is formed over the oxide semiconductor film, and part of the oxide semiconductor film is selectively etched. In this manner, the oxide semiconductor film 126 is formed.

Note that it is possible to obtain an oxide semiconductor film having low contents of hydrogen, water, and the like by performing the heat treatment at a temperature higher than 350° C. and lower than or equal to 650° C. or higher than or equal to 450° C. and lower than or equal to 600° C. That is, an oxide semiconductor film with a low impurity concentration and a low density of defect states can be formed.

Figure 13:
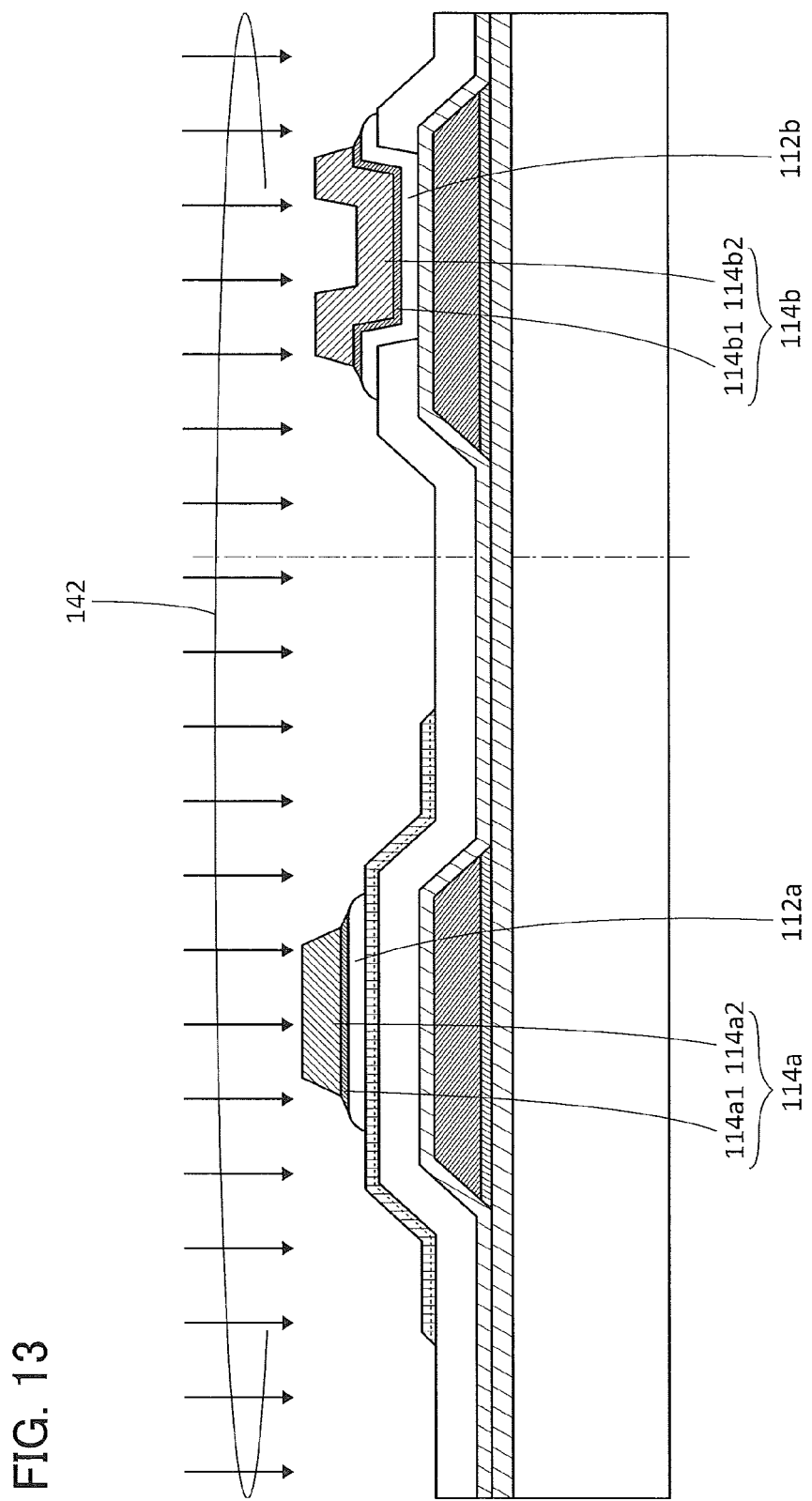
FIG. 13 is a cross-sectional view illustrating an example of a manufacturing process of a semiconductor device.
Figure 14:
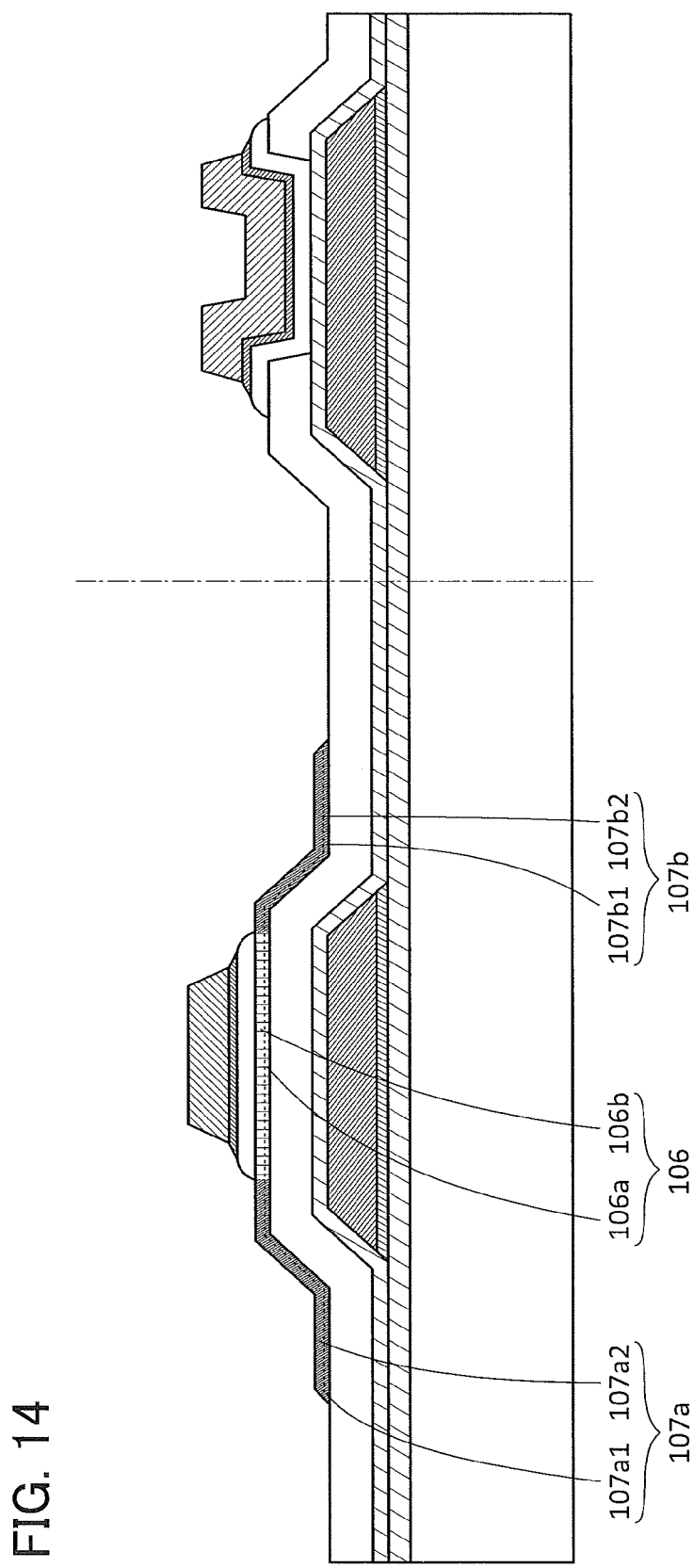
FIG. 14 is a cross-sectional view illustrating an example of a manufacturing process of a semiconductor device.

Next, an insulating film and a two-layer conductive film are formed over the oxide semiconductor film 126 and the insulating film 102a, a mask is formed over the two-layer conductive film by a lithography process, and then the two-layer conductive film and the insulating film are partly etched using the mask, whereby the gate electrode 114a, the upper electrode 114b, the gate insulating film 112a, and the insulating film 112b are formed (see FIG. 13).

The insulating film to be the gate insulating film 112a and the insulating film 112b is formed by a sputtering method, a CVD method, a vacuum evaporation method, a pulsed laser deposition (PLD) method, a thermal CVD method, or the like. The two-layer conductive film to be the gate electrode 114a and the upper electrode 114b can be formed by a sputtering method, a vacuum evaporation method, a pulsed laser deposition (PLD) method, a thermal CVD method, or the like. Note that the two-layer conductive film may be formed by an electrolytic plating method, a printing method, an inkjet method, or the like instead of the above formation method.

Alternatively, a tungsten film can be formed for the two-layer conductive film with a deposition apparatus employing ALD. In that case, a WF$_6$ gas and a B$_2$H$_6$ gas are sequentially introduced more than once to form an initial tungsten film, and then a WF$_6$ gas and an H$_2$ gas are introduced at a time, so that a tungsten film is formed. Note that an SiH$_4$ gas may be used instead of a B$_2$H$_6$ gas.

Although not illustrated, the gate electrode 104a and the gate, electrode 114a may be electrically connected to each other in such a manner that the insulating film to be the gate insulating film 112a and the insulating film 112b is formed, openings are formed in the insulating film and the insulating film 102, and the two-layer conductive film to be the gate electrode 114a and the upper electrode 114b is formed and etched through the openings.

Next, as illustrated in FIG. 13, an impurity element 142 is added to the oxide semiconductor film 126 using the gate electrode 114a as a mask. As a result, the impurity element is added to a region that is not covered with the gate electrode 114a in the oxide semiconductor film. Defects, typically oxygen vacancies are formed in the oxide semiconductor film which is damaged by addition of the impurity element 142, and, when hydrogen is added to the oxide semiconductor where oxygen vacancies are formed, hydrogen enters an oxygen vacant site and forms a donor level in the vicinity of the conduction band. Accordingly, the first region 106 and the pair of second regions 107a and 107b between which the first region 106 is interposed are formed (see FIG. 14). Note that the impurity element is not added to the first region 106 and thus can have a highly purified intrinsic property.

As a method for adding the impurity element 142, an ion doping method, an ion implantation method, plasma treatment, and the like can be given.

The addition of the impurity element 142 is controlled by appropriately setting the implantation conditions such as the acceleration voltage and the dose. For example, in the case where argon is added by an ion implantation method, the acceleration voltage is set to 10 kV and the dose is set to be greater than or equal to $1\times10^{13}$ ions/cm$^2$ and less than or equal to $1\times10^{16}$ ions/cm$^2$, for example, $1\times10^{14}$ ions/cm$^2$. In the case where a phosphorus ion is added by an ion implantation method, the acceleration voltage is set to 30 kV and the dose is set to be greater than or equal to $1\times10^{13}$ ions/cm$^2$ and less than or equal to $5\times10^{16}$ ions/cm$^2$, for example, $1\times10^{15}$ ions/cm$^2$.

Note that oxygen vacancies may be formed in the oxide semiconductor film 126 by, instead of the addition of the impurity element 142, irradiating the oxide semiconductor film 126 with ultraviolet light or the like. Alternatively, oxygen vacancies may be formed in the oxide semiconductor film 126 by irradiating the oxide semiconductor film 126 with laser.

Figure 15:
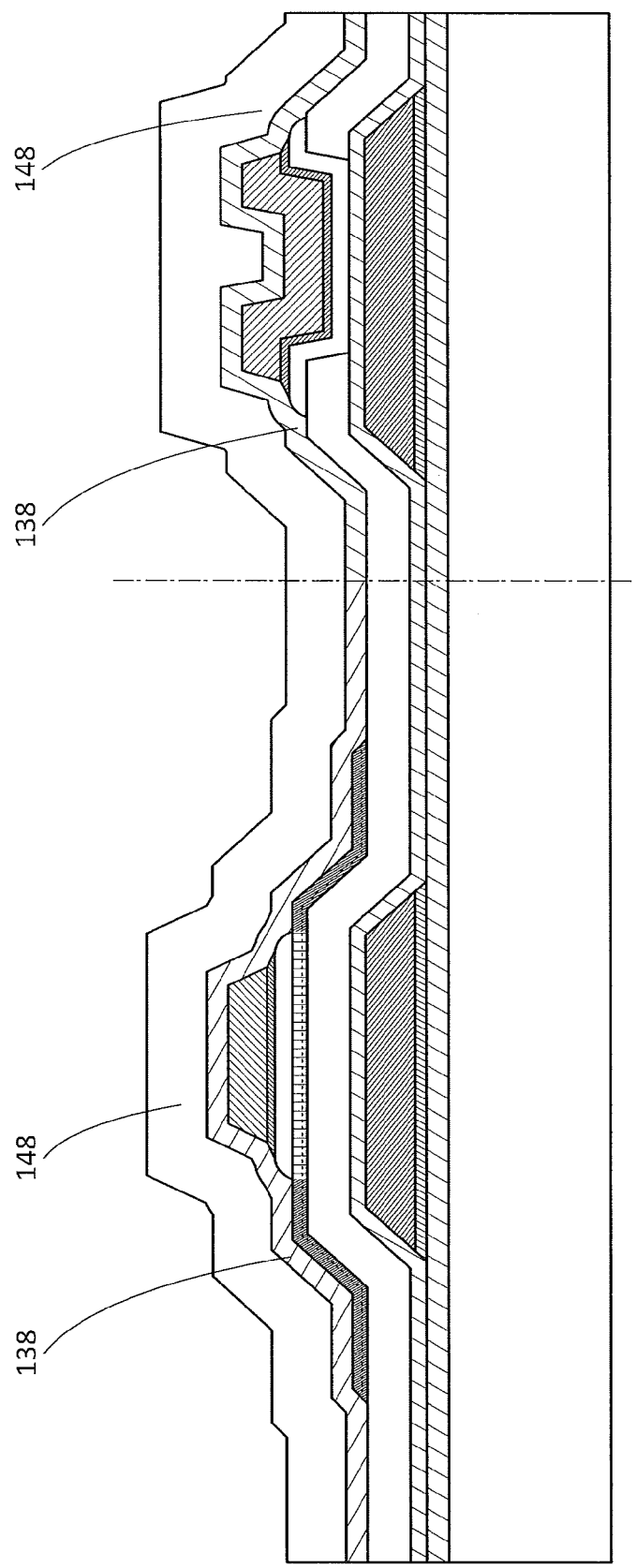
FIG. 15 is a cross-sectional view illustrating an example of a manufacturing process of a semiconductor device.
Figure 16:
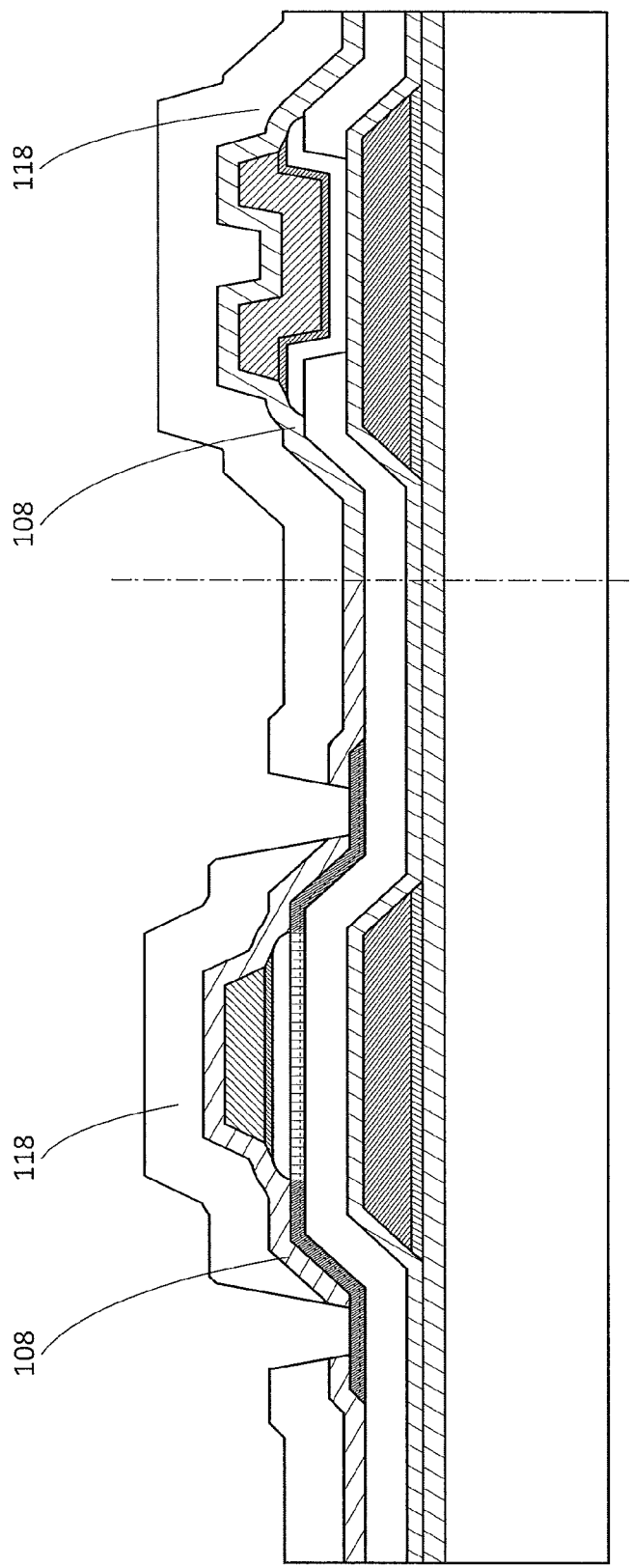
FIG. 16 is a cross-sectional view illustrating an example of a manufacturing process of a semiconductor device.

Next, an insulating film 138 and an insulating film 148 are formed (see FIG. 15). For formation methods and the like of the insulating film 138 and the insulating film 148, the formation methods and the like of the insulating film 102a, the insulating film 132, and the like can be referred to.

Next, after a mask is formed over the insulating film 148 by a lithography process, the insulating film 138 and the insulating film 148 are partly etched, whereby two openings which partly expose the pair of second regions 107a and 107b are formed. Note that the insulating film 108 and the insulating film 118 are formed at a time (see FIG. 16).

Figure 17:
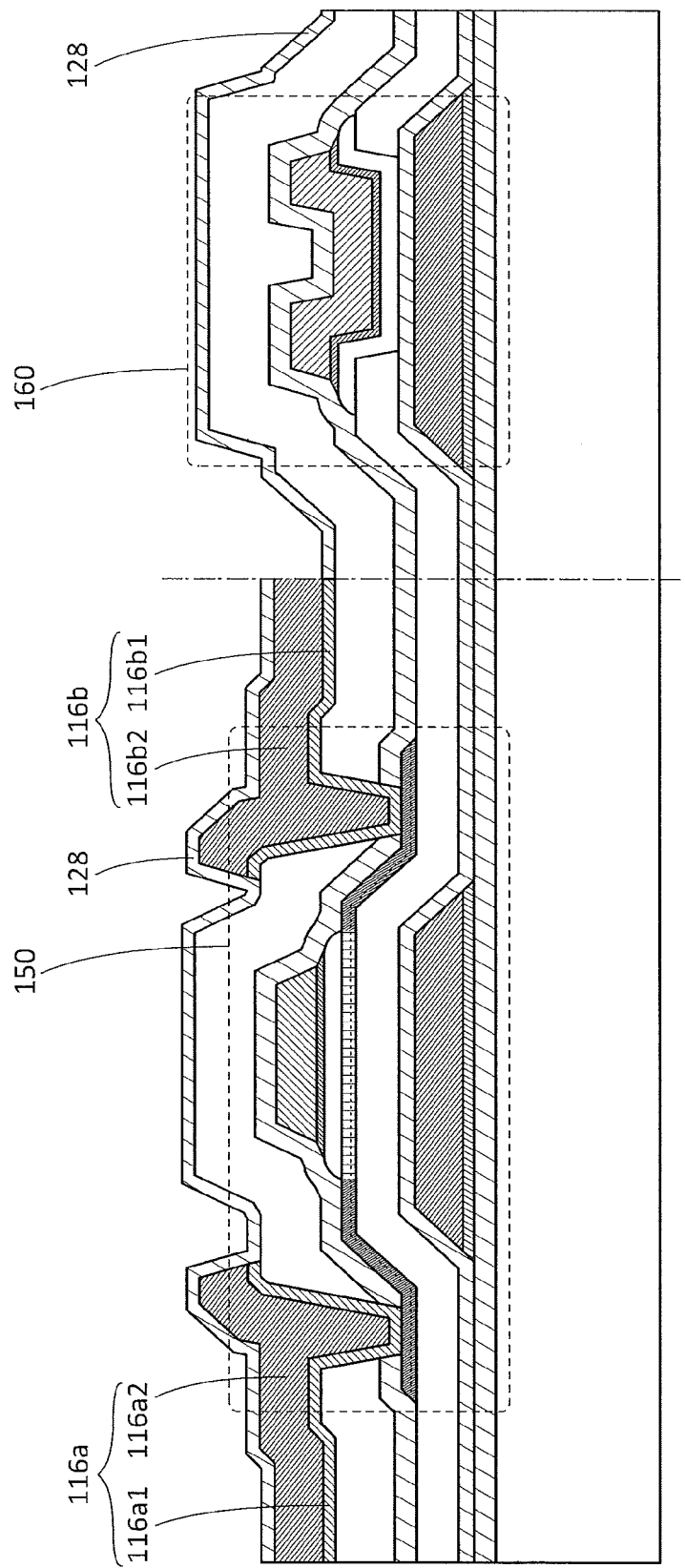
FIG. 17 is a cross-sectional view illustrating an example of a manufacturing process of a semiconductor device.

Next, after a two-layer conductive film is formed over the insulating film 118 and the pair of second regions 107a and 107b and a mask is formed over the upper layer of the two-layer conductive film by a lithography process, the two-layer conductive film is partly etched, whereby the source electrode 116a and the drain electrode 116b are formed (see FIG. 17).

Next, the insulating film 128 is formed over the insulating film 118, the source electrode 116a, and the drain electrode 116b.

Through the above steps, the transistors 150 and the capacitor 160 can be formed at a time.

Connection of wirings and the like of a semiconductor device of one embodiment of the present invention will be described below.

Figure 19A:
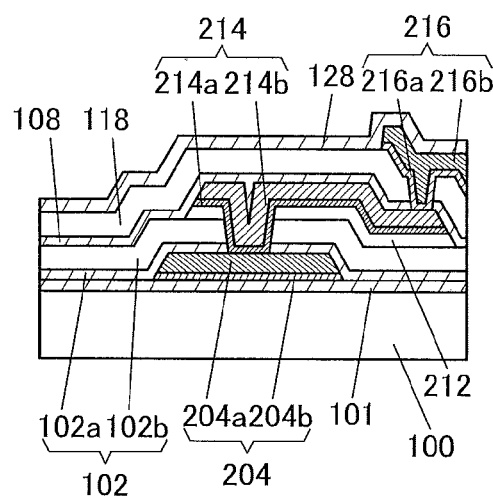
FIGS. 19A to 19D are cross-sectional views each illustrating a semiconductor device.

As illustrated in FIG. 19A, a mask is formed by a lithography process over a stack of the insulating film 102 and the insulating film to be the gate insulating film 112a, which are formed over a wiring 204 (a stack of a conductive film 204a and a conductive film 204b) formed in the same process of forming the gate electrode 104a functioning as a back gate of the transistor 150. After that, the stack of the insulating films is partly etched using the mask, whereby an opening reaching the wiring 204 is formed. The two-layer conductive film to be the gate electrode 114a of the transistor 150 is formed in the opening, and a mask is formed over the conductive film by a lithography process. After that, the two-layer conductive film and the insulating film to be the gate insulating film 112a are partly etched using the mask, whereby a wiring 214 (a stack of a conductive film 214a and a conductive film 214b) and an insulating film 212 are formed. Furthermore, the insulating film 108 and the insulating film 118 are formed over the wiring 214, and a mask is formed over the insulating film 118 by a lithography process. After that, the insulating film 108 and the insulating film 118 are partly etched using the mask, whereby an opening reaching the wiring 214 is formed. After the conductive film to be the source electrode or the drain electrode of the transistor 150 is formed in the opening and a mask is formed over the conductive film by a lithography process, the conductive film is partly etched using the mask, whereby a wiring 216 (a stack of a conductive film 216a and a conductive film 216b) is formed. Through the above steps, the wiring 204 may be electrically connected to the wiring 216 through the wiring 214 as illustrated in FIG. 19A. Note that the opening reaching the wiring 204 may be formed as follows: a mask is formed over the stack of the insulating films by a lithography process, the insulating film 102b and the insulating film to be the gate insulating film 112a are partly etched using the mask, a mask is formed over the insulating film 102a, the insulating film 102b, and the insulating film to be the gate insulating film 112a by a lithography process, and then the insulating film 102a is partly etched using the mask.

For the upper layer (the conductive film 204b) of the wiring 204 and the upper layer (the conductive film 216b) of the wiring 216, it is preferable to use a low-resistance conductive material such as copper or aluminum. By using such a low-resistance conductive material, signal delay can be reduced.

Figure 19B:
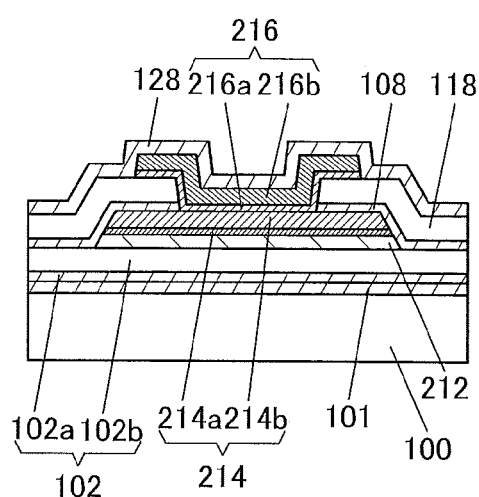
Figure 19C:
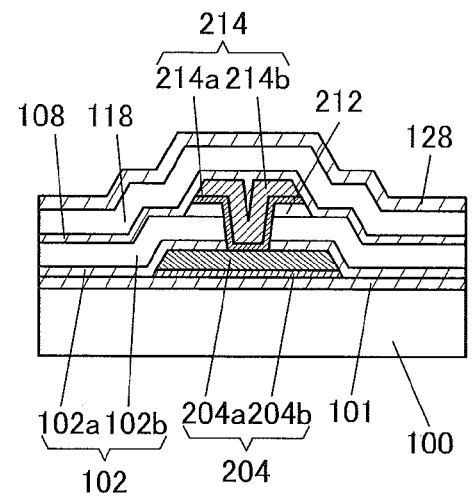

As illustrated in FIG. 19B, the wiring 214 may be electrically connected to the wiring 216 in the opening provided in the insulating film 108 and the insulating film 118 in the above-described steps. As illustrated in FIG. 19C, the wiring 204 may be electrically connected to the wiring 214 in the opening provided in the stack of the insulating films in the above-described steps. Note that for a method for electrically connecting the gate electrode 104a and the gate electrode 114a with reference to FIG. 12 and FIG. 13, the connection method in FIG. 19C can be referred to.

Figure 19D:
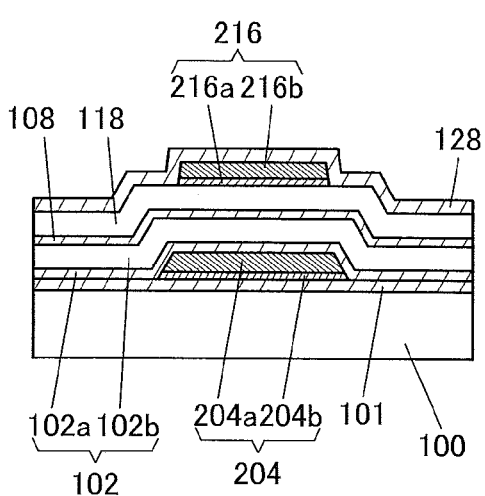

In this embodiment, since the wiring 214 is electrically connected to the wiring 204 in the opening provided in the stack of the insulating films and the wiring 204 and the wiring 216 are intersected with each other, the insulating film 102, the insulating film 108, and the insulating film 118 are provided between the wiring 204 and the wiring 216 as illustrated in FIG. 19D, whereby parasitic capacitance in a portion where the wirings are intersected with each other can be reduced. As a result, signal delay by the parasitic capacitance can be reduced.

Although an example where a channel or the like is formed in an oxide semiconductor film is described in this embodiment, one embodiment of the present invention is not limited thereto. For example, depending on circumstances or conditions, a material containing Si (silicon), Ge (germanium), SiGe (silicon germanium), GaAs (gallium arsenide), or the like may be used for a channel, the vicinity of the channel, a source region, a drain region, or the like.

The structure and method described in this embodiment can be implemented by being combined as appropriate with any of the other structures and methods described in the other embodiments.

Embodiment 2

In this embodiment, a structure of an oxide semiconductor included in a semiconductor device of one embodiment of the present invention will be described.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 20A:
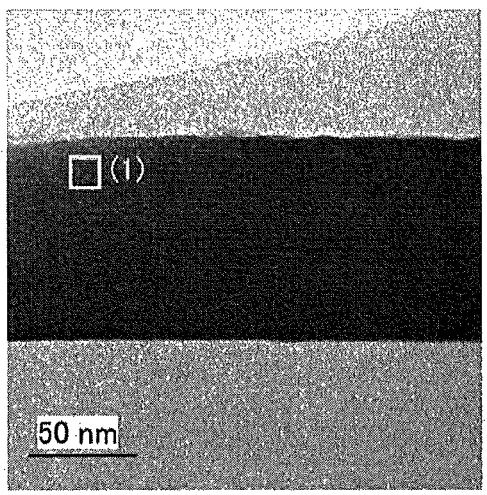
FIGS. 20A to 20D are Cs-corrected high-resolution TEM images of a cross section of a CAAC-OS and a cross-sectional schematic view of the CAAC-OS.

A CAAC-OS observed with TEM is described below. FIG. 20A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 20B:
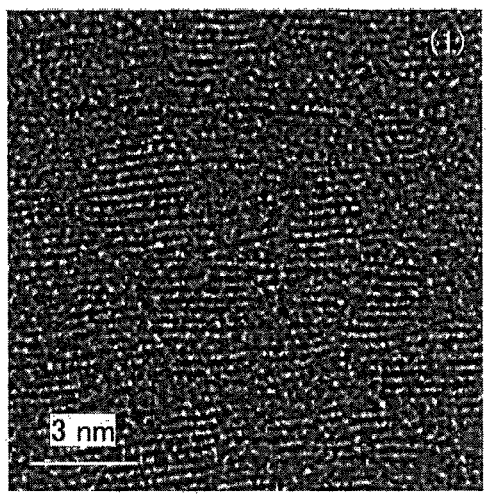

FIG. 20B is an enlarged Cs-corrected high-resolution IBM image of a region (1) in FIG. 20A. FIG. 20B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 20C:
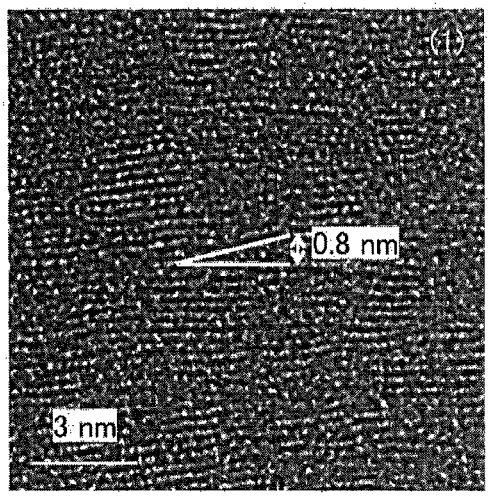

As shown in FIG. 20B, the CAAC-OS has a characteristic atomic arrangement. The characteristic atomic arrangement is denoted by an auxiliary line in FIG. 20C. FIGS. 20B and 20C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 20D:
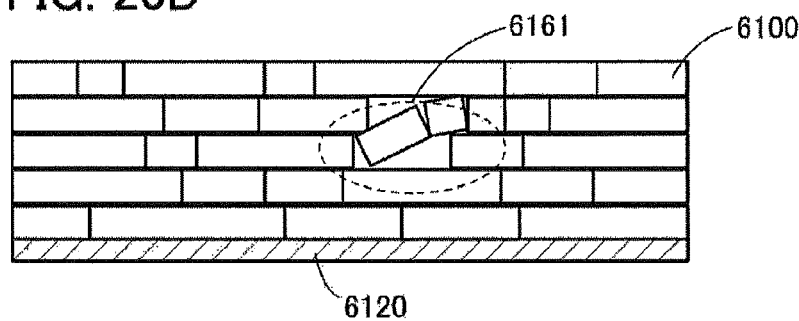

Here, according to the Cs-corrected high-resolution TEM images, the schematic arrangement of pellets 6100 of a CAAC-OS over a substrate 6120 is illustrated by such a structure in which bricks or blocks are stacked (see FIG. 20D). The part in which the pellets are tilted as observed in FIG. 20C corresponds to a region 6161 shown in FIG. 20D.

FIG. 21A shows a Cs-corrected high-resolution TEM image of a plane of the CAAC-OS observed from a direction substantially perpendicular to the sample surface. FIGS. 21B, 21C, and 21D are enlarged Cs-corrected high-resolution TEM images of regions (1), (2), and (3) in FIG. 21A, respectively. FIGS. 21B, 21C, and 21D indicate that metal atoms are arranged in a triangular, quadrangular, or hexagonal configuration in a pellet. However, there is no regularity of arrangement of metal atoms between different pellets.

Figure 22A:
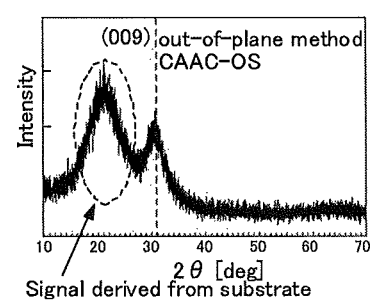
FIGS. 22A to 22C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 22A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 22B:
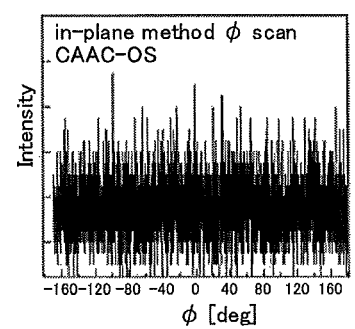
Figure 22C:
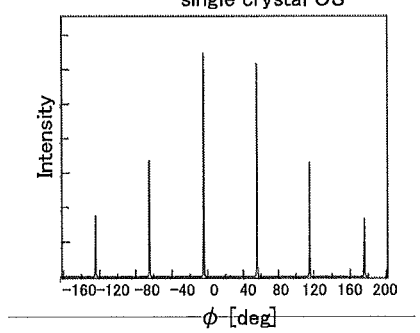

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis (ϕ axis), as shown in FIG. 22B, a peak is not clearly observed. In contrast, in the case of a single crystal oxide semiconductor of InGaZnO$_4$, when ϕ scan is performed with 2θ fixed at around 56°, as shown in FIG. 22C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 23A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 23B shows a diffraction pattern obtained in such a manner that an electron beam with a probe diameter of 300 nm is incident on the same sample in a direction perpendicular to the sample surface. As shown in FIG. 23B, a ring-like diffraction pattern is observed. Thus, the electron diffraction also indicates that the a-axes and b-axes of the pellets included in the CAAC-OS do not have regular alignment. The first ring in FIG. 23B is considered to be derived from the (010) plane, the (100) plane, and the like of the InGaZnO$_4$ crystal. The second ring in FIG. 23B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 am is regarded as a crystal part of $InGaZnO_4$. Each of lattice fringes corresponds to the a-b plane of the $InGaZnO_4$ crystal.

Figure 24:
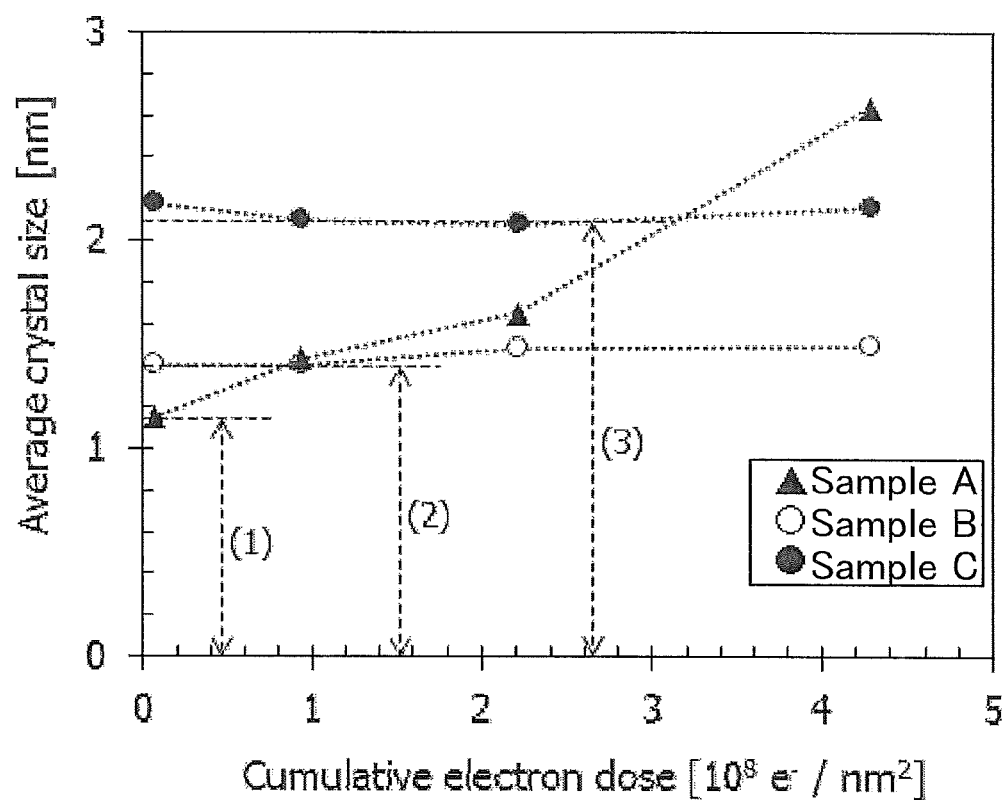
FIG. 24 shows a change of crystal parts of an In—Ga—Zn oxide owing to electron irradiation.

FIG. 24 shows change in the average size of crystal parts (at 22 points to 45 points) in each sample. Note that the crystal part size corresponds to the length of a lattice fringe. FIG. 24 indicates that the crystal part size in the a-like OS increases with an increase in the cumulative electron dose. Specifically, as shown by (1) in FIG. 24, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 24, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

The structure and method described in this embodiment can be implemented by being combined as appropriate with any of the other structures and methods described in the other embodiments.

Embodiment 3

In this embodiment, deposition models of a CAAC-OS and an nc-OS will be described.

Figure 46A:
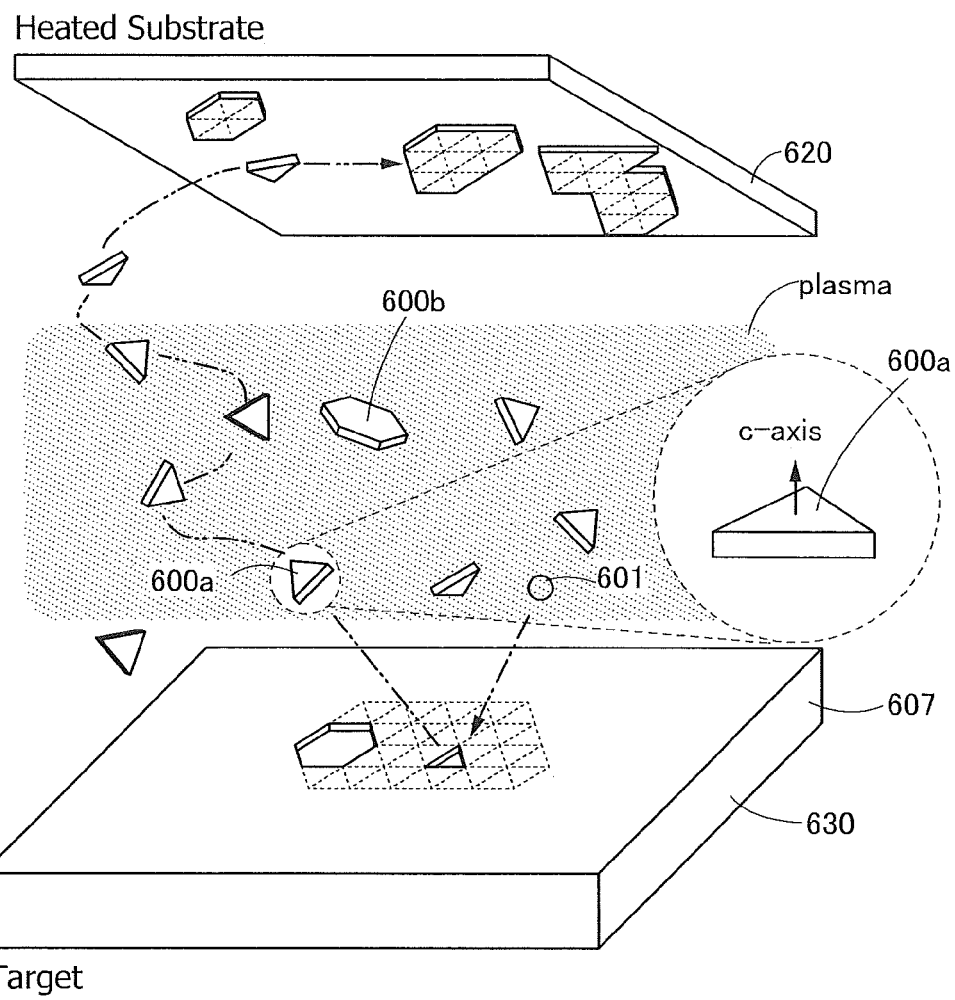
FIG. 46A schematically illustrates a CAAC-OS deposition model.

FIG. 46A is a schematic view of the inside of a deposition chamber where a CAAC-OS is deposited by sputtering.

A target 630 is attached to a backing plate. Under the target 630 and the backing plate, a plurality of magnets is placed. The plurality of magnets generates a magnetic field over the target 630. Sputtering in which disposition speed is increased by utilizing a magnetic field of magnets is referred to as magnetron sputtering.

The target 630 has a polycrystalline structure in which a cleavage plane exists in at least one crystal grain. Note that the details of the cleavage plane will be described later.

A substrate 620 is placed to face the target 630, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of voltage at a certain value or higher to the target 630, and plasma is observed. Note that the magnetic field over the target 630 forms a high-density plasma region. In the high-density plasma region, the deposition gas is ionized, so that an ion 601 is generated. Examples of the ion 601 include an oxygen cation ($O^+$) and an argon cation ($Ar^+$).

The ion 601 is accelerated toward the target 630 side by an electric field, and collides with the target 630 eventually. At this time, a pellet 600a and a pellet 600b that are flat-plate-like (pellet-like) sputtered particles are separated and sputtered from the cleavage plane. Note that structures of the pellet 600a and the pellet 600b may be distorted by the impact of collision of the ion 601.

The pellet 600a is a flat-plate-like (pellet-like) sputtered particle having a triangle plane, e.g., a regular triangle plane. The pellet 600b is a flat-plate-like (pellet-like) sputtered particle having a hexagon plane, e.g., a regular hexagon plane. Note that flat-plate-like (pellet-like) sputtered particles such as the pellet 600a and the pellet 600b are collectively called pellets 600. The shape of a flat plane of the pellet 600 is not limited to a triangle or a hexagon. For example, the flat plane may have a shape formed by combining two to six triangles. For example, a square (rhombus) is formed by combining two triangles (regular triangles) in some cases.

The thickness of the pellet 600 is determined depending on the kind of the deposition gas and the like. Although the reasons are described later, the thicknesses of the pellets 600 are preferably uniform. In addition, the sputtered particle preferably has a pellet shape with small thickness as compared to a dice shape with large thickness.

Figure 48:
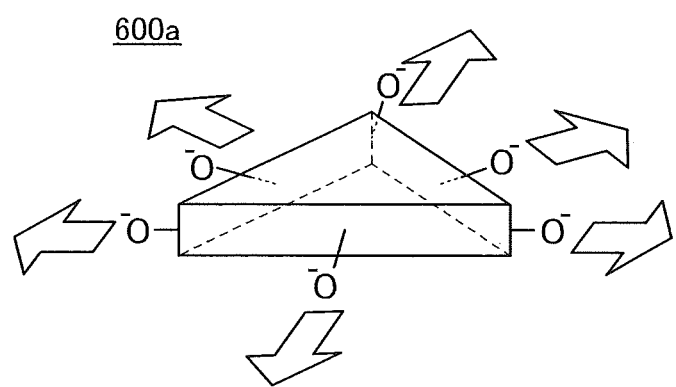
FIG. 48 illustrates a pellet.

The pellet 600 receives charge when passing through the plasma, so that side surfaces of the pellet 600 are negatively or positively charged in some cases. The pellet 600 includes oxygen atoms on its side surfaces, and the oxygen atoms might be negatively charged. For example, the case in which the pellet 600a includes, on side surfaces, oxygen atoms that are negatively charged is illustrated in FIG. 48. When the side surfaces are charged in the same polarity as in this view, charges repel each other; thus, the pellet 600a can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged.

Figure 49:
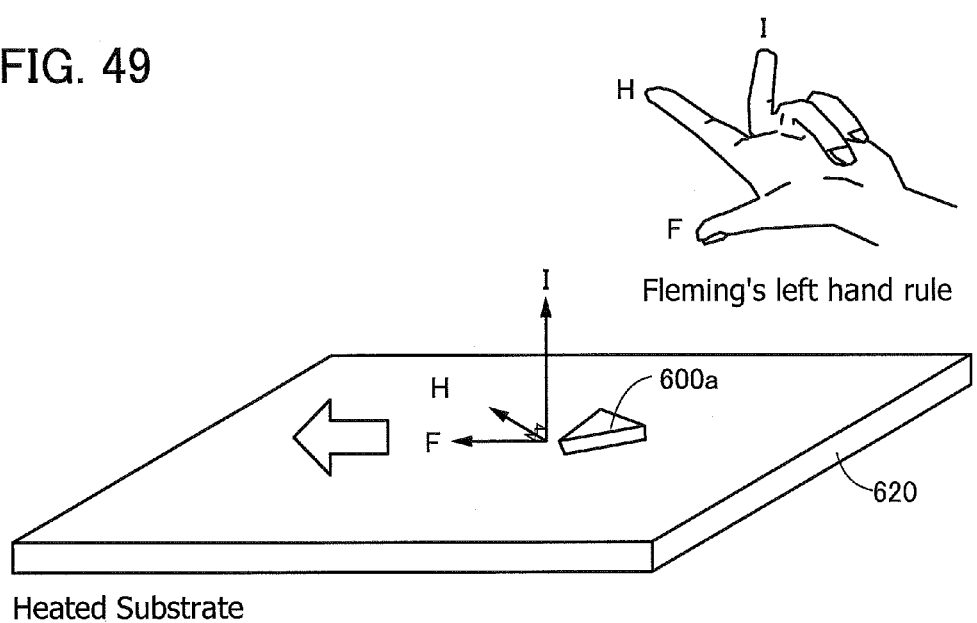
FIG. 49 illustrates force applied to a pellet on a formation surface.

As illustrated in FIG. 46A, the pellet 600 flies like a kite in plasma and flutters up to the substrate 620, for example. Since the pellets 600 are charged, when the pellet 600 gets close to a region where another pellet 600 has already been deposited, repulsion is generated. Here, above the substrate 620, a magnetic field is generated in a direction parallel to a top surface of the substrate 620. A potential difference is given between the substrate 620 and the target 630, so that current flows from the substrate 620 toward the target 630. Thus, the pellet 600 is given force (Lorentz force) on the top surface of the substrate 620 by the action of the magnetic field and the current (see FIG. 49). This is explainable with Fleming's left-hand rule. In order to increase force applied to the pellet 600, it is preferable to provide, on the top surface, a region where the magnetic field in a direction parallel to the top surface of the substrate 620 is 10 G or higher, preferably 20 G or higher, more preferably 30 G or higher, still preferably 50 G or higher. Alternatively, it is preferable to provide, on the top surface, a region where the magnetic field in a direction parallel to the top surface of the substrate is 1.5 times or more, preferably twice or more, further preferably 3 times or more, still further preferably 5 times or more that in a direction perpendicular to the top surface of the substrate 620.

Figure 50A:
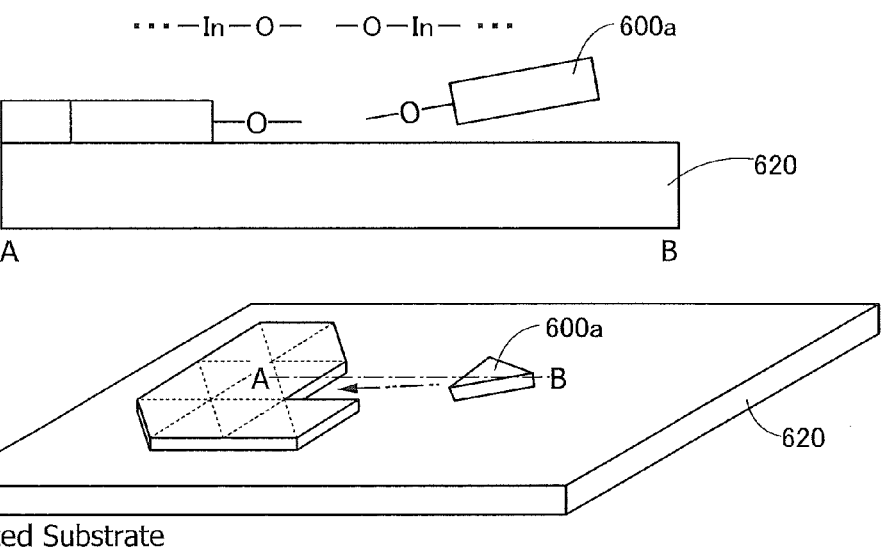
FIGS. 50A and 50B illustrate movement of a pellet on a formation surface.
Figure 50B:
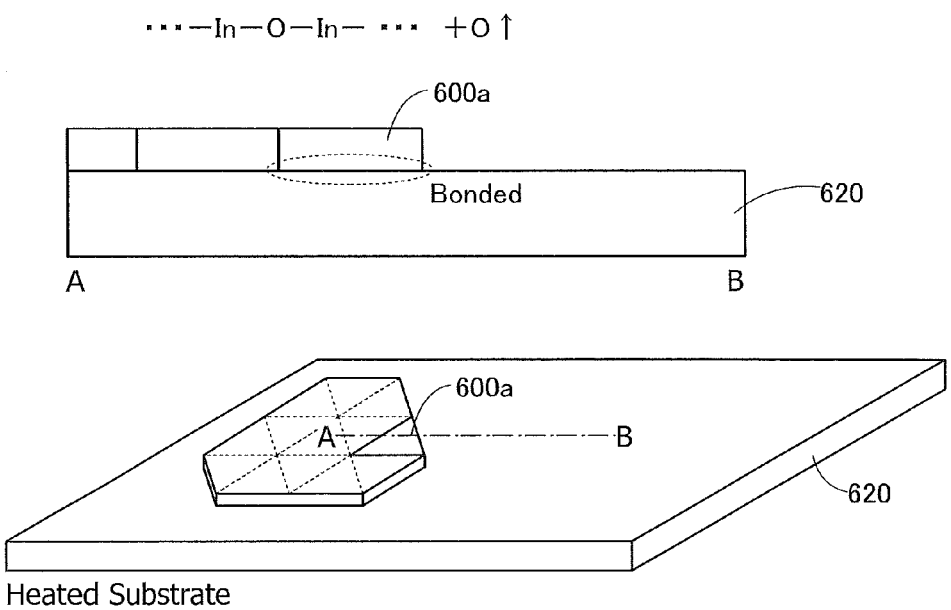

Furthermore, the substrate 620 is heated, and resistance such as friction between the pellet 600 and the substrate 620 is low. As a result, as illustrated in FIG. 50A, the pellet 600 glides on the top surface of the substrate 620. The glide of the pellet 600 is caused in a state where the flat plane faces the substrate 620. Then, as illustrated in FIG. 50B, when the pellet 600 reaches the side surface of another pellet 600 that has been already deposited, the side surfaces of the pellets 600 are bonded. At this time, the oxygen atom on the side surface of the pellet 600 is released. With the released oxygen atom, oxygen vacancies in a CAAC-OS are filled in some cases; thus, the CAAC-OS has low density of defect states.

Furthermore, the pellet 600 is heated on the substrate 620, so that atoms are rearranged and the structure distortion caused by the collision of the ion 601 can be reduced. The pellet 600 whose distortion is reduced is substantially single crystal. Even when the pellets 600 are heated after being bonded, expansion and contraction of the pellet 600 itself hardly occur, which is caused by turning the pellet 600 substantially single crystal. Thus, formation of defects such as a grain boundary due to expansion of a space between the pellets 600 can be prevented, so that generation of crevasses can be prevented. Furthermore, the space is filled with elastic metal atoms and the like, and the elastic metal atoms have a function, like a highway, of jointing side surfaces of the pellets 600 that are not aligned with each other.

As shown in such a model, the pellets 600 are considered to be deposited on the substrate 620. Thus, a CAAC-OS can be deposited even when a formation surface does not have a crystal structure, which is different from deposition by epitaxial growth. For example, even when a top surface (formation surface) of the substrate 620 has an amorphous structure, a CAAC-OS can be deposited.

Figure 46B:
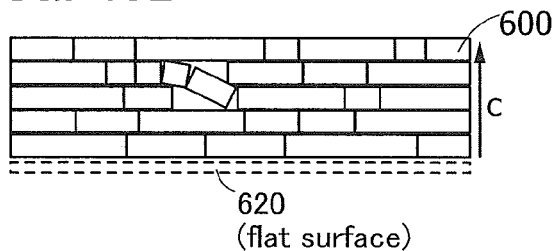
FIGS. 46B and 46C are cross-sectional views of pellets and a CAAC-OS.

It is also found that in formation of the CAAC-OS, the pellets 600 are arranged in accordance with a surface shape of the substrate 620 that is the formation surface even when the formation surface has unevenness besides a flat surface. For example, in the case where the top surface of the substrate 620 is flat at the atomic level, the pellets 600 are arranged so that flat planes parallel to the a-b plane face downwards; thus, a layer with uniform thickness, flatness, and high crystallinity is formed. By stacking n layers (n is a natural number), the CAAC-OS can be obtained (see FIG. 46B).

Figure 46C:
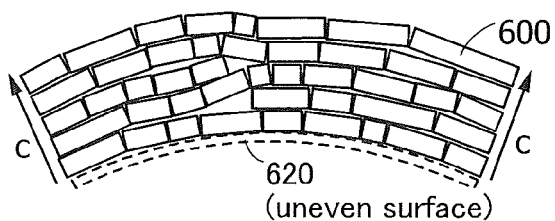

In the case where the top surface of the substrate 620 has unevenness, a CAAC-OS where n layers (n is a natural number) in each of which the pellets 600 are arranged along a convex surface are stacked is formed. Since the substrate 620 has unevenness, a gap is easily generated between the pellets 600 in the CAAC-OS in some cases. Note that owing to intermolecular force, the pellets 600 are arranged so that a gap between the pellets is as small as possible even over the unevenness surface. Therefore, even when the formation surface has unevenness, a CAAC-OS with high crystallinity can be formed (see FIG. 46C).

As a result, laser crystallization is not needed for formation of a CAAC-OS, and a uniform film can be formed even over a large-area glass substrate or the like.

Since the CAAC-OS is deposited in accordance with such a model, the sputtered particle preferably has a pellet shape with small thickness. Note that in the case where the sputtered particles have a dice shape with large thickness, planes of the particles facing the substrate 620 vary; thus, the thickness and the orientation of the crystals cannot be uniform in some cases.

According to the deposition model, a CAAC-OS with high crystallinity can be formed even on a formation surface with an amorphous structure.

Furthermore, formation of a CAAC-OS can be described with a deposition model including a zinc oxide particle besides the pellet 600.

The zinc oxide particle reaches the substrate 620 before the pellet 600 does because the zinc oxide particle is smaller than the pellet 600 in mass. On the top surface of the substrate 620, crystal growth of the zinc oxide particle preferentially occurs in a horizontal direction, so that a thin zinc oxide layer is formed. The zinc oxide layer has c-axis alignment. Note that c-axes of crystals in the zinc oxide layer are aligned in a direction parallel to a normal vector of the substrate 620. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at higher proportion than the stoichiometric composition is preferably used.

An nc-OS can be understood with a deposition model illustrated in FIG. 47. Note that a difference between FIG. 47 and FIG. 46A lies only in whether the substrate 620 is heated.

Thus, the substrate 620 is not heated, and resistance such as friction between the pellet 600 and the substrate 620 is high. As a result, the pellets 600 cannot glide on the top surface of the substrate 620 and are stacked randomly, so that an nc-OS can be obtained.

<Cleavage Plane>

A cleavage plane that has been mentioned in the deposition model of the CAAC-OS will be described below.

Figure 51A:
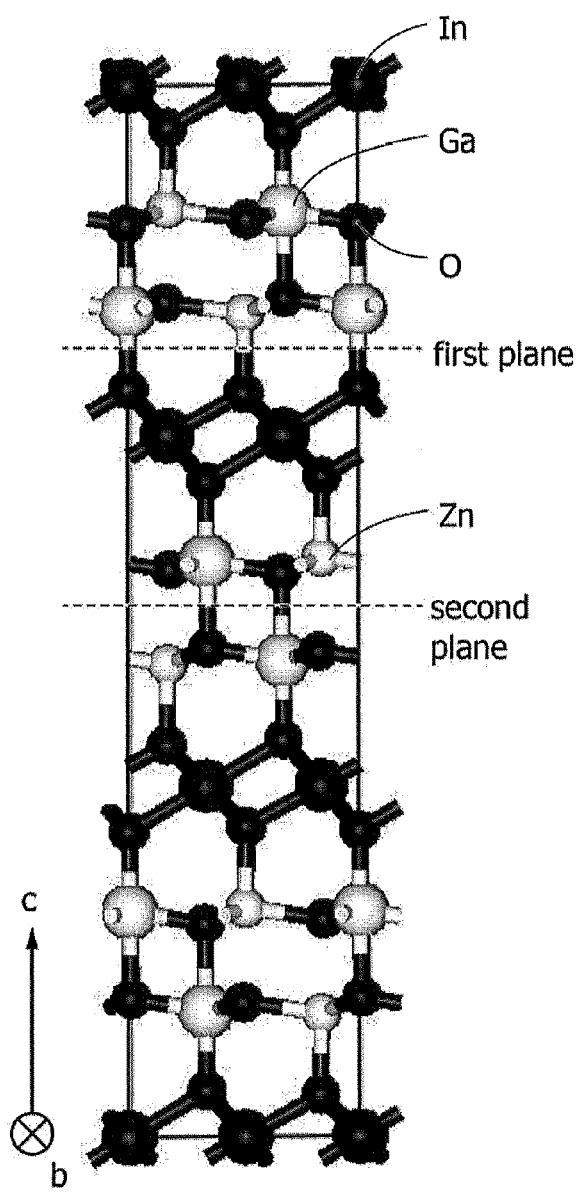
FIGS. 51A and 51B show an $InGaZnO_4$ crystal.
Figure 51B:
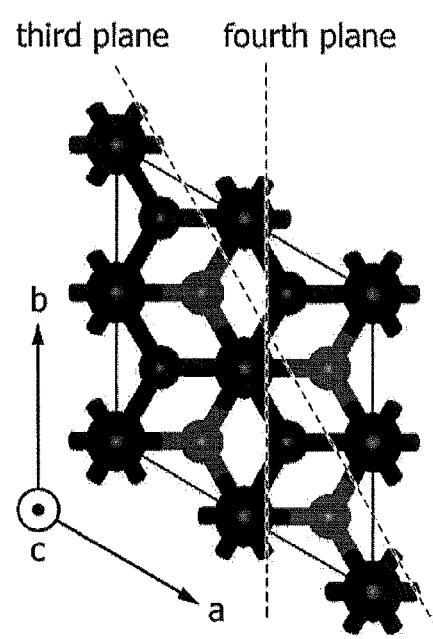

First, a cleavage plane of the target is described with reference to FIGS. 51A and 51B. FIGS. 51A and 51B show the crystal structure of $InGaZnO_4$. Note that FIG. 51A shows the structure of the case where an $InGaZnO_4$ crystal is observed from a direction parallel to the b-axis when the c-axis is in an upward direction. Furthermore, FIG. 51B shows the structure of the case where the $InGaZnO_4$ crystal is observed from a direction parallel to the c-axis.

Energy needed for cleavage at each crystal plane of the $InGaZnO_4$ crystal is calculated by the first principles calculation. Note that a pseudo potential and a density functional theory program (CASTEP) using the plane wave basis are used for the calculation. An ultrasoft type pseudo potential is used as the pseudo potential. Furthermore, GGA/PBE is used as the functional. Cut-off energy is 400 eV.

Energy of a structure in an initial state is obtained after structural optimization including a cell size is performed. Furthermore, energy of a structure after the cleavage at each plane is obtained after structural optimization of atomic order is performed in a state where the cell size is fixed.

On the basis of the structure of the $InGaZnO_4$ crystal in FIGS. 51A and 51B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 51A). The second plane is a crystal plane between a Ga—Zn—O layer and a Ga—Zn—O layer and is parallel to the (001) plane (or the a-b plane) (see FIG. 51A). The third plane is a crystal plane parallel to the (110) plane (see FIG. 51B). The fourth plane is a crystal plane parallel to the (100) plane (or the b-c plane) (see FIG. 51B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy that serves as a measure of easiness of cleavage at each plane is calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane is 2.60 $J/m^2$, that of the second plane is 0.68 $J/m^2$, that of the third plane is 2.18 $J/m^2$, and that of the fourth plane is 2.12 $J/m^2$ (see Table 3).

TABLE 3

|  | Cleavage energy [$J/m^2$] |
|---|---|
| First plane | 2.60 |
| Second plane | 0.68 |
| Third plane | 2.18 |
| Fourth plane | 2.12 |

From the calculations, in the structure of the $InGaZnO_4$ crystal in FIGS. 51A and 51B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between the Ga—Zn—O layer and the Ga—Zn—O layer, the $InGaZnO_4$ crystals in FIG. 51A can be separated at a plane equivalent to two second planes. Thus, in the case where an ion or the like is made to collide with a target, a wafer-like unit (we call this a pellet) that is cleaved at a plane with the lowest cleavage energy is thought to be blasted off as the minimum unit. In that case, a pellet of $InGaZnO_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and crystal plane parallel to the (001) plane (or the a-b plane)), which suggests that most of the flat planes of the pellets have triangle shapes or hexagonal shapes.

Figure 52A:
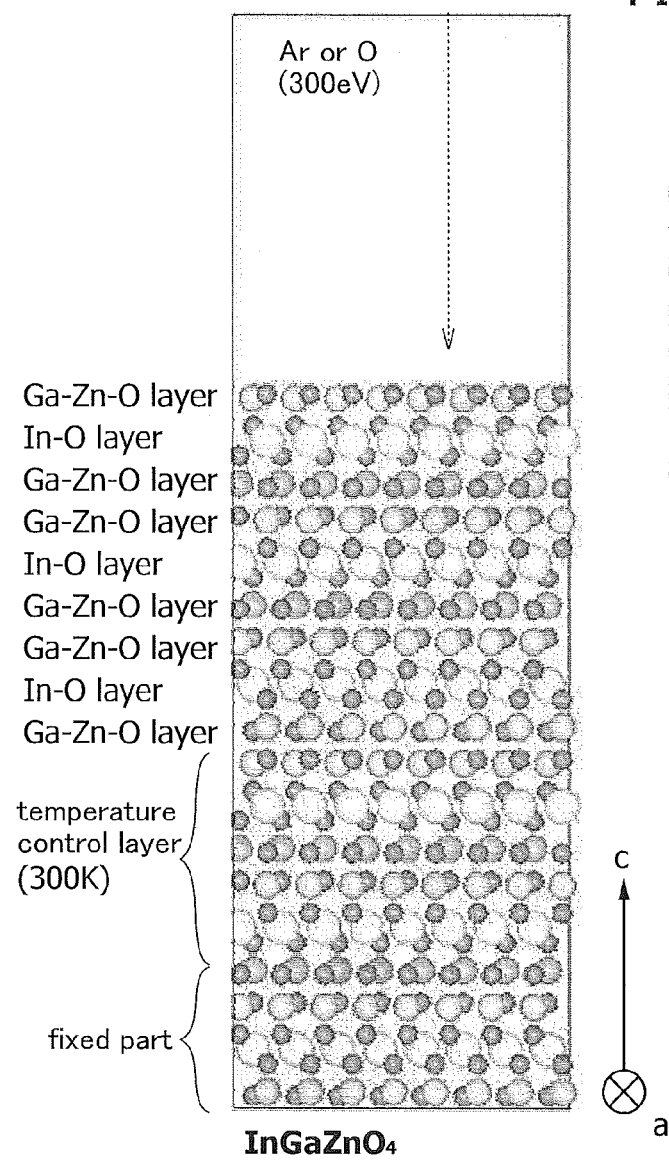
Figure 52B:
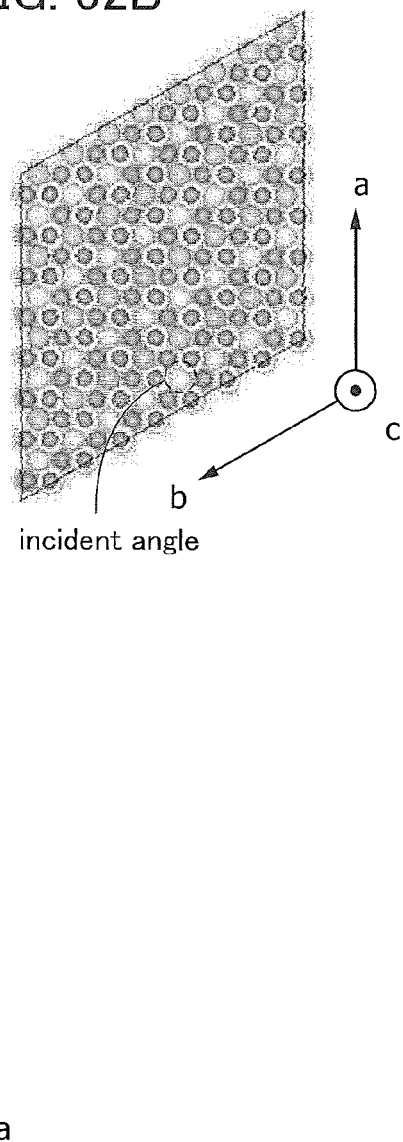

Next, through classical molecular dynamics calculation, on the assumption of an $InGaZnO_4$ crystal having a homologous structure as a target, a cleavage plane is examined in the case where the target is sputtered using argon (Ar) or oxygen (O). FIG. 52A shows a cross-sectional structure of an $InGaZnO_4$ crystal (2688 atoms) used for the calculation, and FIG. 52B shows a top structure thereof. Note that a fixed layer in FIG. 52A prevents the positions of the atoms from moving. A temperature control layer in FIG. 52A is a layer whose temperature is constantly set to fixed temperature (300 K).

For the classical molecular dynamics calculation, Materials Explorer 5.0 manufactured by Fujitsu Limited is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the $InGaZnO_4$ crystal under the conditions.

FIG. 53A shows atomic order when 99.9 picoseconds have passed after argon enters the cell including the $InGaZnO_4$ crystal in FIGS. 52A and 52B. FIG. 53B shows atomic order when 99.9 picoseconds have passed after oxygen enters the cell. Note that in FIGS. 53A and 53B, part of the fixed layer in FIG. 52A is omitted.

According to FIG. 53A, in a period from entry of argon into the cell to when 99.9 picoseconds have passed, a crack is formed from the cleavage plane corresponding to the second plane in FIG. 51A. Thus, in the case where argon collides with the InGaZnO$_4$ crystal and the uppermost surface is the second plane (the zero-th), a large crack is found to be formed in the second plane (the second).

On the other hand, according to FIG. 53B, in a period from entry of oxygen into the cell to when 99.9 picoseconds have passed, a crack is found to be formed from the cleavage plane corresponding to the second plane in FIG. 51A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, a difference in size of the pellet depending on atoms that are made to collide is studied.

Figure 54A:
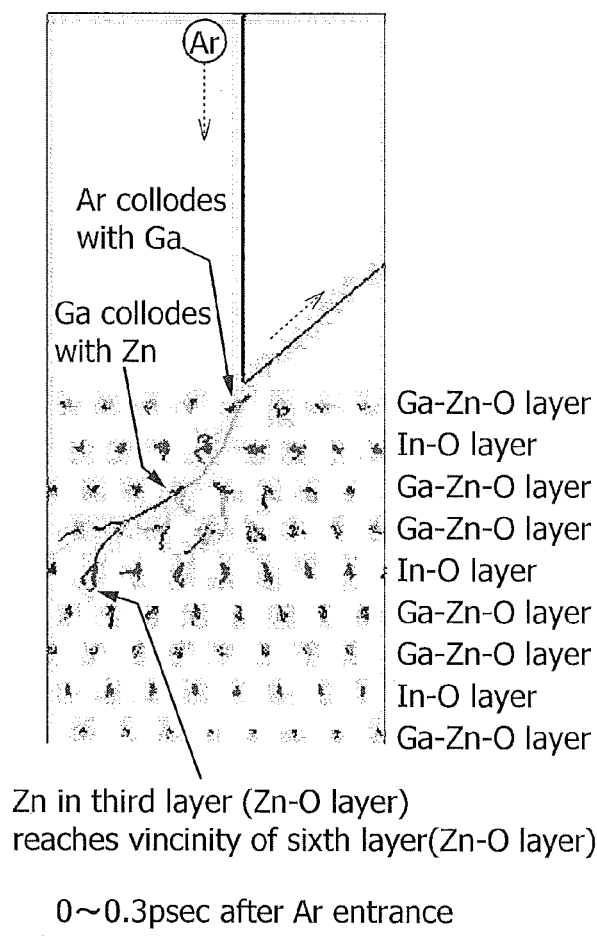
FIGS. 54A and 54B show trajectories of atoms after collision of an atom.

FIG. 54A shows trajectories of the atoms from 0 picoseconds to 0.3 picoseconds after argon enters the cell including the InGaZnO$_4$ crystal in FIGS. 52A and 52B. Accordingly, FIG. 54A corresponds to a period from FIGS. 52A and 52B to FIG. 53A.

According to FIG. 54A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that argon which collides with gallium is sputtered to the outside. Accordingly, in the case where argon collides with the target including the InGaZnO$_4$ crystal, a crack is thought to be formed in the second plane (the second) in FIG. 52A.

Figure 54B:
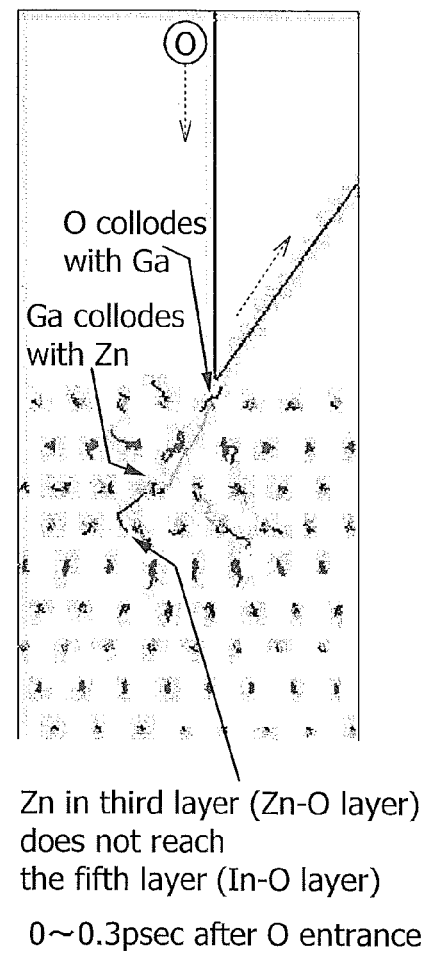

FIG. 54B shows trajectories of the atoms from 0 picoseconds to 0.3 picoseconds after oxygen enters the cell including the InGaZnO$_4$ crystal in FIGS. 52A and 52B. Accordingly, FIG. 54B corresponds to a period from FIGS. 52A and 52B to FIG. 53A.

On the other hand, according to FIG. 54B, when oxygen collides with gallium (Ga) of the first layer (Ga—Zn—O layer), gallium collides with zinc (Zn) of the third layer (Ga—Zn—O layer) and then, zinc does not reach the fifth layer (In—O layer). Note that oxygen which collides with gallium is sputtered to the outside. Accordingly, in the case where oxygen collides with the target including the InGaZnO$_4$ crystal, a crack is thought to be faulted in the second plane (the first) in FIG. 52A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by Formula 4 and Formula 5. Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

$$E = \frac{1}{2}m_A v_A^2 + \frac{1}{2}m_A v_{Ga}^2 \qquad \text{[Formula 4]}$$

$$m_A v_A + m_{Ga} v_{Ga} = m'_A v'_A + m'_{Ga} v'_{Ga} \qquad \text{[Formula 5]}$$

On the assumption that collision of argon or oxygen is elastic collision, the relationship among $v_A$, $v'_A$, and $v'_{Ga}$ can be represented by Formula 6.

$$v'_A - v'_{Ga} = -(v_A - v_{Ga}) \qquad \text{[Formula 6]}$$

From Formulae 4, 5, and 6, on the assumption that $v_{Ga}$ is 0, the speed of gallium $v'_{Ga}$ after collision of argon or oxygen can be represented by Formula 7.

$$v'_{Ga} = \frac{\sqrt{m_A}}{m_A + m_{Ga}} \cdot 2\sqrt{2E} \qquad \text{[Formula 7]}$$

In Formula 7, mass of argon or oxygen is substituted into $m_A$, and the speeds after collision of the atoms are compared. In the case where argon and oxygen have the same energy before collision, the speed of gallium when argon collides with gallium was found to be 1.24 times the speed of gallium when oxygen collides with gallium. Thus, the energy of gallium when argon collides with gallium is higher than the energy of gallium when oxygen collides with gallium by the square of the speed.

The speed (energy) of gallium after collision when argon collides with gallium is found to be higher than the speed (energy) of gallium after collision when oxygen collides with gallium. Accordingly, a crack is considered to be formed at a deeper position in the case where argon collides with gallium than in the case where oxygen collides with gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size that is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model in FIG. 46A where sputtered pellets are deposited to form a CAAC-OS is a reasonable model.

The CAAC-OS deposited in this manner has density substantially equal to that of a single crystal OS. For example, the density of the single crystal OS having a homologous structure of InGaZnO$_4$ is 6.36 g/cm$^3$, and the density of the CAAC-OS having substantially the same atomic ratio is approximately 6.3 g/cm$^3$.

Figure 55A:
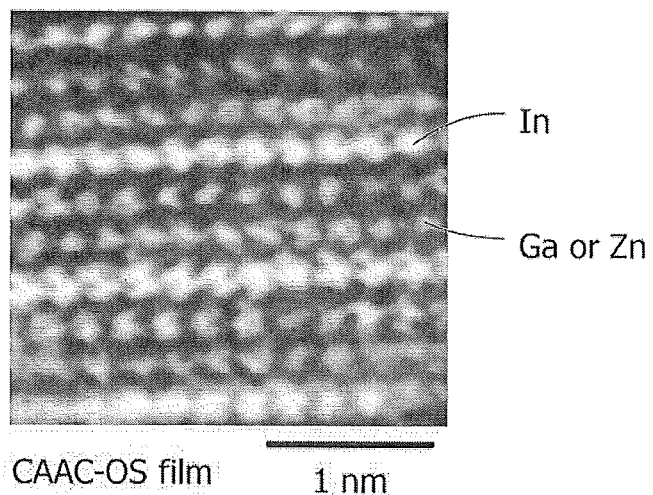
FIGS. 55A and 55B are cross-sectional HAADF-STEM images of a CAAC-OS and a target.
Figure 55B:
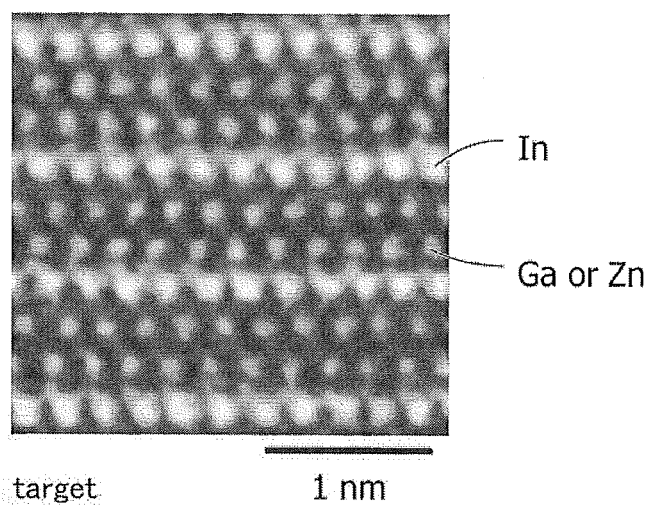

FIGS. 55A and 55B show atomic order of cross sections of an In—Ga—Zn oxide (see FIG. 55A) that is a CAAC-OS deposited by sputtering and a target thereof (see FIG. 55B). For observation of atomic order, a high-angle annular dark field scanning transmission electron microscopy (HAADF-STEM) is used. In the case of observation by HAADF-STEM, the intensity of an image of each atom is proportional to the square of its atomic number. Thus, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 55A and FIG. 55B are compared, it is found that the CAAC-OS and the target each have a homologous structure and atomic order in the CAAC-OS correspond to that in the target. Thus, as illustrated in the deposition model in FIG. 46A, the crystal structure of the target is transferred, so that a CAAC-OS is deposited.

Embodiment 4

In this embodiment, one embodiment of a light-emitting device using the semiconductor device of one embodiment of the present invention will be described. Note that in this embodiment, a structure of a pixel portion of a light-emitting device is described with reference to FIGS. 25A and 25B.

Figure 25A:
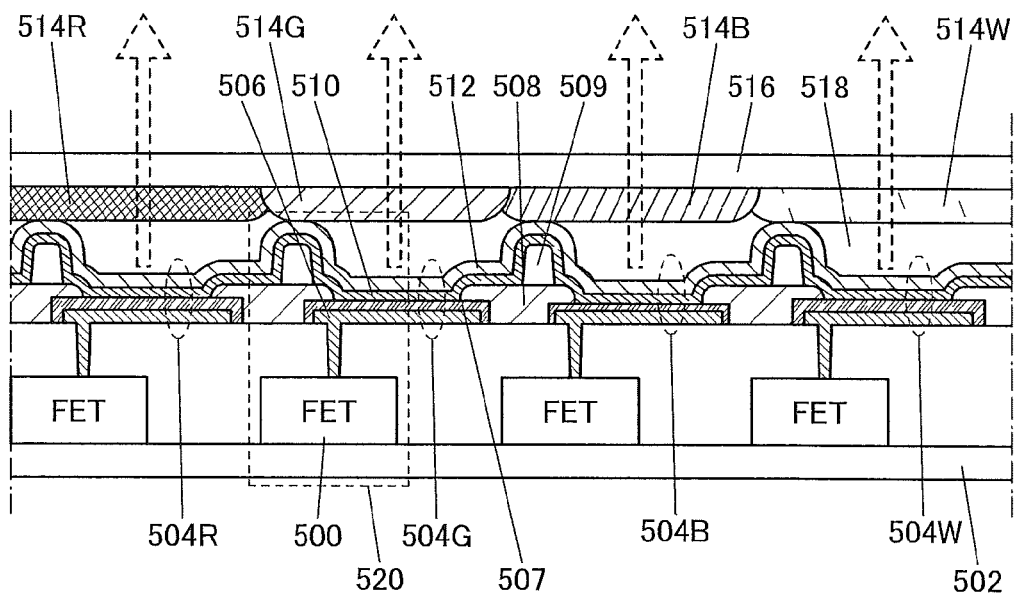
FIGS. 25A and 25B illustrate a structure of a pixel portion of a light-emitting device.

In FIG. 25A, a plurality of FETs 500 is formed over a first substrate 502, and each of the FETs 500 is electrically connected to a light-emitting element (504R, 504G, 504B, or 504W). Specifically, the FET 500 is electrically connected to a first conductive film 506 included in the light-emitting element. Note that the light-emitting elements (504R, 504G, 504B, and 504W) each include the first conductive film 506, a second conductive film 507, an EL layer 510, and a third conductive film 512.

Furthermore, coloring layers (514R, 514G, 514B, and 514W) are provided in positions facing the corresponding light-emitting elements (504R, 504G, 504B, and 504W). Note that the coloring layers (514R, 514G, 514B, and 514W) are provided in contact with a second substrate 516. Furthermore, a sealing film 518 is provided between the first substrate 502 and the second substrate 516. For example, a glass material such as a glass frit, or a resin that is curable at room temperature such as a two-component type resin, a light curable resin, a heat-curable resin, and the like can be used for the sealing film 518.

A partition wall 508 is provided so as to cover end portions of adjacent stacks of the first conductive film 506 and the second conductive film 507. A structure 509 is provided over the partition wall 508. Note that the first conductive film 506 has a function as a reflective electrode and a function as an anode of the light-emitting element. The second conductive film 507 has a function of adjusting the optical path length of each light-emitting element. The EL layer 510 is formed over the second conductive film 507, and the third conductive film 512 is formed over the EL layer 510. The third conductive film 512 has a function as a semi-transmissive and semi-reflective electrode and a function as a cathode of the light-emitting element. The structure 509 is provided between the light-emitting element and the coloring layer and has a function as a spacer.

The EL layer 510 can be shared by the light-emitting elements (504R, 504G, 504B, and 504W). Note that each of the light-emitting elements (504R, 504G, 504B, and 504W) has a micro optical resonator (or microcavity) structure which allows light emitted from the EL layer 510 to resonate by the first conductive film 506 and the third conductive film 512; thus, spectra of light with different wavelengths can be narrowed and extracted even when they include the same EL layer 510. Specifically, by adjusting the thickness of each of the second conductive films 507 provided under the EL layer 510 in the light-emitting elements (504R, 504G, 504B, and 504W), a desired emission spectrum can be obtained from the EL layer 510, so that light emission with high color purity can be obtained. Therefore, the structure illustrated in FIG. 25A does not require a process of separately forming EL layers with different colors, and facilitates achieving high resolution.

The light-emitting device illustrated in FIG. 25A includes the coloring layer (color filter). Therefore, by using the microcavity structure and the color filter in combination, light emission with higher color purity can be obtained. Specifically, the optical path length of the light-emitting element 504R is adjusted so that red light emission is provided; red light is emitted in the direction indicated by an arrow through the coloring layer 514R. Furthermore, the optical path length of the light-emitting element 504G is adjusted so that green light emission is provided; green light is emitted in the direction indicated by an arrow through the coloring layer 514G. Furthermore, the optical path length of the light-emitting element 504B is adjusted so that blue light emission is provided; blue light is emitted in the direction indicated by an arrow through the coloring layer 514B. Furthermore, the optical path length of the light-emitting element 504W is adjusted so that white light emission is provided; white light is emitted in the direction indicated by an arrow through the coloring layer 514W.

Note that a method for adjusting the optical path length of each light-emitting element is not limited thereto. For example, the optical path length may be adjusted by controlling the film thickness of the EL layer 510 in each light-emitting element.

The coloring layers (514R, 514G, and 514B) may have a function of transmitting light in a particular wavelength region. For example, a red (R) color filter for transmitting light in a red wavelength range, a green (G) color filter for transmitting light in a green wavelength range, a blue (B) color filter for transmitting light in a blue wavelength range, or the like can be used. The coloring layer 514W may be formed using an acrylic-based resin material which does not contain a pigment or the like. The coloring layers (514R, 514G, 514B, and 514W) can be formed using any of various materials by a printing method, an inkjet method, an etching method using a photolithography technique, or the like.

The first conductive film 506 can be formed using, for example, a metal film having high reflectivity (reflection factor of visible light is 40% to 100%, preferably 70% to 100%). The first conductive film 506 can be formed with a single layer or a stack using one or more of aluminum, silver, and an alloy containing such a metal material (e.g., an alloy of silver, palladium, and copper).

The second conductive film 507 can be formed using, for example, a conductive metal oxide. As the conductive metal oxide, indium oxide, tin oxide, zinc oxide, indium tin oxide (also referred to as ITO), indium zinc oxide, or any of these metal oxide materials in which silicon oxide or tungsten oxide is contained can be used. Providing the second conductive film 507 is preferable because the formation of an insulating film between the EL layer 510 to be formed later and the first conductive film 506 can be suppressed. Furthermore, a conductive metal oxide which is used as the second conductive film 507 may be formed in a layer lower than the first conductive film 506.

The third conductive film 512 is formed using a conductive material having reflectivity and a conductive material having a light-transmitting property, and visible light reflectivity of the film is preferably 20% to 80%, more preferably 40% to 70%. As the third conductive film 512, for example, silver, magnesium, an alloy of such a metal material, or the like is formed to be thin (e.g., 10 nm or less), and then, a conductive metal oxide which can be used for the second conductive film 507 is formed.

The above-described light-emitting device has a structure in which light is extracted from the second substrate 516 side (a top emission structure), but may have a structure in which light is extracted from the first substrate 501 side where the FETs 500 are formed (a bottom emission structure) or a structure in which light is extracted from both the first substrate 501 side and the second substrate 516 side (a dual emission structure). In the case of the bottom emission structure, the coloring layers (514R, 514G, 514B, and 514W) may be formed under the first conductive film 506. Note that a light-transmitting substrate may be used for the substrate through which light is transmitted, and a light-transmitting substrate or a light-blocking substrate may be used for the substrate through which light is not transmitted.

In FIG. 25A, the structure in which the light-emitting elements emit light of red (R), green (G), blue (B), and white (W) is illustrated as an example. However, a structure is not limited thereto. For example, a structure in which the light-emitting elements emit light of red (R), green (G), and blue (B) may be used.

Figure 25B:
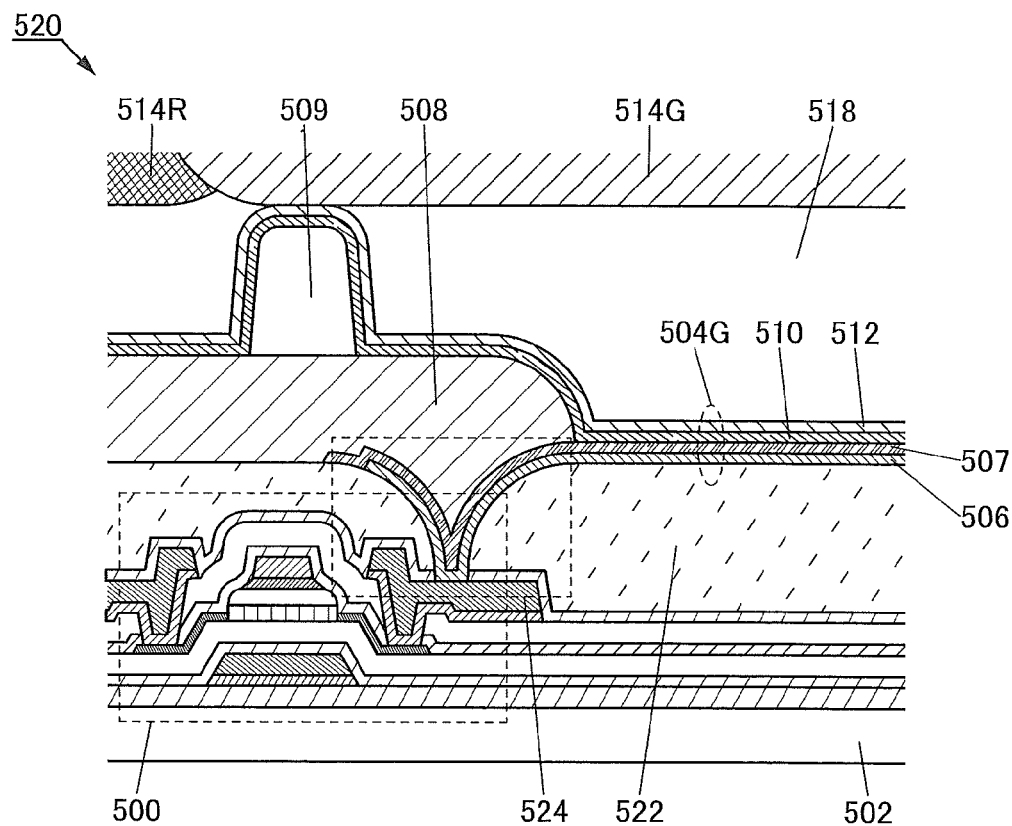

Here, a connection between the light-emitting element and the FET is described in detail using FIG. 25B. Note that FIG. 25B is an example of a structure of a region 520 surrounded by a dashed line shown in FIG. 25A.

In FIG. 25B, an insulating film 522 functioning as a planarization film is formed over the FET 500. Furthermore, an opening portion 524 reaching a conductive film functioning as a source electrode or a drain electrode of the FET 500 is formed in the insulating film 522. Furthermore, the first conductive film 506 connected to the conductive film functioning as a source electrode or a drain electrode of the FET 500 is formed over the insulating film 522. Furthermore, the second conductive film 507 is formed over the first conductive film 506.

The structure of the FET 500 is similar to the structure of the transistor 150 described in the above embodiment; therefore, description thereof is omitted.

The structure described in this embodiment can be used in appropriate combination with any of the structures described in the other embodiments.

Embodiment 5

In this embodiment, an example of a display device that includes any of the transistors and the capacitor described in the embodiment above will be described below with reference to FIG. 26, FIG. 27, and FIG. 28.

Figure 26:
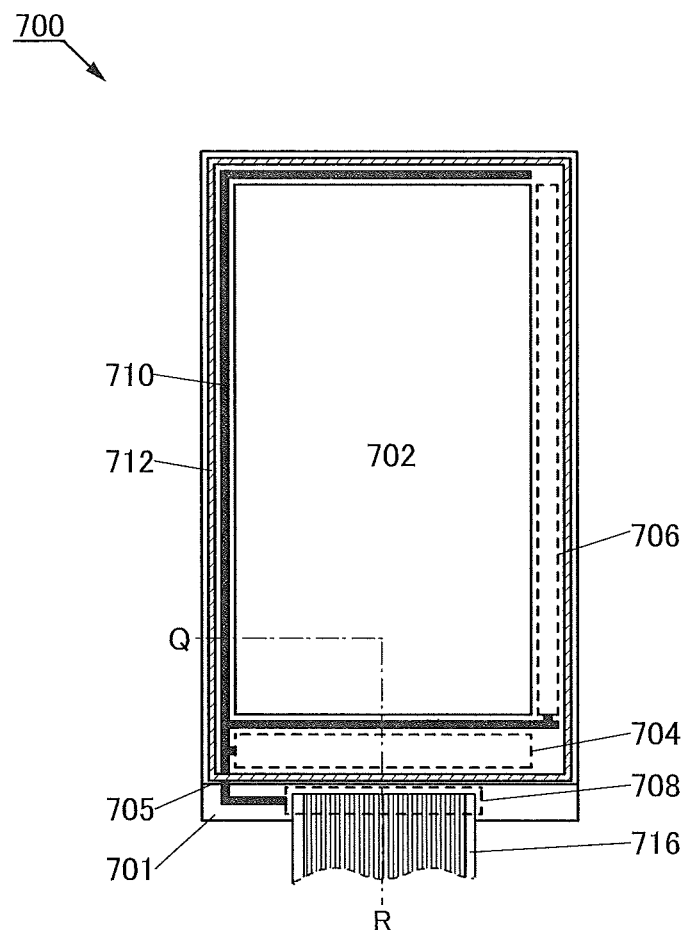
FIG. 26 is a top view illustrating one embodiment of a display device.

FIG. 26 is a top view of an example of a display device. A display device 700 illustrated in FIG. 26 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 26, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver-circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used. In the pixel portion 702, any of the transistors that are the semiconductor devices of embodiments of the present invention and the capacitor of one embodiment of the present invention can be used The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included. Note that examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color elements. Embodiments of the disclosed invention are not limited to a display device for color display; the disclosed invention can also be applied to a display device for monochrome display.

In this embodiment, structures including a liquid crystal element and an EL element as display elements are described with reference to FIG. 27 and FIG. 28. Note that FIG. 27 is a cross-sectional view along the dashed-dotted line Q-R shown in FIG. 26 and shows a structure including a liquid crystal element as a display element, whereas FIG. 28 is a cross-sectional view along the dashed-dotted line Q-R shown in FIG. 26 and shows a structure including an EL element as a display element.

Figure 27:
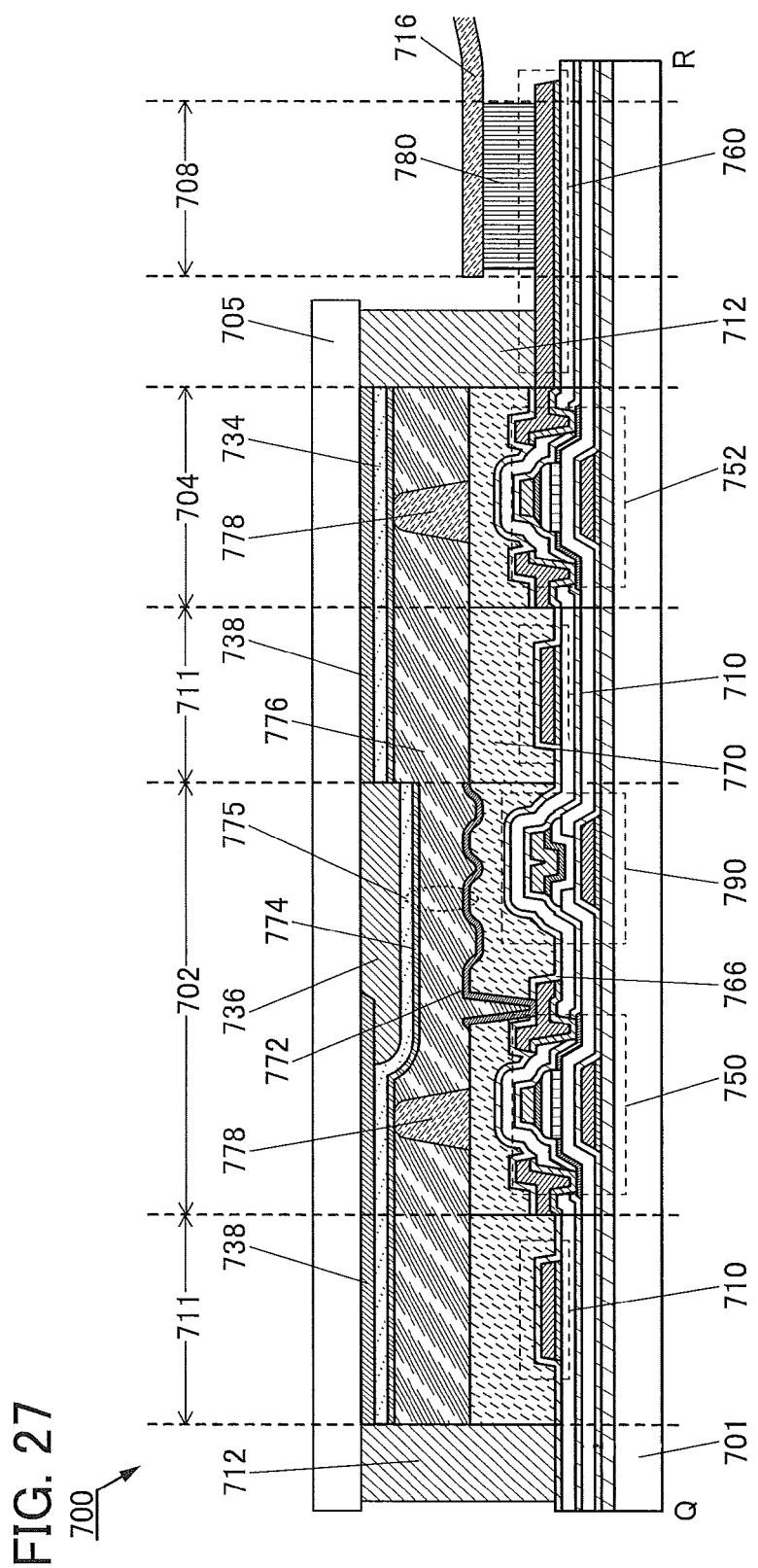
FIG. 27 is a cross-sectional view illustrating one embodiment of a display device.
Figure 28:
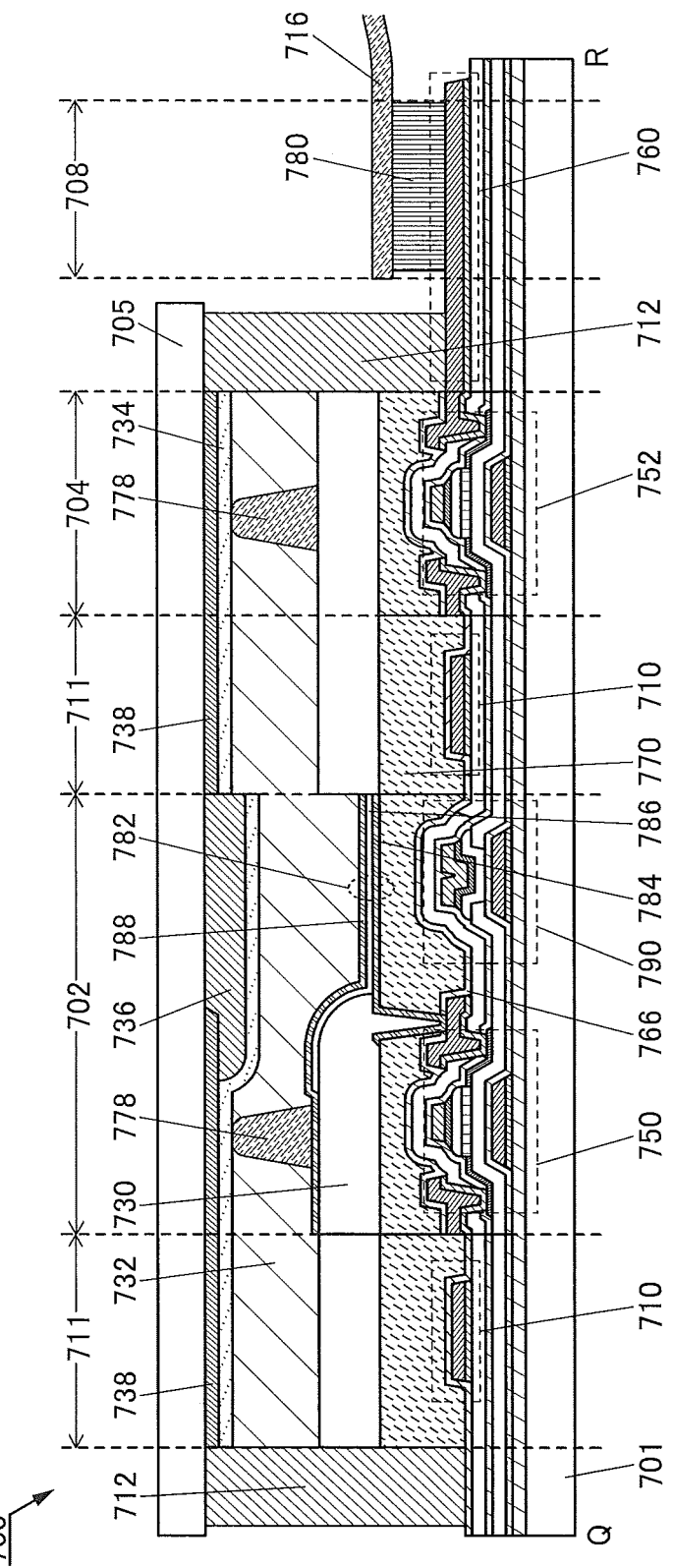
FIG. 28 is a cross-sectional view illustrating one embodiment of a display device.

Common portions between FIG. 27 and FIG. 28 are described first, and then different portions are described.

<Common Portions in Display Devices>

The display device 700 illustrated in FIG. 27 or FIG. 28 includes a lead wiring portion 711, the pixel portion 702, the source driver circuit portion 704, and the FPC terminal portion 708. Note that the lead wiring portion 711 includes a signal line 710. The pixel portion 702 includes a transistor 750 and a capacitor 790. The source driver circuit portion 704 includes a transistor 752.

The transistor 750 and the transistor 752 each have a structure similar to that of the transistor 150 described above. Note that the transistor 750 and the transistor 752 may each have a structure of any of the other transistors described in the above embodiments.

The transistors used in this embodiment each include an oxide semiconductor film which is highly purified and in which formation of oxygen vacancies is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistors used in this embodiment can each have relatively high field-effect mobility and thus are capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 has a structure similar to that of the capacitor 160 described above.

In FIG. 27 and FIG. 28, an insulating film 766 and a planarization insulating film 770 are provided over the transistor 750, the transistor 752, and the capacitor 790.

The insulating film 766 can be formed using materials and methods similar to those of the insulating film 128 described in the above embodiment. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same process as conductive films functioning as a source electrode and a drain electrode of the transistor 750 or 752. Note that the signal line 710 may be formed using a conductive film which is formed in a different process as a source electrode and a drain electrode of the transistor 750 or 752, e.g., a conductive film functioning as a first gate electrode or a conductive film functioning as a second gate electrode may be used. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same process as conductive films functioning as a source electrode and a drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure 778 is provided between the first substrate 701 and the second substrate 705. The structure 778 is a columnar spacer obtained by selective etching of an insulating film and is provided to control the thickness (cell gap) between the first substrate 701 and the second substrate 705. Alternatively, a spherical spacer may be used as the structure 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display device 700 illustrated in FIG. 27 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 27 is capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive film functioning as a source electrode and a drain electrode included in the transistor 750. The conductive film 772 is formed over the planarization insulating film 770 to function as a pixel electrode, i.e., one electrode of the display element. The conductive film 772 has a function as a reflective electrode. The display device 700 in FIG. 27 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used for the conductive film 772.

Note that projections and depressions are provided in part of the planarization insulating film 770 of the pixel portion 702 in the display device 700 in FIG. 27. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 illustrated in FIG. 27 is a reflective color liquid crystal display device given as an example, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIG. 27, an alignment film may be provided on a side of the conductive film 772 in contact with the liquid crystal layer 776 and on a side of the conductive film 774 in contact with the liquid crystal layer 776. Although not illustrated in FIG. 27, an optical member (optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time, and has optical isotropy, which makes the alignment process unneeded and viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display device 700 illustrated in FIG. 28 includes a light-emitting element 782. The light-emitting element 782 includes a conductive film 784, an EL layer 786, and a conductive film 788. The display device 700 shown in FIG. 28 is capable of displaying an image by light emission from the EL layer 786 included in the light-emitting element 782.

The conductive film 784 is connected to the conductive films functioning as a source electrode and a drain electrode included in the transistor 750. The conductive film 784 is formed over the planarization insulating film 770 to function as a pixel electrode, i.e., one electrode of the display element. A conductive film which transmits visible light or a conductive film which reflects visible light can be used for the conductive film 784. The conductive film which transmits visible light can be formed using a material including one kind selected from indium (In), zinc (Zn), and tin (Sn), for example. The conductive film which reflects visible light can be formed using a material including aluminum or silver, for example.

In the display device 700 shown in FIG. 28, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 shown in FIG. 28, the structure is not limited thereto. In the case where the EL layer 786 is formed by a separate coloring method, the coloring film 736 is not necessarily provided.

The structures described in this embodiment can be used in appropriate combination with any of the structures described in the other embodiments.

Embodiment 6

In this embodiment, a structure example of a display device of one embodiment of the present invention will be described.

Structure Example

Figure 36A:
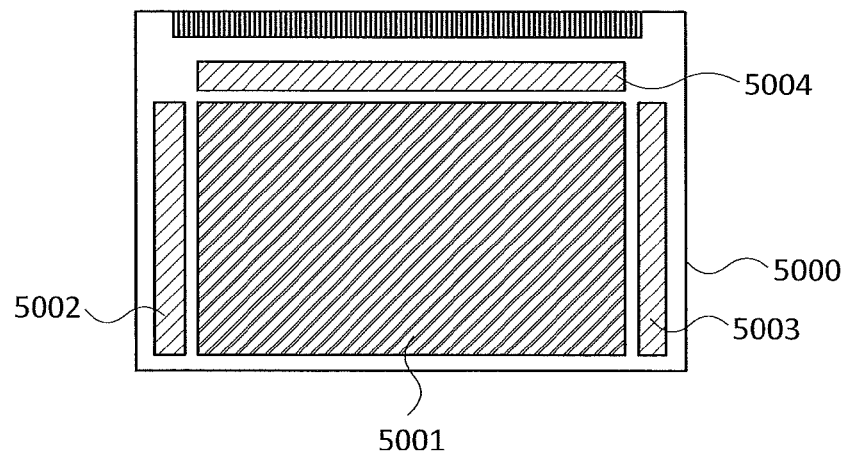
FIGS. 36A to 36C are a top view and circuit diagrams of a display device including a semiconductor device of one embodiment of the present invention.
Figure 36B:
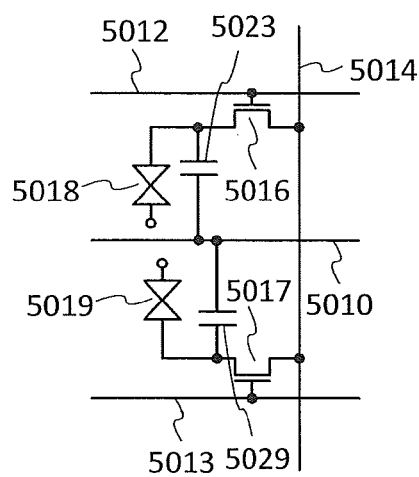
Figure 36C:
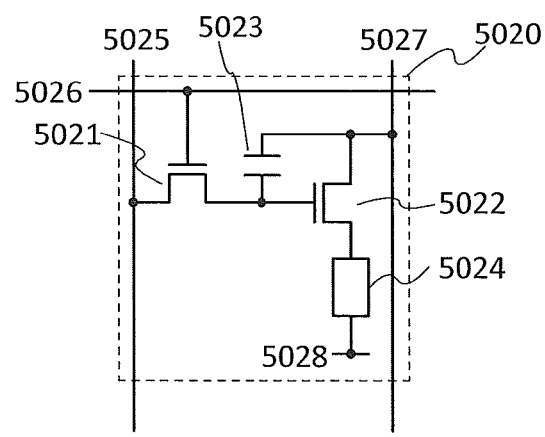

FIG. 36A is a top view of a display device including a semiconductor device of one embodiment of the present invention. FIG. 36B illustrates a pixel circuit where a liquid crystal element is used for a pixel of a display device including a semiconductor device of one embodiment of the present invention. FIG. 36C illustrates a pixel circuit where an organic EL element is used for a pixel of a display device including a semiconductor device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. Alternatively, a transistor used for the pixel and a transistor used for the driver circuit may be formed through different steps. For example, any of the above-described transistors may be used for the driver circuit and a single-gate transistor in which the gate electrode 104a is omitted from any of the above-described transistors may be used for the pixel. The above-described capacitor can be used as a capacitor used for the pixel. Thus, by using any of the above-described transistors and the above-described capacitor for the pixel and the driver circuit, the display device can have high display quality and/or high reliability.

FIG. 36A illustrates an example of a top view of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Further, in the case where a driver circuit is separately formed, the number of wiring connections is increased. By providing the driver circuit over the substrate 5000, the number of wiring connections can be reduced. Accordingly, the reliability and/or yield can be improved.

[Liquid Crystal Display Device]

FIG. 36B illustrates an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. Any of the above-described transistors can be used as appropriate as each of the transistors 5016 and 5017. The above-described capacitor can be used as appropriate as each of capacitors 5023 and 5029. Thus, the liquid crystal display device can have high display quality and/or high reliability.

The shapes of a first pixel electrode electrically connected to the transistor 5016 and a second pixel electrode electrically connected to the transistor 5017 are described. The first pixel electrode and the second pixel electrode are separated by a slit. The first pixel electrode has a V shape and the second pixel electrode is provided so as to surround the first pixel electrode.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Furthermore, a capacitor may be formed using a capacitor wiring 5010, a gate insulator functioning as a dielectric, and a capacitor electrode electrically connected to the first pixel electrode or the second pixel electrode.

The multi-domain pixel includes a first liquid crystal element 5018 and a second liquid crystal element 5019. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that shown in FIG. 36B. For example, a switch, a resistor, a capacitor, a transistor, a sensor, a logic circuit, or the like may be added to the pixel illustrated in FIG. 36B.

[Light-Emitting Device]

FIG. 36C illustrates another example of a circuit configuration of the pixel. Here, a pixel structure of a display device using a light-emitting element typified by an organic EL element (such a device is referred to as a light-emitting device) is described.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 36C illustrates an example of a pixel circuit. Here, an example in which two n-channel transistors and one capacitor are used in one pixel is illustrated. Note that any of the above-described transistors can be used as the n-channel transistors. The above-described capacitor can be used as the capacitor. Furthermore, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used. The above-described capacitor can be used as the capacitor 5023. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage Vth of the driver transistor 5022 is applied to the signal line 5025.

In the case of performing analog grayscale driving, a voltage higher than or equal to voltage which is the sum of the forward voltage of the light-emitting element 5024 and the threshold voltage Vth of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set to be higher than the gate potential of the driver transistor 5022. When an analog video signal is used, it is possible to supply current to the light-emitting element 5024 in accordance with the video signal and perform analog grayscale driving.

Note that in the display device including a semiconductor device of one embodiment of the present invention, a pixel configuration is not limited to that shown in FIG. 36C. For example, a switch, a resistor, a capacitor, a sensor, a transistor, a logic circuit, or the like may be added to the pixel circuit shown in FIG. 36C.

Figure 37A:
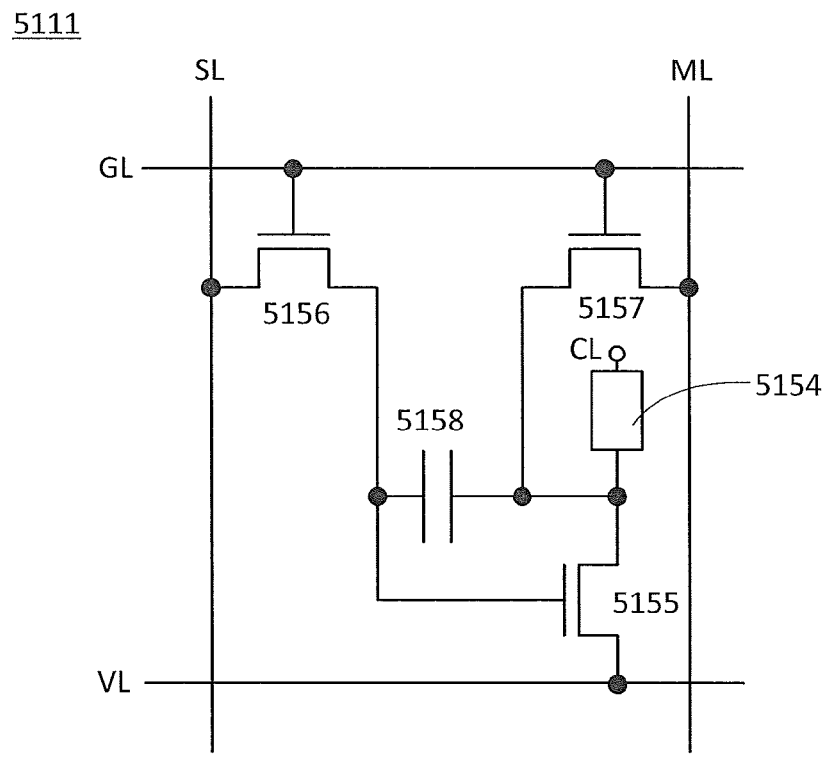
FIGS. 37A and 37B are a circuit diagram and a timing chart of a display device including a semiconductor device of one embodiment of the present invention.

For example, FIG. 37A illustrates an applicable example of a pixel circuit. Here, an example in which three n-channel transistors and one capacitor are used in one pixel is illustrated.

FIG. 37A illustrates an example of a circuit diagram of a pixel 5111. The pixel 5111 includes a transistor 5155, a transistor 5156, a transistor 5157, a capacitor 5158, and a light-emitting element 5154.

A potential of a pixel electrode in the light-emitting element 5154 is controlled in accordance with an image signal Sig input to the pixel 5111. The luminance of the light-emitting element 5154 depends on a potential difference between the pixel electrode and the common electrode.

The transistor 5156 has a function of controlling electrical connection between a wiring SL and a gate of the transistor 5155. One of a source and a drain of the transistor 5155 is electrically connected to an anode of the light-emitting element 5154, and the other of the source and the drain is electrically connected to a wiring VL. The transistor 5157 has a function of controlling electrical connection between a wiring ML and the one of the source and the drain of the transistor 5155. One of a pair of electrodes of the capacitor 5158 is electrically connected to the gate of the transistor 5155, and the other is electrically connected to the anode of the light-emitting element 5154.

The switching of the transistor 5156 is performed in accordance with the potential of a wiring GL which is electrically connected to a gate of the transistor 5156. The switching of the transistor 5157 is performed in accordance with the potential of the wiring GL which is electrically connected to a gate of the transistor 5157.

Note that any of the above-described transistors can be used as at least one of the transistors 5155, 5156, and 5157. Furthermore, the above-described capacitor can be used as the capacitor 5158.

Next, an operation example of the pixel 5111 illustrated in FIG. 37A is described.

Figure 37B:
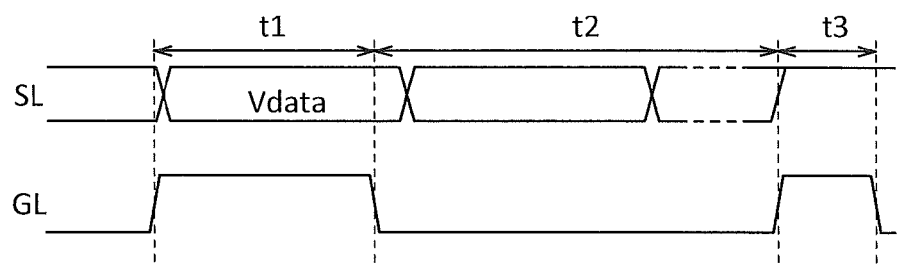

FIG. 37B shows an example of a timing chart of the potential of the wiring GL electrically connected to the pixel 5111 in FIG. 37A and the potential of the image signal Sig supplied to the wiring SL. Note that in the timing chart in FIG. 37B, all the transistors included in the pixel 5111 in FIG. 37A are n-channel transistors.

First, in a period t1, a high-level potential is applied to the wiring GL. Accordingly, the transistor 5156 and the transistor 5157 are turned on. A potential Vdata of the image signal Sig is applied to the wiring SL, and the potential Vdata is applied to the gate of the transistor 5155 through the transistor 5156.

A potential Vano is applied to the wiring VL, and a potential Vcat is applied to the wiring CL. The potential Vano is preferably higher than the sum of the potential Vcat, the threshold voltage Vthe of the light-emitting element 5154, and the threshold voltage Vth of the transistor 5155. The above potential difference is provided between the wiring VL and the wiring CL, so that the value of the drain current of the transistor 5155 is determined by the potential Vdata. Then, the drain current is supplied to the light-emitting element 5154, whereby the luminance of the light-emitting element 5154 is determined.

In the case where the transistor 5155 is an n-channel type, it is preferable that, in the period t1, a potential of the wiring ML be lower than the sum of a potential of the wiring CL and the threshold voltage Vthe of the light-emitting element 5154, and a potential of the wiring VL be higher than the sum of the potential of the wiring ML and the threshold voltage Vth of the transistor 5155. With the above configuration, the drain current of the transistor 5155 can be made to flow preferentially through the wiring ML instead of the light-emitting element 5154 even when the transistor 5157 is on.

Next, in a period t2, a low-level potential is applied to the wiring GL. Accordingly, the transistor 5156 and the transistor 5157 are turned off. When the transistor 5156 is off, the potential Vdata is held at the gate of the transistor 5155. The potential Vano is applied to the wiring VL, and the potential Vcat is applied to the wiring CL. Thus, the light-emitting element 5154 emits light in accordance with the luminance determined in the period t1.

Next, in a period t3, a high-level potential is applied to the wiring GL. Accordingly, the transistor 5156 and the transistor 5157 are turned on. In addition, such a potential that the gate voltage of the transistor 5155 is higher than the threshold voltage Vth thereof is applied to the wiring SL. The potential Vcat is applied to the wiring CL. Then, the potential of the wiring ML is lower than the sum of the potential of the wiring CL and the threshold voltage Vthe of the light-emitting element 5154, and the potential of the wiring VL is higher than the sum of the potential of the wiring ML and the threshold voltage Vth of the transistor 5155. With the above configuration, the drain current of the transistor 5155 can be made to flow preferentially through the wiring ML instead of the light-emitting element 5154.

Then, the drain current of the transistor 5155 is supplied to a monitor circuit through the wiring ML. The monitor circuit generates a signal including information about the value of the drain current by using the drain current flowing through the wiring ML. Thus, using the above signal, the light-emitting device including a semiconductor device of one embodiment of the present invention can correct the value of the potential Vdata of the image signal Sig supplied to the pixel 5111.

Note that in the light-emitting device including the pixel 5111 illustrated in FIG. 37A, the operation in the period t3 is not necessarily performed after the operation in the period t2. For example, in the pixel 5111, the operation in the period t3 may be performed after the operations in the periods t1 and t2 are repeated a plurality of times. Alternatively, after the operation in the period t3 is performed on pixels 5111 in one row, the light-emitting elements 5154 may be brought into a non-light-emitting state by writing an image signal corresponding to the lowest grayscale level 0 to the pixels 5111 in the row which have been subjected to the above operation. Then, the operation in the period t3 may be performed on pixels 5111 in the next row.

FIG. 38 illustrates an example of a pixel circuit. Here, an example in which four n-channel transistors and one capacitor are used in one pixel is illustrated.

Figure 38A:
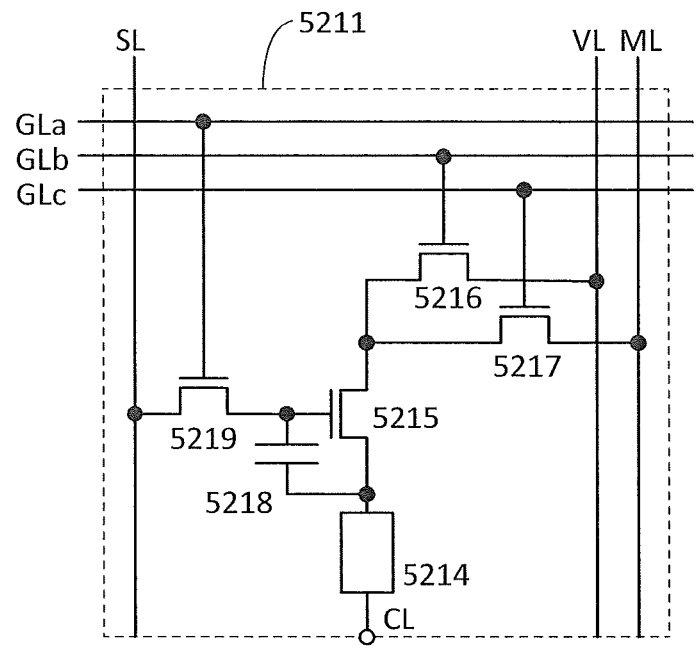
FIGS. 38A and 38B are a circuit diagram and a timing chart of a display device including a semiconductor device of one embodiment of the present invention.

FIG. 38A illustrates an example of a circuit diagram of a pixel 5211. The pixel 5211 includes a transistor 5215, a transistor 5216, a transistor 5217, a capacitor 5218, a light-emitting element 5214, and a transistor 5219.

A potential of a pixel electrode in the light-emitting element 5214 is controlled in accordance with the image signal Sig input to the pixel 5211. The luminance of the light-emitting element 5214 depends on a potential difference between the pixel electrode and the common electrode.

The transistor 5219 has a function of controlling electrical connection between the wiring SL and a gate of the transistor 5215. One of a source and a drain of the transistor 5215 is electrically connected to an anode of the light-emitting element 5214. The transistor 5216 has a function of controlling electrical connection between the wiring VL and the other of the source and the drain of the transistor 5215. The transistor 5217 has a function of controlling electrical connection between the wiring ML and the other of the source and the drain of the transistor 5215. One of a pair of electrodes of the capacitor 5218 is electrically connected to the gate of the transistor 5215, and the other is electrically connected to the anode of the light-emitting element 5214.

The switching of the transistor 5219 is performed in accordance with a potential of a wiring GLa which is electrically connected to a gate of the transistor 5219. The switching of the transistor 5216 is performed in accordance with a potential of a wiring GLb which is electrically connected to a gate of the transistor 5216. The switching of the transistor 5217 is performed in accordance with a potential of a wiring GLc which is electrically connected to a gate of the transistor 5217.

Note that any of the above-described transistors can be used as at least one of the transistor 5215, the transistor 5216, the transistor 5217, and the transistor 5219. Furthermore, the above-described capacitor can be used as the capacitor 5218.

Next, an example of operation of the pixel 5211 illustrated in FIG. 38A for external correction is described.

Figure 38B:
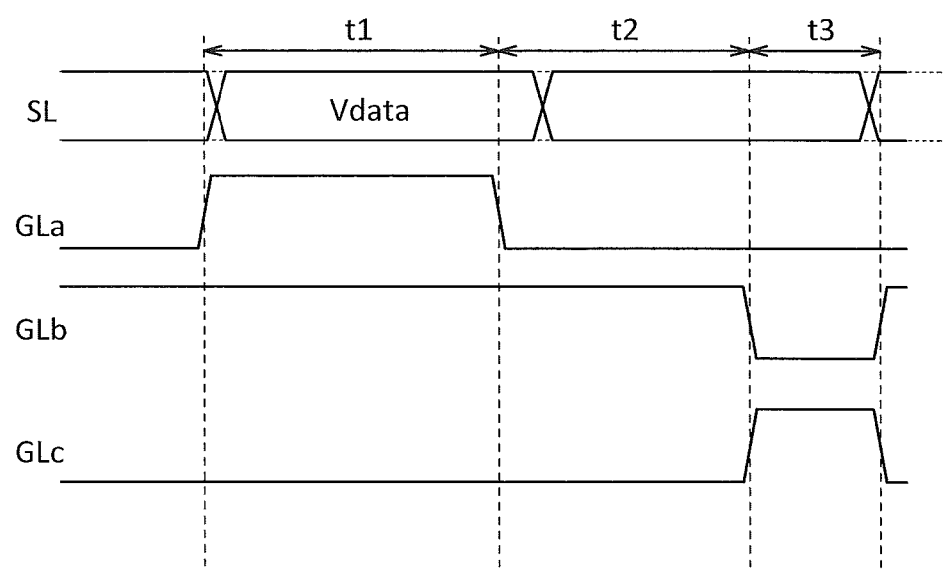

FIG. 38B shows an example of a timing chart of the potentials of the wiring GLa, the wiring GLb, and the wiring GLc, which are electrically connected to the pixel 5211 illustrated in FIG. 38A, and a potential of the image signal Sig supplied to the wiring SL. Note that the timing chart of FIG. 38B is an example in which all the transistors included in the pixel 5211 shown in FIG. 38A are n-channel transistors.

First, in a period t1, a high-level potential is applied to the wiring GLa, a high-level potential is applied to the wiring GLb, and a low-level potential is applied to the wiring GLc. Accordingly, the transistors 5219 and 5216 are turned on and the transistor 5217 is turned off. The potential Vdata of the image signal Sig is applied to the wiring SL, and the potential Vdata is applied to the gate of the transistor 5215 through the transistor 5219.

The potential Vano is applied to the wiring VL, and the potential Vcat is applied to the wiring CL. The potential Vano is preferably higher than the sum of the potential Vcat and the threshold voltage Vthe of the light-emitting element 5214. The potential Vano of the wiring VL is applied to the other of the source and the drain of the transistor 5215 through the transistor 5216. Thus, the value of the drain current of the transistor 5215 is determined in accordance with the potential Vdata. Then, the drain current is supplied to the light-emitting element 5214, whereby the luminance of the light-emitting element 5214 is determined.

Next, in a period t2, a low-level potential is applied to the wiring GLa, a high-level potential is applied to the wiring GLb, and a low-level potential is applied to the wiring GLc. Accordingly, the transistor 5216 is turned on and the transistors 5219 and 5217 are turned off. Since the transistor 5219 is turned off, the potential Vdata is held at the gate of the transistor 5215. The potential Vano is applied to the wiring VL, and the potential Vcat is applied to the wiring CL. Thus, the light-emitting element 5214 maintains the luminance determined in the period t1.

Next, in a period t3, a low-level potential is applied to the wiring GLa, a low-level potential is applied to the wiring GLb, and a high-level potential is applied to the wiring GLc. Accordingly, the transistor 5217 is turned on and the transistors 5219 and 5216 are turned off. The potential Vcat is applied to the wiring CL. The potential Vano is applied to the wiring ML, which is connected to the monitor circuit.

By the above operation, the drain current of the transistor 5215 is supplied to the light-emitting element 5214 through the transistor 5217. In addition, the drain current is also supplied to the monitor circuit through the wiring ML. The monitor circuit generates a signal including information about the value of the drain current by using the drain current flowing through the wiring ML. Thus, using the above signal, the light-emitting device including a semiconductor device of one embodiment of the present invention can correct the value of the potential Vdata of the image signal Sig supplied to the pixel 5211.

Note that in the light-emitting device including the pixel 5211 illustrated in FIG. 38A, the operation in the period t3 is not necessarily performed after the operation in the period t2. For example, in the light-emitting device, the operation in the period t3 may be performed after the operations in the periods t1 and t2 are repeated a plurality of times. Alternatively, after the operation in the period t3 is performed on pixels 5211 in one row, the light-emitting elements 5214 may be brought into a non-light-emitting state by writing an image signal corresponding to the lowest grayscale level 0 to the pixels 5211 in the row which have been subjected to the above operation. Then, the operation in the period t3 may be performed on pixels 5211 in the next row.

Figure 39A:
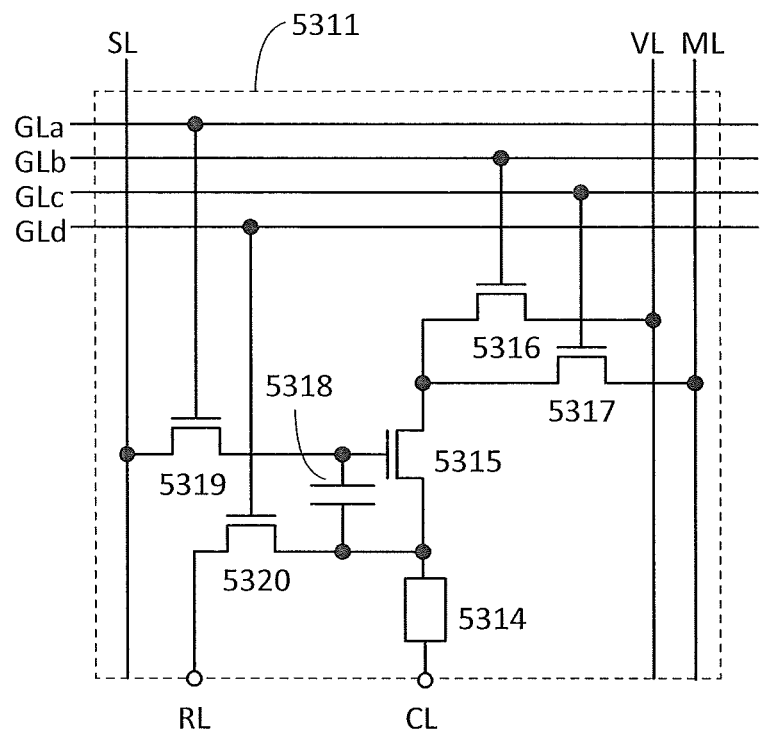
FIGS. 39A and 39B are a circuit diagram and a timing chart of a display device including a semiconductor device of one embodiment of the present invention.

FIG. 39A illustrates an example of a pixel circuit. Here, an example in which five n-channel transistors and one capacitor are used in one pixel is illustrated.

FIG. 39A illustrates an example of a circuit diagram of a pixel 5311. The pixel 5311 illustrated in FIG. 39A includes a transistor 5315, a transistor 5316, a transistor 5317, a capacitor 5318, a light-emitting element 5314, a transistor 5319, and a transistor 5320.

The transistor 5320 has a function of controlling electrical connection between a wiring RL and an anode of the light-emitting element 5314. The transistor 5319 has a function of controlling electrical connection between the wiring SL and a gate of the transistor 5315. One of a source and a drain of the transistor 5315 is electrically connected to the anode of the light-emitting element 5314. The transistor 5316 has a function of controlling electrical connection between the wiring VL and the other of the source and the drain of the transistor 5315. The transistor 5317 has a function of controlling electrical connection between the wiring ML and the other of the source and the drain of the transistor 5315. One of a pair of electrodes of the capacitor 5318 is electrically connected to the gate of the transistor 5315, and the other is electrically connected to the anode of the light-emitting element 5314.

The switching of the transistor 5319 is performed in accordance with the potential of the wiring GLa which is electrically connected to a gate of the transistor 5319. The switching of the transistor 5316 is performed in accordance with the potential of the wiring GLb which is electrically connected to a gate of the transistor 5316. The switching of the transistor 5317 is performed in accordance with the potential of the wiring GLc which is electrically connected to a gate of the transistor 5317. The switching of the transistor 5320 is performed in accordance with a potential of a wiring GLd which is electrically connected to a gate of the transistor 5320.

Note that any of the above-described transistors can be used as at least one of the transistor 5315, the transistor 5316, the transistor 5317, the transistor 5319, and the transistor 5320. Furthermore, the above-described capacitor can be used as the capacitor 5318.

Next, an example of operation of the pixel 5311 illustrated in FIG. 39A for external correction is described.

Figure 39B:
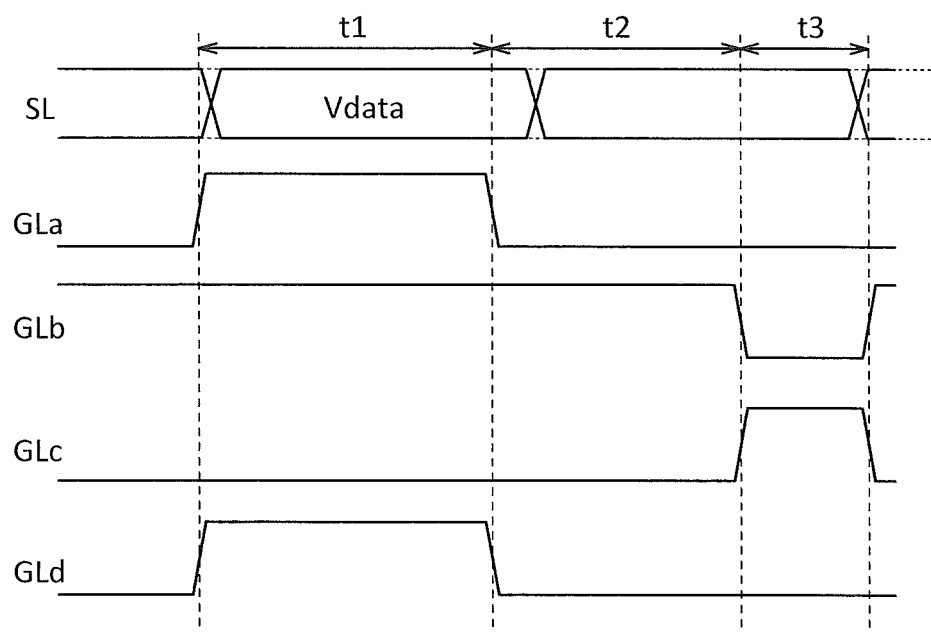

FIG. 39B shows an example of a timing chart of the potentials of the wiring GLa, the wiring GLb, the wiring GLc, and the wiring GLd, which are electrically connected to the pixel 5311 illustrated in FIG. 39A, and the potential of the image signal Sig supplied to the wiring SL. Note that in the timing chart in FIG. 39B, all the transistors included in the pixel 5311 in FIG. 39A are n-channel transistors.

First, in a period t1, a high-level potential is applied to the wiring GLa, a high-level potential is applied to the wiring GLb, a low-level potential is applied to the wiring GLc, and a high-level potential is applied to the wiring GLd. Accordingly, the transistors 5319, 5316, and 5320 are turned on and the transistor 5317 is turned off. The potential Vdata of the image signal Sig is applied to the wiring SL, and the potential Vdata is applied to the gate of the transistor 5315 through the transistor 5319. Thus, the value of the drain current of the transistor 5315 is determined by the potential Vdata. The potential Vano is applied to the wiring VL and a potential V1 is applied to the wiring RL; therefore, the drain current flows between the wiring VL and the wiring RL through the transistor 5316 and the transistor 5320.

The potential Vano is preferably higher than the sum of the potential Vcat and the threshold voltage Vthe of the light-emitting element 5314. The potential Vano of the wiring VL is applied to the other of the source and the drain of the transistor 5315 through the transistor 5316. The potential V1 applied to the wiring RL is applied to the one of the source and the drain of the transistor 5315 through the transistor 5320. The potential Vcat is applied to the wiring CL.

Note that it is preferable that the potential V1 be sufficiently lower than a potential obtained by subtracting the threshold voltage Vth of the transistor 5315 from a potential V0. The light-emitting element 5314 does not emit light in the period t1 because the potential V1 can be set sufficiently lower than the potential obtained by subtracting the threshold voltage Vthe of the light-emitting element 5314 from the potential Vcat.

Next, in a period t2, a low-level potential is applied to the wiring GLa, a high-level potential is applied to the wiring GLb, a low-level potential is applied to the wiring GLc, and a low-level potential is applied to the wiring GLd. Accordingly, the transistor 5316 is turned on and the transistors 5319, 5317, and 5320 are turned off. Since the transistor 5319 is off, the potential Vdata is held at the gate of the transistor 5315.

The potential Vano is applied to the wiring VL, and the potential Vcat is applied to the wiring CL. Accordingly, the drain current of the transistor 5315, the value of which is determined in the period t1, is supplied to the light-emitting element 5314 because the transistor 5320 is turned off. By supply of the drain current to the light-emitting element 5314, the luminance of the light-emitting element 5314 is determined, and the luminance is held in the period t2.

Next, in a period t3, a low-level potential is applied to the wiring GLa, a low-level potential is applied to the wiring GLb, a high-level potential is applied to the wiring GLc, and a low-level potential is applied to the wiring GLd. Accordingly, the transistor 5317 is turned on and the transistors 5319, 5316, and 5320 are turned off. The potential Vcat is applied to the wiring CL. The potential Vano is applied to the wiring ML, which is connected to the monitor circuit.

By the above operation, the drain current of the transistor 5315 is supplied to the light-emitting element 5314 through the transistor 5317. In addition, the drain current is also supplied to the monitor circuit through the wiring ML. The monitor circuit generates a signal including information about the value of the drain current by using the drain current flowing through the wiring ML. Thus, using the above signal, the light-emitting device including a semiconductor device of one embodiment of the present invention can correct the value of the potential Vdata of the image signal Sig supplied to the pixel 5311.

Note that in the light-emitting device including the pixel 5311 illustrated in FIG. 39A, the operation in the period t3 is not necessarily performed after the operation in the period t2. For example, in the light-emitting device, the operation in the period t3 may be performed after the operations in the periods t1 and t2 are repeated a plurality of times. Alternatively, after the operation in the period t3 is performed on pixels 5311 in one row, the light-emitting elements 5314 may be brought into a non-light-emitting state by writing an image signal corresponding to the lowest grayscale level 0 to the pixels 5311 in the row which have been subjected to the above operation. Then, the operation in the period t3 may be performed on pixels 5311 in the next row.

In the pixel 5311 illustrated in FIG. 39A, even when variation in resistance of a portion between the anode and the cathode of the light-emitting element 5314 among pixels is caused by deterioration of the light-emitting element 5314 or the like, the potential of the source of the transistor 5315 can be set to the predetermined potential V1 at the time of applying the potential Vdata to the gate of the transistor 5315. Thus, variation in luminance of the light-emitting element 5314 among pixels can be prevented.

Figure 40A:
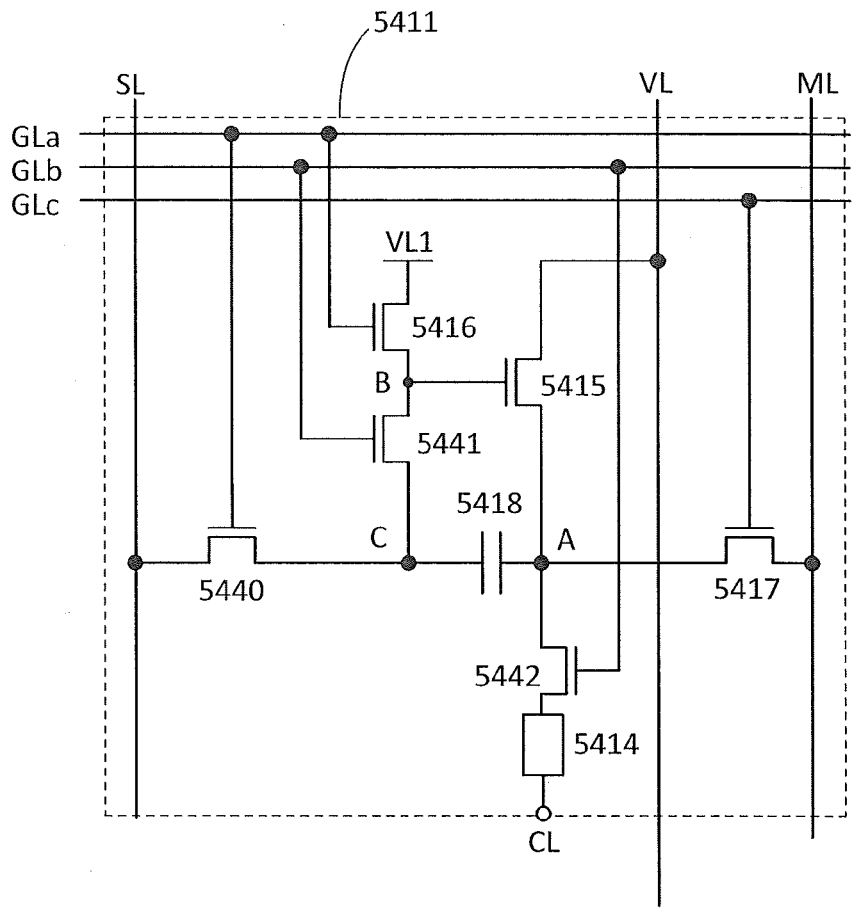
FIGS. 40A and 40B are a circuit diagram and a timing chart of a display device including a semiconductor device of one embodiment of the present invention.

FIG. 40A illustrates an example of a pixel circuit. Here, an example in which six n-channel transistors and one capacitor are used in one pixel is illustrated.

FIG. 40A illustrates an example of a circuit diagram of a pixel 5411. The pixel 5411 includes a transistor 5415, a transistor 5416, a transistor 5417, a capacitor 5418, a light-emitting element 5414, a transistor 5440, a transistor 5441, and a transistor 5442.

A potential of a pixel electrode in the light-emitting element 5414 is controlled in accordance with the image signal Sig input to the pixel 5411. The luminance of the light-emitting element 5414 depends on a potential difference between the pixel electrode and the common electrode.

The transistor 5440 has a function of controlling electrical connection between the wiring SL and one of a pair of electrodes of the capacitor 5418. The other of the pair of electrodes of the capacitor 5418 is electrically connected to one of a source and a drain of the transistor 5415. The transistor 5416 has a function of controlling electrical connection between a wiring VL1 and a gate of the transistor 5415. The transistor 5441 has a function of controlling electrical connection between the one of the pair of electrodes of the capacitor 5418 and the gate of the transistor 5415. The transistor 5442 has a function of controlling electrical connection between the one of the source and the drain of the transistor 5415 and an anode of the light-emitting element 5414. The transistor 5417 has a function of controlling electrical connection between the one of the source and the drain of the transistor 5415 and the wiring ML.

In FIG. 40A, the other of the source and the drain of the transistor 5415 is electrically connected to the wiring VL.

The transistor 5440 is switched in accordance with the potential of the wiring GLa which is electrically connected to a gate of the transistor 5440. The transistor 5416 is switched in accordance with the potential of the wiring GLa which is electrically connected to a gate of the transistor 5416. The transistor 5441 is switched in accordance with the potential of the wiring GLb which is electrically connected to a gate of the transistor 5441. The transistor 5442 is switched in accordance with the potential of the wiring GLb which is electrically connected to a gate of the transistor 5442. The transistor 5417 is switched in accordance with the potential of the wiring GLc which is electrically connected to a gate of the transistor 5417.

Figure 40B:
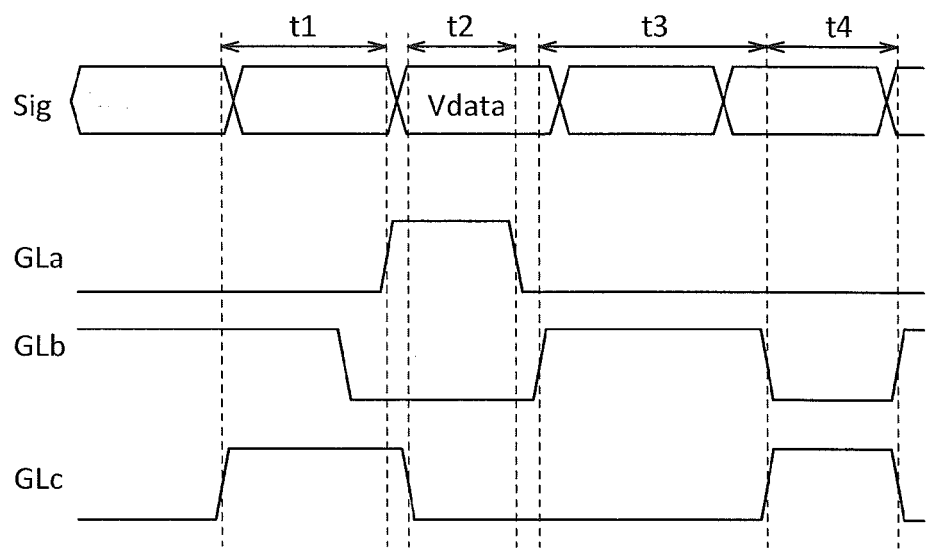

FIG. 40B shows an example of a timing chart of the potentials of the wiring GLa, the wiring GLb, and the wiring GLc, which are electrically connected to the pixel 5411 illustrated in FIG. 40A, and the potential of the image signal Sig supplied to the wiring SL. Note that in the timing chart in FIG. 40B, all the transistors included in the pixel 5411 in FIG. 40A are n-channel transistors.

First, in a period t1, a low-level potential is applied to the wiring GLa, a high-level potential is applied to the wiring GLb, and a high-level potential is applied to the wiring GLc. Accordingly, the transistors 5441, 5442, and 5417 are turned on, and the transistors 5440 and 5416 are turned off. The transistors 5442 and 5417 are turned on, whereby the potential V0, which is the potential of the wiring ML, is applied to the one of the source and the drain of the transistor 5415 and the other of the pair of electrodes of the capacitor 5418 (represented as a node A).

The potential Vano is applied to the wiring VL, and the potential Vcat is applied to the wiring CL. The potential Vano is preferably higher than the sum of the potential V0 and the threshold voltage Vthe of the light-emitting element 5414. Note that the potential V0 is preferably lower than the sum of the potential Vcat and the threshold voltage Vthe of the light-emitting element 5414. With the potential V0 set in the above range, current can be prevented from flowing through the light-emitting element 5414 in the period t1.

A low-level potential is then applied to the wiring GLb, and the transistors 5441 and 5442 are accordingly turned off and the node A is held at the potential V0.

Next, in a period t2, a high-level potential is applied to the wiring GLa, a low-level potential is applied to the wiring GLb, and a low-level potential is applied to the wiring GLc. Accordingly, the transistors 5440 and 5416 are turned on, and the transistors 5441, 5442, and 5417 are turned off.

In the transition from the period t1 to the period t2, it is preferable that the potential applied to the wiring GLa be changed from low to high and then the potential applied to the wiring GLc be changed from high to low. This operation prevents change in the potential of the node A due to the change of the potential applied to the wiring GLa.

The potential Vano is applied to the wiring VL, and the potential Vcat is applied to the wiring CL. The potential Vdata of the image signal Sig is applied to the wiring SL, and the potential V1 is applied to the wiring VL1. Note that the potential V1 is preferably higher than the sum of the potential Vcat and the threshold voltage Vth of the transistor 5415 and lower than the sum of the potential Vano and the threshold voltage Vth of the transistor 5415.

Note that in the pixel structure shown in FIG. 40A, even if the potential V1 is higher than the sum of the potential Vcat and the threshold voltage Vthe of the light-emitting element 5414, the light-emitting element 5414 does not emit light as long as the transistor 5442 is off. Thus, the allowable potential V0 range can be expanded and the allowable range of V1-V0 can also be increased. As a result of increasing the degree of freedom of values for V1-V0, the threshold voltage Vth of the transistor 5415 can be obtained accurately even when time required to obtain the threshold voltage Vth of the transistor 5415 is reduced or limited.

By this operation, the potential V1 which is higher than the sum of the potential of the node A and the threshold voltage Vth is input to the gate of the transistor 5415 (represented as a node B), and the transistor 5415 is turned on. Thus, electric charge in the capacitor 5418 is discharged through the transistor 5415, and the potential of the node A, which is the potential V0, starts to increase. The potential of the node A finally converges to the potential V1-Vth and the gate voltage of the transistor 5415 converges to the threshold voltage Vth of the transistor 5415; then, the transistor 5415 is turned off.

The potential Vdata of the image signal Sig applied to the wiring SL is applied to the one of the pair of electrodes of the capacitor 5418 (represented as a node C) through the transistor 5440.

Next, in a period t3, a low-level potential is applied to the wiring GLa, a high-level potential is applied to the wiring GLb, and a low-level potential is applied to the wiring GLc. Accordingly, the transistors 5441 and 5442 are turned on, and the transistors 5440, 5416, and 5417 are turned off.

In the transition from the period t2 to the period t3, it is preferable that the potential applied to the wiring GLa be changed from high to low and then the potential applied to the wiring GLb be changed from low to high. This structure can prevent potential change of the node A due to change of the potential applied to the wiring GLa.

The potential Vano is applied to the wiring VL, and the potential Vcat is applied to the wiring CL.

The potential Vdata is applied to the node B by the above operation; thus, the gate voltage of the transistor 5415 becomes Vdata−V1+Vth. Thus, the gate voltage of the transistor 5415 can be the value to which the threshold voltage Vth is added. With this structure, variation in the threshold voltage Vth of the transistor 5415 can be reduced. Thus, variation of current values supplied to the light-emitting element 5414 can be suppressed, whereby unevenness in luminance of the light-emitting device can be reduced.

Note that the potential applied to the wiring GLb is greatly varied here, whereby an influence of variation of threshold voltages of the transistor 5442 on the value of a current supplied to the light-emitting element 5414 can be prevented. In other words, the high-level potential applied to the wiring GLb is much higher than the threshold voltage of the transistor 5442, and the low-level potential applied to the wiring GLb is much lower than the threshold voltage of the transistor 5442; thus, on/off switching of the transistor 5442 is secured and the influence of variation of threshold voltages of the transistor 5442 on the value of current supplied to the light-emitting element 5414 can be prevented.

Next, in a period t4, a low-level potential is applied to the wiring GLa, a low-level potential is applied to the wiring GLb, and a high-level potential is applied to the wiring GLc. Accordingly, the transistor 5417 is turned on and the transistors 5416, 5440, 5441, and 5442 are turned off.

In addition, the potential Vano is applied to the wiring VL, and the wiring ML is connected to the monitor circuit.

By the above operation, drain current Id of the transistor 5415 flows not to the light-emitting element 5414 but to the wiring ML through the transistor 5417. The monitor circuit generates a signal including information about the value of the drain current Id by using the drain current Id flowing through the wiring ML. The magnitude of the drain current Id depends on the mobility or the size (channel length, channel width) of the transistor 5415. Using the above signal, the light-emitting device including a semiconductor device of one embodiment of the present invention can thus correct the value of the potential Vdata of the image signal Sig supplied to the pixel 5411. That is, the influence of variation in the mobility of the transistor 5415 can be reduced.

Note that in the light-emitting device including the pixel 5411 illustrated in FIG. 40A, the operation in the period t4 is not necessarily always performed after the operation in the period t3. For example, in the light-emitting device, the operation in the period t4 may be performed after the operations in the periods t1 to t3 are repeated a plurality of times. Alternatively, after the operation in the period t4 is performed on pixels 5411 in one row, the light-emitting elements 5414 may be brought into a non-light-emitting state by writing an image signal corresponding to the lowest grayscale level 0 to the pixels 5411 in the row which have been subjected to the above operation. Then, the operation in the period t4 may be performed on pixels 5411 in the next row.

Note that, in the light-emitting device including the pixel 5411 illustrated in FIG. 40A, the other of the source and the drain of the transistor 5415 is electrically isolated from the gate of the transistor 5415, so that their potentials can be individually controlled. Accordingly, in the period t2, the potential of the other of the source and the drain of the transistor 5415 can be set higher than a potential obtained by adding the threshold voltage Vth to the gate potential of the transistor 5415. Thus, when the transistor 5415 is normally on, that is, when the threshold voltage Vth is negative, charge can be accumulated in the capacitor 5418 until the source potential of the transistor 5415 becomes higher than the gate potential V1 of the transistor 5415. For these reasons, in the light-emitting device including a semiconductor device of one embodiment of the present invention, even when the transistor 5415 is a normally-on transistor, the threshold voltage Vth can be obtained in the period t2; and in the period t3, the gate voltage of the transistor 5415 can be set to a value obtained by adding the threshold voltage Vth.

Therefore, in the light-emitting device including a semiconductor device of one embodiment of the present invention, display unevenness can be reduced and high-quality images can be displayed even if the transistor 5415 becomes a normally-on transistor.

Not only the characteristics of the transistor 5415 but also the characteristics of the light-emitting element 5414 may be monitored. Here, it is preferable that current not flow through the transistor 5415 by controlling the potential Vdata of the image signal Sig, for example. The current of the light-emitting element 5414 can be thus extracted, and degradation or variation in current characteristics of the light-emitting element 5414 can be obtained.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic action may be included. Note that examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate; for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared with the case of using the coloring layer in some cases.

<Module>

A display module using a semiconductor device of one embodiment of the present invention is described below with reference to FIG. 41.

In a display module 8000 in FIG. 41, a touch panel 8004 connected to an FPC 8003, a cell 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the cell 8006, for example.

The shapes and sizes of the upper cover 8001 and the lower cover 8002 can be changed as appropriate in accordance with the sizes of the touch panel 8004 and the cell 8006.

The touch panel 8004 can be a resistive touch panel or a capacitive touch panel and may be formed to overlap with the cell 8006. A counter substrate (sealing substrate) of the cell 8006 can have a touch panel function. A photosensor may be provided in each pixel of the cell 8006 so that an optical touch panel is obtained. An electrode for a touch sensor may be provided in each pixel of the cell 8006 so that a capacitive touch panel is obtained.

The backlight unit 8007 includes a light source 8008. The light source 8008 may be provided at an end portion of the backlight unit 8007 and a light diffusing plate may be used.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet Embodiment 7

In this embodiment, electronic devices that can be formed using a semiconductor device of one embodiment of the present invention will be described with reference to FIGS. 44A to 44H.

FIGS. 44A to 44H illustrate electronic devices. These electronic devices can include a housing 6000, a display portion 6001, a speaker 6003, an LED lamp 6004, operation keys 6005 (including a power switch or an operation switch), a connection terminal 6006, a sensor 6007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 6008, and the like.

Figure 44A:
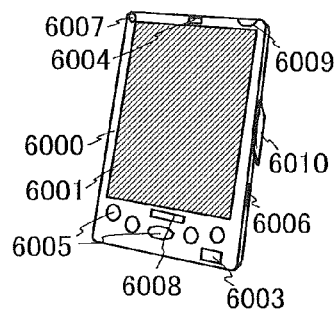
FIGS. 44A to 44H illustrate electronic devices.
Figure 44B:
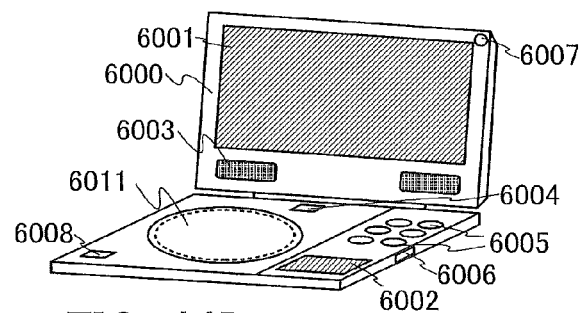
Figure 44C:
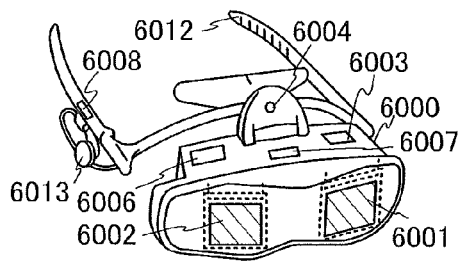
Figure 44D:
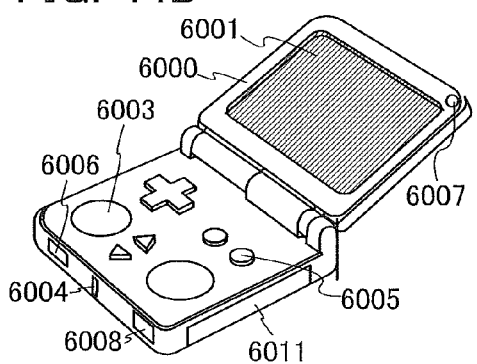
Figure 44E:
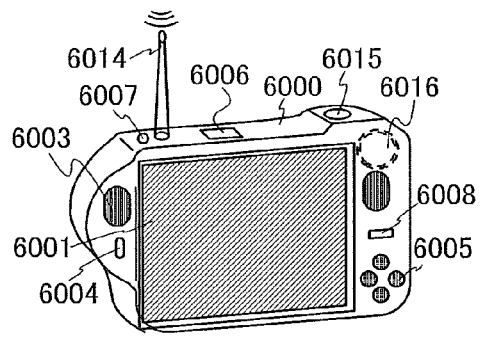
Figure 44F:
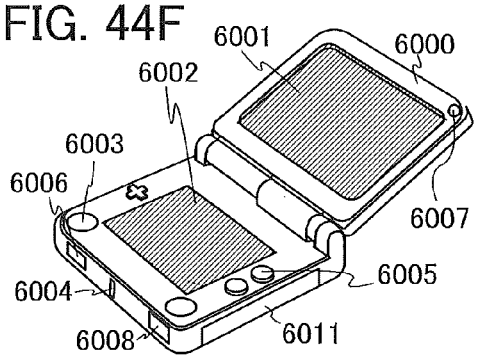
Figure 44G:
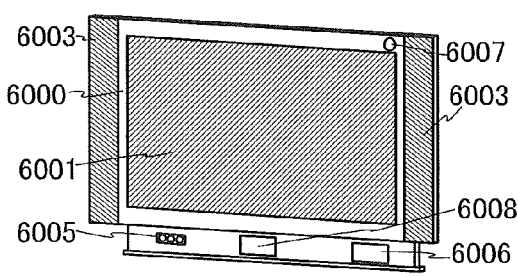
Figure 44H:
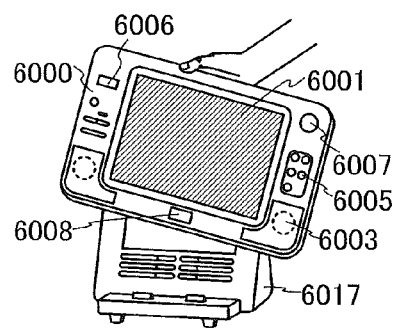

FIG. 44A illustrates a mobile computer that can include a switch 6009, an infrared port 6010, and the like in addition to the above components. FIG. 44B illustrates a portable image reproducing device (e.g., a DVD player) that is provided with a memory medium and can include a display portion 6002, a memory medium reading portion 6011, and the like in addition to the above components. FIG. 44C illustrates a goggle-type display that can include the display portion 6002, a support 6012, an earphone 6013, and the like in addition to the above components. FIG. 44D illustrates a portable game machine that can include the memory medium reading portion 6011 and the like in addition to the above components. FIG. 44E illustrates a digital camera that has a television reception function and can include an antenna 6014, a shutter button 6015, an image receiving portion 6016, and the like in addition to the above components. FIG. 44F illustrates a portable game machine that can include the display portion 6002, the memory medium reading portion 6011, and the like in addition to the above components. FIG. 44G illustrates a television receiver that can include a tuner, an image processing portion, and the like in addition to the above components. FIG. 44H illustrates a portable television receiver that can include a charger 6017 capable of transmitting and receiving signals, and the like in addition to the above components.

The electronic devices illustrated in FIGS. 44A to 44H can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Furthermore, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 44A to 44H are not limited to those described above, and the electronic devices can have a variety of functions.

The electronic devices described in this embodiment each include the display portion for displaying some sort of data. Note that the semiconductor device of one embodiment of the present invention can also be used for an electronic device that does not have a display portion.

The structure described in this embodiment can be used in appropriate combination with any of the structures described in the other embodiments.

This application is based on Japanese Patent Application serial no. 2014-020620 filed with Japan Patent Office on Feb. 5, 2014, and Japanese Patent Application serial no. 2014-043637 filed with Japan Patent Office on Mar. 6, 2014, the entire contents of which are hereby incorporated by reference.

What is claimed is:

1. A semiconductor device comprising:
   a transistor comprising:
      a first conductive film;
      a first insulating film over the first conductive film;
      a second insulating film over the first insulating film;
      an oxide semiconductor film over the second insulating film;
      a pair of electrodes in contact with the oxide semiconductor film;
      a third insulating film over the oxide semiconductor film; and
      a second conductive film overlapping with the oxide semiconductor film with the third insulating film therebetween,
      wherein the first insulating film comprises a film containing hydrogen,
      wherein the second insulating film comprises an oxide insulating film,
      wherein an end portion of the third insulating film is positioned on the outer side than an end portion of the second conductive film, and
      wherein the end portion of the third insulating film is curved, and
   a capacitor comprising:
      a third conductive film;
      the first insulating film over the third conductive film;
      a fourth insulating film over the first insulating film; and
      a fourth conductive film over the fourth insulating film,
   a fifth insulating film over and in contact with a top surface of the second conductive film and a top surface of the fourth conductive film,
      wherein the first conductive film and the third conductive film are provided on the same surface,
      wherein an end portion of the fourth insulating film is positioned on the outer side than an end portion of the fourth conductive film, and
      wherein the end portion of the fourth insulating film is curved.

2. The semiconductor device according to claim 1, wherein the film containing hydrogen comprises a silicon nitride film.

3. The semiconductor device according to claim 1, wherein the oxide insulating film comprises a region which contains oxygen in excess of a stoichiometric composition.

4. The semiconductor device according to claim 1, wherein the oxide semiconductor film comprises:
   a first region overlapping with the first conductive film; and
   a pair of second regions between which the first region is interposed,
   wherein a concentration of an impurity element in the first region is different from concentrations of the impurity element in the second regions.

5. The semiconductor device according to claim 4, wherein each of the concentrations of the impurity element in the second regions is higher than the concentration of the impurity element in the first region.

6. The semiconductor device according to claim 4, wherein the impurity element comprises any one of hydrogen, boron, carbon, nitrogen, fluorine, aluminum, silicon, phosphorus, and chlorine.

7. The semiconductor device according to claim 4, wherein the first region comprises a region thicker than the second regions.

8. A module comprising:
the semiconductor device according to claim 1; and
a printed board.

9. An electronic device comprising:
at least one of the semiconductor device according to claim 1; and
at least one of a speaker, an operation key, and a battery.

10. A method for manufacturing a semiconductor device, comprising the steps of:
forming a first conductive film and a second conductive film using one conductive film;
forming a first insulating film over the first conductive film and the second conductive film;
wherein the first insulating film comprises a film containing hydrogen,
forming a second insulating film over the first insulating film;
forming a third conductive film over the second insulating film;
adding oxygen to the second insulating film through the third conductive film;
removing the third conductive film;
processing a region of the second insulating film overlapping with the second conductive to expose the first insulating film;
forming an oxide semiconductor film over the second insulating film;
forming a third insulating film over the oxide semiconductor film, the first insulating film, and the second insulating film;
forming a fourth conductive film over the third insulating film;
processing the fourth conductive film to form a fifth conductive film and a sixth conductive film;
processing the third insulating film to form a fourth insulating film and a fifth insulating film; and
forming six insulating film over and in contact with a top surface of the fifth conductive film and a top surface of the sixth conductive film,
wherein an end portion of the fourth insulating film is positioned on the outer side than an end portion of the fifth conductive film,
wherein an end portion of the fifth insulating film is positioned on the outer side than an end portion of the sixth conductive film, and
wherein the end portion of the fourth insulating film and the end portion of the fifth insulating film are curved.

11. The method for manufacturing a semiconductor device, according to claim 10, further comprising the step of adding an impurity to the oxide semiconductor film with use of the fifth conductive film as a mask to form a first region overlapping with the fifth conductive film and a pair of second regions between which the first region is interposed.

* * * * *